(12) United States Patent
Sasaki

(10) Patent No.: US 8,103,464 B2
(45) Date of Patent: Jan. 24, 2012

(54) TEST CIRCUIT, PATTERN GENERATING APPARATUS, AND PATTERN GENERATING METHOD

(75) Inventor: Yasuo Sasaki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 900 days.

(21) Appl. No.: 12/076,692

(22) Filed: Mar. 21, 2008

(65) Prior Publication Data

US 2008/0234952 A1   Sep. 25, 2008

(51) Int. Cl.
G01R 31/00 (2006.01)
G01R 31/14 (2006.01)
G01R 31/28 (2006.01)

(52) U.S. Cl. ........... 702/58; 702/117; 702/119; 714/724

(58) Field of Classification Search .................... 702/58, 702/117, 119
See application file for complete search history.

(56) References Cited

U.S. PATENT DOCUMENTS

| 7,533,318 | B2 | 5/2009 | Morishita et al. |
| 2004/0260992 | A1 * | 12/2004 | Nishida et al. ................. 714/742 |

FOREIGN PATENT DOCUMENTS

| JP | 04-274547 | 9/1992 |
| JP | 3343734 | 8/2002 |
| JP | 2006-214839 A | 8/2006 |

* cited by examiner

*Primary Examiner* — Janet Suglo
(74) *Attorney, Agent, or Firm* — Foley & Lardner LLP

(57) ABSTRACT

A test circuit connected between a test target circuit and a plurality of external terminals includes N first holding circuits to hold respectively N unit patterns produced by dividing an internal signal pattern to be input to or output from the test target circuit by N, where N is a natural number of two or greater, and a control circuit to make the internal signal pattern held in the N first holding circuits be changed selectively on a unit pattern basis based on a value of an identification signal assigned to each of the unit patterns beforehand, or to make the internal signal pattern held in the N first holding circuits be output selectively on a unit pattern basis based on the values of the identification signal.

9 Claims, 77 Drawing Sheets

| IDENTIFICATION NUMBER | | INTERNAL SIGNAL NAME |
|---|---|---|
| UPPER LEVEL | LOWER LEVEL | |
| 0 | 0 | sig_i_00 |
| 0 | 1 | sig_i_01 |
| 0 | 2 | sig_i_02 |
| 0 | 3 | sig_i_03 |
| 1 | 0 | sig_i_04 |
| 1 | 1 | sig_i_05 |
| 1 | 2 | sig_i_06 |
| 1 | 3 | sig_i_07 |
| 2 | 0 | sig_i_08 |
| 2 | 1 | sig_i_09 |
| 2 | 2 | sig_i_10 |
| 2 | 3 | sig_i_11 |
| 3 | 0 | sig_i_12 |
| 3 | 1 | sig_i_13 |
| 3 | 2 | sig_i_14 |
| 3 | 3 | sig_i_15 |
| OTHER VALUES | | NO ASSIGNMENT |

Fig. 3

|  |  | DRIVE PATTERN | | | | VERIFICATION PATTERN | | | |
|---|---|---|---|---|---|---|---|---|---|
| PN1 | CL2 | USN=3 3210 | USN=2 3210 | USN=1 3210 | USN=0 3210 | sig_o_00 sig_o_01 sig_o_02 sig_o_03 | sig_o_04 sig_o_05 sig_o_06 sig_o_07 | sig_o_08 sig_o_09 sig_o_10 sig_o_11 | sig_o_12 sig_o_13 sig_o_14 sig_o_15 |
| 0 | 1 | 1001 | 1100 | 0000 | 0000 | HLHL | LHLL | LLLL | HLLL |
| 1 | 1 | 1001 | 1100 | 0000 | 0000 | HLHL | LHLL | LLLL | HLHL |
| 2 | 1 | 1001 | 1100 | 0000 | 0100 | HLHL | LHLL | LLLL | HLHL |
| 3 | 1 | 1001 | 1100 | 1000 | 0100 | HLHL | LLLH | LLHH | HLHL |
| 4 | 0 | 1001 | 1100 | 1000 | 0100 | HLHL | LLLH | LLHH | HLHL |
| 5 | 1 | 1001 | 1100 | 1000 | 0100 | HLHL | LLLH | LLHH | HLHL |

Fig. 4

|  | USN= 3 3210 | USN= 2 3210 | USN= 1 3210 | USN= 0 3210 |
|---|---|---|---|---|
|  | DRIVE PATTERN ||||
| PN1= 0 | 1001 | 1100 | 0000 | 0000 |
| PN1= 1 | 1001 | 1100 | 0000 | 0000 |
| PN1= 2 | 1001 | 1100 | 0000 | 0100 |
| PN1= 3 | 1001 | 1100 | 1000 | 0100 |
| PN1= 4 | 1001 | 1100 | 1000 | 0100 |
| PN1= 5 | 1001 | 1100 | 1000 | 0100 |

Fig. 7A

<CHANGE POINT DETECTION TABLE>

|  | USN=3 | USN=2 | USN=1 | USN=0 |
|---|---|---|---|---|
| PN1=0 | 1 | 1 | 1 | 1 |
| PN1=1 | 0 | 0 | 0 | 0 |
| PN1=2 | 0 | 0 | 0 | 1 |
| PN1=3 | 0 | 0 | 1 | 0 |
| PN1=4 | 0 | 0 | 0 | 0 |
| PN1=5 | 0 | 0 | 0 | 0 |

Fig. 7B

| | | DRIVE TERNIMAL PATTERN | | | |
|---|---|---|---|---|---|
| | | UB | CL1 | CL2 | DATA BUS (LB) 3210 |
| PN2=0 | PN1=0 | 0 | 1 | 0 | 0000 |
| PN2=1 | PN1=0 | 1 | 1 | 0 | 0000 |
| PN2=2 | PN1=0 | 2 | 1 | 0 | 1100 |
| PN2=3 | PN1=0 | 3 | 1 | 0 | 1001 |
| PN2=4 | PN1=0 | - | 0 | 1 | - |
| PN2=5 | PN1=1 | 0 | 0 | 1 | - |
| PN2=6 | PN1=2 | - | 1 | 0 | 0100 |
| PN2=7 | PN1=2 | 1 | 0 | 1 | - |
| PN2=8 | PN1=3 | - | 1 | 0 | 1000 |
| PN2=9 | PN1=3 | - | 0 | 1 | - |
| PN2=10 | PN1=4 | - | 0 | 0 | - |
| PN2=11 | PN1=5 | - | 0 | 1 | - |

Fig. 9A

| | | PN2=0 | PN2=1 | PN2=2 | PN2=3 | PN2=4 | PN2=5 | PN2=6 | PN2=7 | PN2=8 | PN2=9 | PN2=10 | PN2=11 |
|---|---|---|---|---|---|---|---|---|---|---|---|---|---|
| sig_o_00 | VERIFICATION TERMINAL PATTERN | X | X | X | X | L | L | X | L | X | L | L | L |
| sig_o_01 | | X | X | X | X | H | H | X | H | X | H | H | H |
| sig_o_02 | | X | X | X | X | L | L | X | L | X | L | L | L |
| sig_o_03 | | X | X | X | X | H | H | X | H | X | H | H | H |
| sig_o_04 | | X | X | X | X | L | L | X | L | X | H | H | H |
| sig_o_05 | | X | X | X | X | L | L | X | L | X | L | L | L |
| sig_o_06 | | X | X | X | X | H | H | X | H | X | L | L | L |
| sig_o_07 | | X | X | X | X | L | L | X | L | X | L | L | L |
| sig_o_08 | | X | X | X | X | L | L | X | L | X | H | H | H |
| sig_o_09 | | X | X | X | X | L | L | X | L | X | H | H | H |
| sig_o_10 | | X | X | X | X | L | L | X | L | X | L | L | L |
| sig_o_11 | | X | X | X | X | L | L | X | L | X | L | L | L |
| sig_o_12 | | X | X | X | X | L | L | X | L | X | L | L | L |
| sig_o_13 | | X | X | X | X | L | H | X | H | X | H | H | H |
| sig_o_14 | | X | X | X | X | L | L | X | L | X | L | L | L |
| sig_o_15 | | X | X | X | X | H | H | X | H | X | H | H | H |

Fig. 9B

| IDENTIFICATION NUMBER | | INTERNAL SIGNAL NAME |
|---|---|---|
| UPPER LEVEL | LOWER LEVEL | |
| 0 | 0 | sig_o_00 |
| 0 | 1 | sig_o_01 |
| 0 | 2 | sig_o_02 |
| 0 | 3 | sig_o_03 |
| 1 | 0 | sig_o_04 |
| 1 | 1 | sig_o_05 |
| 1 | 2 | sig_o_06 |
| 1 | 3 | sig_o_07 |
| 2 | 0 | sig_o_08 |
| 2 | 1 | sig_o_09 |
| 2 | 2 | sig_o_10 |
| 2 | 3 | sig_o_11 |
| 3 | 0 | sig_o_12 |
| 3 | 1 | sig_o_13 |
| 3 | 2 | sig_o_14 |
| 3 | 3 | sig_o_15 |
| 4 | 0 | edge_o_0 |
| 4 | 1 | edge_o_1 |
| 4 | 2 | edge_o_2 |
| 4 | 3 | edge_o_3 |
| OTHER VALUES | | NO ASSIGNMENT |

Fig. 12

| PN1 | CL2 | DRIVE PATTERN | | | | VERIFICATION PATTERN | | | |
|---|---|---|---|---|---|---|---|---|---|
| | | sig_i12 sig_i13 sig_i14 sig_i15 | sig_i08 sig_i09 sig_i10 sig_i11 | sig_i04 sig_i05 sig_i06 sig_i07 | sig_i00 sig_i01 sig_i02 sig_i03 | USN=3 3210 | USN=2 3210 | USN=1 3210 | USN=0 3210 |
| 0 | 1 | 1001 | 1100 | 0000 | 0000 | HLLL | LLLL | LHLL | HLHL |
| 1 | 1 | 1001 | 1100 | 0000 | 0000 | HLHL | LLLL | LHLL | HLHL |
| 2 | 1 | 1001 | 1100 | 0000 | 0100 | HLHL | LLLL | LHLL | HLHL |
| 3 | 1 | 1001 | 1100 | 1000 | 0100 | HLHL | LLHH | LLLH | HLHL |
| 4 | 0 | 1001 | 1100 | 1000 | 0100 | HLHL | LLHH | LLLH | HLHL |
| 5 | 1 | 1001 | 1100 | 1000 | 0100 | HLHL | LLHH | LLLH | HLHL |

Fig. 13

|  | USN= 3 3210 | USN= 2 3210 | USN= 1 3210 | USN= 0 3210 |
|---|---|---|---|---|
|  | VERIFICATON PATTERN ||||
| PN1= 0 | HLLL | LLLL | LHLL | HLHL |
| PN1= 1 | HLHL | LLLL | LHLL | HLHL |
| PN1= 2 | HLH L | LLLL | LHLL | HLHL |
| PN1= 3 | HLHL | LLHH | LLLH | HLHL |
| PN1= 4 | HLHL | LLHH | LLLH | HLHL |
| PN1= 5 | HLHL | LLHH | LLLH | HLHL |

Fig. 16A

<CHANGE POINT DETECTION TABLE>

|  | USN=3 | USN=2 | USN=1 | USN=0 |
|---|---|---|---|---|
| PN1= 0 | X | X | X | X |
| PN1= 1 | H | L | L | L |
| PN1= 2 | L | L | L | L |
| PN1= 3 | L | H | H | L |
| PN1= 4 | L | L | L | L |
| PN1= 5 | L | L | L | L |

Fig. 16B

| | | VERIFICATION TERMINAL PATTERN | | | |
|---|---|---|---|---|---|
| | | UB | CL1 | CL2 | DATA BUS (LB) 3210 |
| PN2=0 | PN1=0 | 4 | 1 | 1 | XXXX |
| PN2=1 | PN1=0 | 0 | 0 | 0 | HLHL |
| PN2=2 | PN1=0 | 1 | 0 | 0 | LHLL |
| PN2=3 | PN1=0 | 2 | 0 | 0 | LLLL |
| PN2=4 | PN1=0 | 3 | 0 | 0 | HLLL |
| PN2=5 | PN1=1 | 4 | 1 | 1 | HLLL |
| PN2=6 | PN1=1 | 3 | 0 | 0 | HLHL |
| PN2=7 | PN1=2 | 4 | 1 | 1 | LLLL |
| PN2=8 | PN1=3 | 4 | 1 | 1 | LHHL |
| PN2=9 | PN1=3 | 1 | 0 | 0 | LLLH |
| PN2=10 | PN1=3 | 2 | 0 | 0 | LLHH |
| PN2=11 | PN1=4 | 4 | 1 | 0 | LLLL |
| PN2=12 | PN1=5 | 4 | 1 | 1 | LLLL |

Fig. 18A

| | DRIVE TERMINAL PATTERN | | | | | | | | | | | | |
|---|---|---|---|---|---|---|---|---|---|---|---|---|---|
| sig_i00 sig_i01 sig_i02 sig_i03 | 0000 | 0000 | 0000 | 0000 | 0000 | 0000 | 0100 | 0100 | 0100 | 0100 | 0100 | | |
| sig_i04 sig_i05 sig_i06 sig_i07 | 0000 | 0000 | 0000 | 0000 | 0000 | 0000 | 1000 | 1000 | 1000 | 1000 | | | |
| sig_i08 sig_i09 sig_i10 sig_i11 | 1100 | 1100 | 1100 | 1100 | 1100 | 1100 | 1100 | 1100 | 1100 | 1100 | | | |
| sig_i12 sig_i13 sig_i14 sig_i15 | 1001 | 1001 | 1001 | 1001 | 1001 | 1001 | 1001 | 1001 | 1001 | 1001 | 1001 | | |
| | PN2=0 | PN2=1 | PN2=2 | PN2=3 | PN2=4 | PN2=5 | PN2=6 | PN2=7 | PN2=8 | PN2=9 | PN2=10 | PN2=11 | PN2=12 |

Fig. 18B

| IDENTIFICATION NUMBER | | INTERNAL SIGNAL NAME |
|---|---|---|
| UPPER LEVEL | LOWER LEVEL | |
| 0 | 0 | sig_o_00 |
| 0 | 1 | sig_o_01 |
| 0 | 2 | sig_o_02 |
| 0 | 3 | sig_o_03 |
| 1 | 0 | sig_o_04 |
| 1 | 1 | sig_o_05 |
| 1 | 2 | sig_o_06 |
| 1 | 3 | sig_o_07 |
| 2 | 0 | sig_o_08 |
| 2 | 1 | sig_o_09 |
| 2 | 2 | sig_o_10 |
| 2 | 3 | sig_o_11 |
| 3 | 0 | sig_o_12 |
| 3 | 1 | sig_o_13 |
| 3 | 2 | sig_o_14 |
| 3 | 3 | sig_o_15 |
| OTHER VALUES | | NO ASSIGNMENT |

Fig. 20

| | | DRIVE TERNIMAL PATTERN | | | | |
|---|---|---|---|---|---|---|
| | | UB | CL1 | CL2 | UNIT PATTERN DATA BUS (LB) 3210 | UNIT PATTERN DATA BUS (LB) 3210 |
| PN2= 0 | PN1= 0 | 0 | 1 | 1 | HLHL | XXXX |
| PN2= 1 | PN1= 0 | 1 | 0 | 0 | LHLL | XXXX |
| PN2= 2 | PN1= 0 | 2 | 0 | 0 | LLLL | XXXX |
| PN2= 3 | PN1= 0 | 3 | 0 | 0 | HLLL | XXXX |
| PN2= 4 | PN1= 1 | 3 | 1 | 1 | HLHL | HLLL |
| PN2= 5 | PN1= 2 | - | 1 | 1 | XXXX | LLLL |
| PN2= 6 | PN1= 3 | 1 | 1 | 1 | LLLH | LHHL |
| PN2= 7 | PN1= 3 | 2 | 0 | 0 | LLHH | XXXX |
| PN2= 8 | PN 1=4 | - | 1 | 0 | XXXX | LLLL |
| PN2= 9 | PN1= 5 | - | 1 | 1 | XXXX | LLLL |

Fig. 23A

| | | VERIFICATION TERMINAL PATTERN | | | |
|---|---|---|---|---|---|
| | | USN=3 3210 | USN=2 3210 | USN=1 3210 | USN=0 3210 |
| PN2=0 | PN1=0 | 1001 | 1100 | 0000 | 0000 |
| PN2=1 | PN1=0 | 1001 | 1100 | 0000 | 0000 |
| PN2=2 | PN1=0 | 1001 | 1100 | 0000 | 0000 |
| PN2=3 | PN1=0 | 1001 | 1100 | 0000 | 0000 |
| PN2=4 | PN1=1 | 1001 | 1100 | 0000 | 0100 |
| PN2=5 | PN1=2 | 1001 | 1100 | 1000 | 0100 |
| PN2=6 | PN1=3 | 1001 | 1100 | 1000 | 0100 |
| PN2=7 | PN1=3 | 1001 | 1100 | 1000 | 0100 |
| PN2=8 | PN1=4 | 1001 | 1100 | 1000 | 0100 |
| PN2=9 | PN1=5 | 1001 | 1100 | 1000 | 0100 |

Fig. 23B

⟨CHANGE POINT DETECTION TABLE⟩

|         | USN=3 | USN=2 | USN=1 | USN=0 |
|---------|-------|-------|-------|-------|
| PN1= 0  | 1     | 1     | 1     | 1     |
| PN1= 1  | 0     | 0     | 0     | 0     |
| PN1= 2  | 0     | 0     | 0     | 0     |
| PN1= 3  | 0     | 0     | 0     | 0     |
| PN1= 4  | 0     | 0     | 0     | 0     |
| PN1= 5  | 0     | 0     | 0     | 0     |
| PN1= 6  | 0     | 0     | 0     | 0     |
| PN1= 7  | 0     | 0     | 0     | 1     |
| PN1= 8  | 0     | 0     | 1     | 0     |
| PN1= 9  | 0     | 0     | 0     | 0     |
| PN1= 10 | 0     | 0     | 0     | 0     |
| PN1= 11 | 0     | 0     | 0     | 0     |
| PN1= 12 | 0     | 0     | 0     | 0     |

Fig. 26

| | PN3 | PN2 | PN1 | EXTERNAL TERMINAL PATTERN | | | | | | |
|---|---|---|---|---|---|---|---|---|---|---|
| | | | | UB FOR DRIVE | CL1 FOR DRIVE | CL2 | DATA BUS FOR DRIVE (LB) 3210 | UB FOR VERIFICATION | CL1 FOR VERIFICATION | DATA BUS FOR VERIFICATION (LB) 3210 |
| 0 | 0 | 0 | 0 | 0 | 1 | 0 | 0000 | 4 | 0 | XXXX |
| 1 | 0 | 0 | 1 | 1 | 1 | 0 | 0000 | 4 | 0 | XXXX |
| 2 | 0 | 0 | 2 | 1 | 0 | 1100 | 4 | 0 | XXXX |
| 3 | 0 | 0 | 3 | 1 | 0 | 1001 | 4 | 0 | XXXX |
| 4 | 0 | 0 | - | 0 | 1 | ---- | 4 | 1 | XXXX |
| 5 | 1 | 0 | - | 0 | 0 | ---- | 0 | 0 | HLHL |
| 6 | 2 | 0 | - | 0 | 0 | ---- | 1 | 0 | LHLL |
| 7 | 3 | 0 | - | 0 | 0 | ---- | 2 | 0 | LLLL |
| 8 | 4 | 0 | - | 0 | 0 | ---- | 3 | 0 | HLLL |
| 9 | 5 | 1 | - | 0 | 1 | ---- | 4 | 1 | HLLL |
| 10 | 6 | 1 | - | 0 | 0 | ---- | 3 | 0 | HLHL |
| 11 | 7 | 2 | 0 | 1 | 0 | 0100 | 4 | 0 | XXXX |
| 12 | 7 | 2 | - | 0 | 1 | ---- | 4 | 1 | LLLL |
| 13 | 8 | 3 | 1 | 1 | 0 | 1000 | 4 | 0 | XXXX |
| 14 | 8 | 3 | - | 0 | 1 | ---- | 4 | 1 | LHHL |
| 15 | 9 | 3 | - | 0 | 0 | ---- | 1 | 0 | LLLH |
| 16 | 10 | 3 | - | 0 | 0 | ---- | 2 | 0 | LLHH |
| 17 | 11 | 4 | - | 0 | 0 | ---- | 4 | 1 | LLLL |
| 18 | 12 | 5 | - | 0 | 1 | ---- | 4 | 1 | LLLL |

Fig. 27

| IDENTIFICATION NUMBER | | INTERNAL SIGNAL NAME | INPUT SIGNAL NAME |
|---|---|---|---|
| UPPER LEVEL | LOWER LEVEL | | |
| 0 | 0 | buf_i_00 | sig_i_00 |
| 0 | 1 | buf_i_01 | sig_i_01 |
| 0 | 2 | buf_i_02 | sig_i_02 |
| 0 | 3 | buf_i_03 | sig_i_03 |
| 1 | 0 | buf_i_04 | sig_i_04 |
| 1 | 1 | buf_i_05 | sig_i_05 |
| 1 | 2 | buf_i_06 | sig_i_06 |
| 1 | 3 | buf_i_07 | sig_i_07 |
| 2 | 0 | buf_i_08 | sig_i_08 |
| 2 | 1 | buf_i_09 | sig_i_09 |
| 2 | 2 | buf_i_10 | sig_i_10 |
| 2 | 3 | buf_i_11 | sig_i_11 |
| 3 | 0 | buf_i_12 | sig_i_12 |
| 3 | 1 | buf_i_13 | sig_i_13 |
| 3 | 2 | buf_i_14 | sig_i_14 |
| 3 | 3 | buf_i_15 | sig_i_15 |
| OTHER VALUES | | NO ASSIGNMENT | NO ASSIGNMENT |

Fig. 33

| IDENTIFICATION NUMBER | | INTERNAL SIGNAL NAME | OUTPUT SIGNAL NAME |
|---|---|---|---|
| UPPER LEVEL | LOWER LEVEL | | |
| 0 | 0 | buf_o_00 | sig_o_00 |
| 0 | 1 | buf_o_01 | sig_o_01 |
| 0 | 2 | buf_o_02 | sig_o_02 |
| 0 | 3 | buf_o_03 | sig_o_03 |
| 1 | 0 | buf_o_04 | sig_o_04 |
| 1 | 1 | buf_o_05 | sig_o_05 |
| 1 | 2 | buf_o_06 | sig_o_06 |
| 1 | 3 | buf_o_07 | sig_o_07 |
| 2 | 0 | buf_o_08 | sig_o_08 |
| 2 | 1 | buf_o_09 | sig_o_09 |
| 2 | 2 | buf_o_10 | sig_o_10 |
| 2 | 3 | buf_o_11 | sig_o_11 |
| 3 | 0 | buf_o_12 | sig_o_12 |
| 3 | 1 | buf_o_13 | sig_o_13 |
| 3 | 2 | buf_o_14 | sig_o_14 |
| 3 | 3 | buf_o_15 | sig_o_15 |
| 4 | 0 | edge_o_0 | — |
| 4 | 1 | edge_o_1 | — |
| 4 | 2 | edge_o_2 | — |
| 4 | 3 | edge_o_3 | — |
| OTHER VALUES | | NO ASSIGNMENT | NO ASSIGNMENT |

Fig. 34

| PGN | PN1 | USN LSN CL2 | 3 3210 | 2 3210 | 1 3210 | 0 3210 | 3 3210 | 2 3210 | 1 3210 | 0 3210 |
|---|---|---|---|---|---|---|---|---|---|---|
| | | | \multicolumn{4}{c}{DRIVE PATTERN} | \multicolumn{4}{c}{VERIFICATION PATTERN} |
| 0 | 0 | 1 | 1001 | 1100 | 0000 | 0000 | HLLL | LLLL | LHLL | HLHL |
| 0 | 1 | 1 | 1001 | 1100 | 0000 | 0000 | HLHL | LLLL | LHLL | HLHL |
| 1 | 2 | 1 | 1001 | 1100 | 0000 | 0100 | HLHL | LLLL | LHLL | HLHL |
| 1 | 3 | 1 | 1001 | 1100 | 1000 | 0100 | HLHL | LLHH | LHLL | HLHL |
| 2 | 4 | 1 | 1001 | 1100 | 1000 | 0100 | HLHL | LLHH | LLLH | HLHL |
| 2 | 5 | 1 | 1001 | 1100 | 1000 | 0100 | HLHL | LLHH | LLLH | HLHL |

Fig. 37

| PGN $[=(PN1)/(DP+1)]$ | PN1 | TARGET OF DELAY TEST (Launch→Capture) |
|---|---|---|
| 0 | 0 | — |
| 0 | 1 | PN1=0→PN1=1 |
| 1 | 2 | — |
| 1 | 3 | PN1=2→PN1=3 |
| 2 | 4 | — |
| 2 | 5 | PN1=4→PN1=5 |

Fig. 38

DRIVE TERMINAL PATTERN

| PNI1 | PGN | PN1 | iUSN | CL1a | CL3 | i_LB |
|---|---|---|---|---|---|---|
| 0 | 0 | 0 | 0 | 1 | 0 | 0000 |
| 1 | 0 | 0 | 1 | 1 | 0 | 0000 |
| 2 | 0 | 0 | 2 | 1 | 0 | 1100 |
| 3 | 0 | 0 | 3 | 1 | 0 | 1001 |
| 4 | 0 | 0 | - | 0 | 1 | ---- |
| 5 | 0 | 1 | - | 0 | 1 | ---- |
| 6 | 1 | 2 | 0 | 1 | 0 | 0100 |
| 7 | 1 | 2 | - | 0 | 1 | ---- |
| 8 | 1 | 3 | 1 | 1 | 0 | 1000 |
| 9 | 1 | 3 | - | 0 | 1 | ---- |
| 10 | 2 | 4 | - | 0 | 1 | ---- |
| 11 | 2 | 5 | - | 0 | 1 | ---- |

Fig. 39

VERIFICATION TERMINAL PATTERN

| PNO1 | PGN | PN1 | oUSN | CL1b | o_LB |
|---|---|---|---|---|---|
| 0 | 0 | 0 | 4 | 1 | XXXX |
| 1 | 0 | 0 | 0 | 0 | HLHL |
| 2 | 0 | 0 | 1 | 0 | LHLL |
| 3 | 0 | 0 | 2 | 0 | LLLL |
| 4 | 0 | 0 | 3 | 0 | HLLL |
| 5 | 0 | 1 | 4 | 1 | HLLL |
| 6 | 0 | 1 | 3 | 0 | HLHL |
| 7 | 1 | 2 | 4 | 1 | LLLL |
| 8 | 1 | 3 | 4 | 1 | LHHL |
| 9 | 1 | 3 | 1 | 0 | LLLH |
| 10 | 1 | 3 | 2 | 0 | LLHH |
| 11 | 2 | 4 | 4 | 1 | LLLL |
| 12 | 2 | 5 | 4 | 1 | LLLL |

Fig. 40

SEQUENCE CHART

| PN2 | PGN | CL2 | PNI1 | PNO1 |
|---|---|---|---|---|
| 0 | 0 | 0 | 0 | — |
| 1 | 0 | 0 | 1 | — |
| 2 | 0 | 0 | 2 | — |
| 3 | 0 | 0 | 3 | — |
| 4 | 0 | 0 | 4 | — |
| 5 | 0 | 0 | 5 | — |
| 6 | — | 1 | — | — |
| 7 | — | 1 | — | — |
| 8 | 0 | 0 | — | 0 |
| 9 | 0 | 0 | — | 1 |
| 10 | 0 | 0 | — | 2 |
| 11 | 0 | 0 | — | 3 |
| 12 | 0 | 0 | — | 4 |
| 13 | 0 | 0 | — | 5 |
| 14 | 0 | 0 | — | 6 |
| 15 | 1 | 0 | 6 | — |
| 16 | 1 | 0 | 7 | — |
| 17 | 1 | 0 | 8 | — |
| 18 | 1 | 0 | 9 | — |
| 19 | — | 1 | — | — |
| 20 | — | 1 | — | — |
| 21 | 1 | 0 | — | 7 |
| 22 | 1 | 0 | — | 8 |
| 23 | 1 | 0 | — | 9 |
| 24 | 1 | 0 | — | 10 |
| 25 | 2 | 0 | 10 | — |
| 26 | 2 | 0 | 11 | — |
| 27 | — | 1 | — | — |
| 28 | — | 1 | — | — |
| 29 | 2 | 0 | — | 11 |
| 30 | 2 | 0 | — | 12 |

Fig. 41

INTERMIDIATE PATTERN A

| PN2 | CYCLE | CL2 | iUSN | CL1a | CL3 | i_LB | oUSN | CL1b | o_LB |
|---|---|---|---|---|---|---|---|---|---|
| 0 | LONG | 0 | 0 | 1 | 0 | 0000 | — | — | XXXX |
| 1 | LONG | 0 | 1 | 1 | 0 | 0000 | — | — | XXXX |
| 2 | LONG | 0 | 2 | 1 | 0 | 1100 | — | — | XXXX |
| 3 | LONG | 0 | 3 | 1 | 0 | 1001 | — | — | XXXX |
| 4 | LONG | 0 | — | 0 | 1 | ---- | — | — | XXXX |
| 5 | LONG | 0 | — | 0 | 1 | ---- | — | — | XXXX |
| 6 | SHORT | 1 | — | — | — | ---- | — | — | XXXX |
| 7 | SHORT | 1 | — | — | — | ---- | — | — | XXXX |
| 8 | LONG | 0 | — | — | — | ---- | 4 | 1 | XXXX |
| 9 | LONG | 0 | — | — | — | ---- | 0 | 0 | HLHL |
| 10 | LONG | 0 | — | — | — | ---- | 1 | 0 | LHLL |
| 11 | LONG | 0 | — | — | — | ---- | 2 | 0 | LLLL |
| 12 | LONG | 0 | — | — | — | ---- | 3 | 0 | HLLL |
| 13 | LONG | 0 | — | — | — | ---- | 4 | 1 | HLLL |
| 14 | LONG | 0 | — | — | — | ---- | 3 | 0 | HLHL |
| 15 | LONG | 0 | 0 | 1 | 0 | 0100 | — | — | XXXX |
| 16 | LONG | 0 | — | 0 | 1 | ---- | — | — | XXXX |
| 17 | LONG | 0 | 1 | 1 | 0 | 1000 | — | — | XXXX |
| 18 | LONG | 0 | — | 0 | 1 | ---- | — | — | XXXX |
| 19 | SHORT | 1 | — | — | — | ---- | — | — | XXXX |
| 20 | SHORT | 1 | — | — | — | ---- | — | — | XXXX |
| 21 | LONG | 0 | — | — | — | ---- | 4 | 1 | LLLL |
| 22 | LONG | 0 | — | — | — | ---- | 4 | 1 | LHHL |
| 23 | LONG | 0 | — | — | — | ---- | 1 | 0 | LLLH |
| 24 | LONG | 0 | — | — | — | ---- | 2 | 0 | LLHH |
| 25 | LONG | 0 | — | 0 | 1 | ---- | — | — | XXXX |
| 26 | LONG | 0 | — | 0 | 1 | ---- | — | — | XXXX |
| 27 | SHORT | 1 | — | — | — | ---- | — | — | XXXX |
| 28 | SHORT | 1 | — | — | — | ---- | — | — | XXXX |
| 29 | LONG | 0 | — | — | — | — | 4 | 1 | LLLL |
| 30 | LONG | 0 | — | — | — | — | 4 | 1 | LLLL |

Fig. 43

INTERMIDIATE PATTERN B

| PN3 | PN2 | CYCLE | CL2 | iUSN | CL1a | CL3 | I_LB | oUSN | CL1b | O_LB |
|---|---|---|---|---|---|---|---|---|---|---|
| 0 | 0 | LONG | 0 | 0 | 1 | 0 | 0000 | — | — | XXXX |
| 1 | 1 | LONG | 0 | 1 | 1 | 0 | 0000 | — | — | XXXX |
| 2 | 2 | LONG | 0 | 2 | 1 | 0 | 1100 | — | — | XXXX |
| 3 | 3 | LONG | 0 | 3 | 1 | 0 | 1001 | — | — | XXXX |
| 4 | 4 | LONG | 0 | — | 0 | 1 | — | — | — | XXXX |
| 5 | 6 | SHORT | 1 | — | — | — | — | — | — | XXXX |
| 6 | 7 | SHORT | 1 | — | — | — | — | — | — | XXXX |
| 7 | 8 | LONG | 0 | — | — | — | — | 4 | 0 | XXXX |
| 8 | 9 | LONG | 0 | — | — | — | — | 0 | 0 | HLHL |
| 9 | 10 | LONG | 0 | — | — | — | — | 1 | 0 | LHLL |
| 10 | 11 | LONG | 0 | — | — | — | — | 2 | 0 | LLLL |
| 11 | 12 | LONG | 0 | — | — | — | — | 3 | 0 | HLLL |
| 12 | 13 | LONG | 0 | — | — | — | — | 4 | 1 | HLLL |
| 13 | 14 | LONG | 0 | — | — | — | — | 3 | 0 | HLHL |
| 14 | 15 | LONG | 0 | 0 | 1 | 0 | 0100 | — | — | XXXX |
| 15 | 16 | LONG | 0 | — | 0 | 1 | — | — | — | XXXX |
| 16 | 17 | LONG | 0 | 1 | 1 | 0 | 1000 | — | — | XXXX |
| 17 | 19 | SHORT | 1 | — | — | — | — | — | — | XXXX |
| 18 | 20 | SHORT | 1 | — | — | — | — | — | — | XXXX |
| 19 | 21 | LONG | 0 | — | — | — | — | 4 | 0 | LLLL |
| 20 | 22 | LONG | 0 | — | — | — | — | 4 | 1 | LHHL |
| 21 | 23 | LONG | 0 | — | — | — | — | 1 | 0 | LLLH |
| 22 | 24 | LONG | 0 | — | — | — | — | 2 | 0 | LLHH |
| 23 | 25 | LONG | 0 | — | 0 | 1 | — | — | — | XXXX |
| 24 | 27 | SHORT | 1 | — | — | — | — | — | — | XXXX |
| 25 | 28 | SHORT | 1 | — | — | — | — | — | — | XXXX |
| 26 | 29 | LONG | 0 | — | — | — | — | 4 | 0 | LLLL |
| 27 | 30 | LONG | 0 | — | — | — | — | 4 | 1 | LLLL |

Fig. 45

EXTERNAL TERMINAL PATTERN

| PN4 | PN3 | CYCLE | CL2 | iUSN | CL1a | CL3 | i_LB | oUSN | CL1b | O_LB |
|---|---|---|---|---|---|---|---|---|---|---|
| 0 | 0 | LONG | 0 | 0 | 1 | 0 | 0000 | — | — | XXXX |
| 1 | 1 | LONG | 0 | 1 | 1 | 0 | 0000 | — | — | XXXX |
| 2 | 2 | LONG | 0 | 2 | 1 | 0 | 1100 | — | — | XXXX |
| 3 | 3 | LONG | 0 | 3 | 1 | 0 | 1001 | — | — | XXXX |
| 4 | 4 | LONG | 0 | — | 0 | 1 | —— | — | — | XXXX |
| 5 | 5 | SHORT | 1 | — | — | — | —— | — | — | XXXX |
| 6 | 6 | SHORT | 1 | — | — | — | —— | — | — | XXXX |
| 7 | 7 | LONG | 0 | — | — | — | —— | 4 | 0 | XXXX |
| 8 | 8 | LONG | 0 | — | — | — | —— | 0 | 0 | HLHL |
| 9 | 9 | LONG | 0 | — | — | — | —— | 1 | 0 | LHLL |
| 10 | 10 | LONG | 0 | — | — | — | —— | 2 | 0 | LLLL |
| 11 | 11 | LONG | 0 | — | — | — | —— | 3 | 0 | HLLL |
| 12 | 12 | LONG | 0 | — | — | — | —— | 4 | 1 | HLLL |
| 13 | 14, 13 | LONG | 0 | 0 | 1 | 0 | 0100 | 3 | 0 | HLHL |
| 14 | 15, 14 | LONG | 0 | — | 0 | 1 | —— | — | — | XXXX |
| 15 | 16, 15 | LONG | 0 | 1 | 1 | 0 | 1000 | — | — | XXXX |
| 16 | 17 | SHORT | 1 | — | — | — | —— | — | — | XXXX |
| 17 | 18 | SHORT | 1 | — | — | — | —— | — | — | XXXX |
| 18 | 19 | LONG | 0 | — | — | — | —— | 4 | 0 | LLLL |
| 19 | 20 | LONG | 0 | — | — | — | —— | 4 | 1 | LHHL |
| 20 | 22, 21 | LONG | 0 | — | 0 | 1 | —— | 1 | 0 | LLLH |
| 21 | 23 | LONG | 0 | — | — | — | —— | 2 | 0 | LLHH |
| 22 | 24 | SHORT | 1 | — | — | — | —— | — | — | XXXX |
| 23 | 25 | SHORT | 1 | — | — | — | —— | — | — | XXXX |
| 24 | 26 | LONG | 0 | — | — | — | — | 4 | 0 | LLLL |
| 25 | 27 | LONG | 0 | — | — | — | — | 4 | 1 | LLLL |

Fig. 47

| PNA1 | PGN | PN1 | USN | | | | | | | |
|---|---|---|---|---|---|---|---|---|---|---|
| | | | LSN | 3 | 2 | 1 | 0 | 3 | 2 | 1 | 0 |
| | | | CL2 | 3210 | 3210 | 3210 | 3210 | 3210 | 3210 | 3210 | 3210 |
| | | | | | DRIVE PATTERN | | | | VERIFICATION PATTERN | | |
| 0 | 0 | NONE | 1 | 1001 | 1100 | 0000 | 0000 | XXXX | XXXX | XXXX | XXXX |
| 1 | 0 | 0 | 1 | 1001 | 1100 | 0000 | 0000 | HLLL | LLLL | LHLL | HLHL |
| 2 | 1 | 1 | 1 | 1001 | 1100 | 0000 | 0000 | HLHL | LLLL | LHLL | HLHL |
| 3 | 1 | 2 | 1 | 1001 | 1100 | 0000 | 0100 | HLHL | LLLL | LHLL | HLHL |
| 4 | 2 | 3 | 1 | 1001 | 1100 | 1000 | 0100 | HLHL | LLHH | LLLH | HLHL |
| 5 | 2 | 4 | 1 | 1001 | 1100 | 1000 | 0100 | HLHL | LLHH | LLLH | HLHL |
| 6 | 3 | 5 | 1 | 1001 | 1100 | 1000 | 0100 | HLHL | LLHH | LLLH | HLHL |
| 7 | 3 | NONE | 1 | 1001 | 1100 | 1000 | 0100 | XXXX | XXXX | XXXX | XXXX |

Fig. 55

| PNA1<br>[= PN1+OS] | PGN<br>= (PN1 + OS) / (DP + 1) ] | PN1 | TARGET OF DELAY TEST<br>(Launch→Capture) |
|---|---|---|---|
| 0 | 0 | NONE | — |
| 1 | 0 | 0 | — |
| 2 | 1 | 1 | — |
| 3 | 1 | 2 | PN1=1→PN1=2 |
| 4 | 2 | 3 | — |
| 5 | 2 | 4 | PN1=3→PN1=4 |
| 6 | 3 | 5 | — |
| 7 | 3 | NONE | — |

Fig. 56

<CHANGE POINT DETECTION TABLE>

|  | USN=3 | USN=2 | USN=1 | USN=0 |
|---|---|---|---|---|
| PNA1=0 | 1 | 1 | 1 | 1 |
| PNA1=1 | 0 | 0 | 0 | 0 |
| PNA1=2 | 0 | 0 | 0 | 0 |
| PNA1=3 | 0 | 0 | 0 | 1 |
| PNA1=4 | 0 | 0 | 1 | 0 |
| PNA1=5 | 0 | 0 | 0 | 0 |
| PNA1=6 | 0 | 0 | 0 | 0 |
| PNA1=7 | 0 | 0 | 0 | 0 |

Fig. 57

DRIVE TERMINAL PATTERN

| PNI1 | PNA1 | PGN | PN1 | USN | CL1a | CL3 | i_LB |
|---|---|---|---|---|---|---|---|
| 0 | 0 | 0 | NONE | 0 | 1 | 0 | 0000 |
| 1 | 0 | 0 | NONE | 1 | 1 | 0 | 0000 |
| 2 | 0 | 0 | NONE | 2 | 1 | 0 | 1100 |
| 3 | 0 | 0 | NONE | 3 | 1 | 0 | 1001 |
| 4 | 0 | 0 | NONE | - | 0 | 1 | ---- |
| 5 | 1 | 0 | 0 | - | 0 | 1 | ---- |
| 6 | 2 | 1 | 1 | - | 0 | 1 | ---- |
| 7 | 3 | 1 | 2 | 0 | 1 | 0 | 0100 |
| 8 | 3 | 1 | 2 | - | 0 | 1 | ---- |
| 9 | 4 | 2 | 3 | 1 | 1 | 0 | 1000 |
| 10 | 4 | 2 | 3 | - | 0 | 1 | ---- |
| 11 | 5 | 2 | 4 | - | 0 | 1 | ---- |
| 12 | 6 | 3 | 5 | - | 0 | 1 | ---- |
| 13 | 7 | 3 | NONE | - | 0 | 1 | ---- |

Fig. 58

<CHANGE POINT DETECTION TABLE>

|        | USN=3 | USN=2 | USN=1 | USN=0 |
|--------|-------|-------|-------|-------|
| PNA1=0 | X     | X     | X     | X     |
| PNA1=1 | X     | X     | X     | X     |
| PNA1=2 | H     | L     | L     | L     |
| PNA1=3 | L     | L     | L     | L     |
| PNA1=4 | L     | H     | H     | L     |
| PNA1=5 | L     | L     | L     | L     |
| PNA1=6 | L     | L     | L     | L     |
| PNA1=7 | X     | X     | X     | X     |

Fig. 59

VERIFICATION TERMINAL PATTERN

| PNO1 | PNA1 | PGN | PN1 | USN | CL1b | o_LB |
|------|------|-----|-----|-----|------|------|
| 0 | 0 | 0 | NONE | 4 | 1 | XXXX |
| 1 | 1 | 0 | 0 | 4 | 1 | XXXX |
| 2 | 1 | 0 | 0 | 0 | 0 | HLHL |
| 3 | 1 | 0 | 0 | 1 | 0 | LHLL |
| 4 | 1 | 0 | 0 | 2 | 0 | LLLL |
| 5 | 1 | 0 | 0 | 3 | 0 | HLLL |
| 6 | 2 | 1 | 1 | 4 | 1 | HLLL |
| 7 | 2 | 1 | 1 | 3 | 0 | HLHL |
| 8 | 3 | 1 | 2 | 4 | 1 | LLLL |
| 9 | 4 | 2 | 3 | 4 | 1 | LHHL |
| 10 | 4 | 2 | 3 | 1 | 0 | LLLH |
| 11 | 4 | 2 | 3 | 2 | 0 | LLHH |
| 12 | 5 | 2 | 4 | 4 | 1 | LLLL |
| 13 | 6 | 3 | 5 | 4 | 1 | LLLL |
| 14 | 7 | 3 | NONE | 4 | 1 | XXXX |

Fig. 60

INTERMIDIATE PATTERN A

| PN2 | CYCLE | CL2 | iUSN | CL1a | CL3 | i_LB | oUSN | CL1b | o_LB |
|---|---|---|---|---|---|---|---|---|---|
| 0 | LONG | 0 | 0 | 1 | 0 | 0000 | — | — | XXXX |
| 1 | LONG | 0 | 1 | 1 | 0 | 0000 | — | — | XXXX |
| 2 | LONG | 0 | 2 | 1 | 0 | 1100 | — | — | XXXX |
| 3 | LONG | 0 | 3 | 1 | 0 | 1001 | — | — | XXXX |
| 4 | LONG | 0 | — | 0 | 1 | ---- | — | — | XXXX |
| 5 | LONG | 0 | — | 0 | 1 | ---- | — | — | XXXX |
| 6 | SHORT | 1 | — | — | — | ---- | — | — | XXXX |
| 7 | SHORT | 1 | — | — | — | ---- | — | — | XXXX |
| 8 | LONG | 0 | — | — | — | ---- | 4 | 1 | XXXX |
| 9 | LONG | 0 | — | — | — | ---- | 4 | 1 | XXXX |
| 10 | LONG | 0 | — | — | — | ---- | 0 | 0 | HLHL |
| 11 | LONG | 0 | — | — | — | ---- | 1 | 0 | LHLL |
| 12 | LONG | 0 | — | — | — | ---- | 2 | 0 | LLLL |
| 13 | LONG | 0 | — | — | — | ---- | 3 | 0 | HLLL |
| 14 | LONG | 0 | — | 0 | 1 | ---- | — | — | XXXX |
| 15 | LONG | 0 | 0 | 1 | 0 | 0100 | — | — | XXXX |
| 16 | LONG | 0 | — | 0 | 1 | ---- | — | — | XXXX |
| 17 | SHORT | 1 | — | — | — | ---- | — | — | XXXX |
| 18 | SHORT | 1 | — | — | — | ---- | — | — | XXXX |
| 19 | LONG | 0 | — | — | — | ---- | 4 | 1 | HLLL |
| 20 | LONG | 0 | — | — | — | ---- | 3 | 0 | HLHL |
| 21 | LONG | 0 | — | — | — | ---- | 4 | 1 | LLLL |
| 22 | LONG | 0 | 1 | 1 | 0 | 1000 | — | — | XXXX |
| 23 | LONG | 0 | — | 0 | 1 | ---- | — | — | XXXX |
| 24 | LONG | 0 | — | 0 | 1 | ---- | — | — | XXXX |
| 25 | SHORT | 1 | — | — | — | ---- | — | — | XXXX |
| 26 | SHORT | 1 | — | — | — | ---- | — | — | XXXX |
| 27 | LONG | 0 | — | — | — | — | 4 | 1 | LHHL |
| 28 | LONG | 0 | — | — | — | — | 1 | 0 | LLLH |
| 29 | LONG | 0 | — | — | — | — | 2 | 0 | LLHH |
| 30 | LONG | 0 | — | — | — | — | 4 | 1 | LLLL |
| 31 | LONG | 0 | — | 0 | 1 | ---- | — | — | XXXX |
| 32 | LONG | 0 | — | 0 | 1 | ---- | — | — | XXXX |
| 33 | SHORT | 1 | — | — | — | ---- | — | — | XXXX |
| 34 | SHORT | 1 | — | — | — | ---- | — | — | XXXX |
| 35 | LONG | 0 | — | — | — | — | 4 | 1 | LLLL |
| 36 | LONG | 0 | — | — | — | — | 4 | 1 | XXXX |

Fig. 63

INTERMIDIATE PATTERN B

| PN3 | PN2 | CYCLE | CL2 | iUSN | CL1a | CL3 | i_LB | oUSN | CL1b | O_LB |
|---|---|---|---|---|---|---|---|---|---|---|
| 0 | 0 | LONG | 0 | 0 | 1 | 0 | 0000 | — | — | XXXX |
| 1 | 1 | LONG | 0 | 1 | 1 | 0 | 0000 | — | — | XXXX |
| 2 | 2 | LONG | 0 | 2 | 1 | 0 | 1100 | — | — | XXXX |
| 3 | 3 | LONG | 0 | 3 | 1 | 0 | 1001 | — | — | XXXX |
| 4 | 4 | LONG | 0 | — | 0 | 1 | ---- | — | — | XXXX |
| 5 | 6 | SHORT | 1 | — | — | — | ---- | — | — | XXXX |
| 6 | 7 | SHORT | 1 | — | — | — | ---- | — | — | XXXX |
| 7 | 8 | LONG | 0 | — | — | — | ---- | 4 | 0 | XXXX |
| 8 | 9 | LONG | 0 | — | — | — | ---- | 4 | 1 | XXXX |
| 9 | 10 | LONG | 0 | — | — | — | ---- | 0 | 0 | HLHL |
| 10 | 11 | LONG | 0 | — | — | — | ---- | 1 | 0 | LHLL |
| 11 | 12 | LONG | 0 | — | — | — | ---- | 2 | 0 | LLLL |
| 12 | 13 | LONG | 0 | — | — | — | ---- | 3 | 0 | HLLL |
| 13 | 14 | LONG | 0 | — | 0 | 1 | ---- | — | — | XXXX |
| 14 | 15 | LONG | 0 | 0 | 1 | 0 | 0100 | — | — | XXXX |
| 15 | 17 | SHORT | 1 | — | — | — | ---- | — | — | XXXX |
| 16 | 18 | SHORT | 1 | — | — | — | ---- | — | — | XXXX |
| 17 | 19 | LONG | 0 | — | — | — | ---- | 4 | 0 | HLLL |
| 18 | 20 | LONG | 0 | — | — | — | ---- | 3 | 0 | HLHL |
| 19 | 21 | LONG | 0 | — | — | — | ---- | 4 | 1 | LLLL |
| 20 | 22 | LONG | 0 | 1 | 1 | 0 | 1000 | — | — | XXXX |
| 21 | 23 | LONG | 0 | — | 0 | 1 | ---- | — | — | XXXX |
| 22 | 25 | SHORT | 1 | — | — | — | ---- | — | — | XXXX |
| 23 | 26 | SHORT | 1 | — | — | — | ---- | — | — | XXXX |
| 24 | 27 | LONG | 0 | — | — | — | — | 4 | 0 | LHHL |
| 25 | 28 | LONG | 0 | — | — | — | — | 1 | 0 | LLLH |
| 26 | 29 | LONG | 0 | — | — | — | — | 2 | 0 | LLHH |
| 27 | 30 | LONG | 0 | — | — | — | — | 4 | 1 | LLLL |
| 28 | 31 | LONG | 0 | — | 0 | 1 | ---- | — | — | XXXX |
| 29 | 33 | SHORT | 1 | — | — | — | ---- | — | — | XXXX |
| 30 | 34 | SHORT | 1 | — | — | — | ---- | — | — | XXXX |
| 31 | 35 | LONG | 0 | — | — | — | — | 4 | 0 | LLLL |
| 32 | 36 | LONG | 0 | — | — | — | — | 4 | 1 | XXXX |

Fig. 64

EXTERNAL TERMINAL PATTERN

| PN4 | PN3 | CYCLE | CL2 | iUSN | CL1a | CL3 | i_LB | oUPS | CL1b | o_LB |
|---|---|---|---|---|---|---|---|---|---|---|
| 0 | 0 | LONG | 0 | 0 | 1 | 0 | 0000 | — | — | XXXX |
| 1 | 1 | LONG | 0 | 1 | 1 | 0 | 0000 | — | — | XXXX |
| 2 | 2 | LONG | 0 | 2 | 1 | 0 | 1100 | — | — | XXXX |
| 3 | 3 | LONG | 0 | 3 | 1 | 0 | 1001 | — | — | XXXX |
| 4 | 4 | LONG | 0 | — | 0 | 1 | —— | — | — | XXXX |
| 5 | 5 | SHORT | 1 | — | — | — | —— | — | — | XXXX |
| 6 | 6 | SHORT | 1 | — | — | — | —— | — | — | XXXX |
| 7 | 7 | LONG | 0 | — | — | — | —— | 4 | 0 | XXXX |
| 8 | 8 | LONG | 0 | — | — | — | —— | 4 | 1 | XXXX |
| 9 | 13, 9 | LONG | 0 | — | 0 | 1 | —— | 0 | 0 | HLHL |
| 10 | 14, 10 | LONG | 0 | 0 | 1 | 0 | 0100 | 1 | 0 | LHLL |
| 11 | 11 | LONG | 0 | — | — | — | —— | 2 | 0 | LLLL |
| 12 | 12 | LONG | 0 | — | — | — | —— | 3 | 0 | HLLL |
| 13 | 15 | SHORT | 1 | — | — | — | —— | — | — | XXXX |
| 14 | 16 | SHORT | 1 | — | — | — | —— | — | — | XXXX |
| 15 | 17 | LONG | 0 | — | — | — | —— | 4 | 0 | HLLL |
| 16 | 18 | LONG | 0 | — | — | — | —— | 3 | 0 | HLHL |
| 17 | 19 | LONG | 0 | — | — | — | —— | 4 | 1 | LLLL |
| 18 | 20 | LONG | 0 | 1 | 1 | 0 | 1000 | — | — | XXXX |
| 19 | 21 | LONG | 0 | — | 0 | 1 | —— | — | — | XXXX |
| 20 | 22 | SHORT | 1 | — | — | — | —— | — | — | XXXX |
| 21 | 23 | SHORT | 1 | — | — | — | —— | — | — | XXXX |
| 22 | 24 | LONG | 0 | — | — | — | — | 4 | 0 | LHHL |
| 23 | 25 | LONG | 0 | — | — | — | — | 1 | 0 | LLLH |
| 24 | 26 | LONG | 0 | — | — | — | — | 2 | 0 | LLHH |
| 25 | 27 | LONG | 0 | — | — | — | — | 4 | 1 | LLLL |
| 26 | 28 | LONG | 0 | — | 0 | 1 | —— | — | — | XXXX |
| 27 | 29 | SHORT | 1 | — | — | — | —— | — | — | XXXX |
| 28 | 30 | SHORT | 1 | — | — | — | —— | — | — | XXXX |
| 29 | 31 | LONG | 0 | — | — | — | — | 4 | 0 | LLLL |
| 30 | 32 | LONG | 0 | — | — | — | — | 4 | 1 | XXXX |

Fig. 65

| | USN | 3 | 2 | 1 | 0 | 3 | 2 | 1 | 0 |
|---|---|---|---|---|---|---|---|---|---|
| | LSN | 3210 | 3210 | 3210 | 3210 | 3210 | 3210 | 3210 | 3210 |
| PN1 | CL2 | DRIVE PATTERN | | | | VERIFICATION PATTERN | | | |
| 0 | 1 | pi03 | pi02 | pi01 | pi00 | po03 | po02 | po01 | po00 |
| 1 | 1 | pi13 | pi12 | pi11 | pi10 | po13 | po12 | po11 | po10 |
| 2 | 1 | pi23 | pi22 | pi21 | pi20 | po23 | po22 | po21 | po20 |
| 3 | 1 | pi33 | pi32 | pi31 | pi30 | po33 | po32 | po31 | po30 |
| 4 | 1 | pi43 | pi42 | pi41 | pi40 | po43 | po42 | po41 | po40 |
| 5 | 1 | pi53 | pi52 | pi51 | pi50 | po53 | po52 | po51 | po50 |
| 6 | 1 | pi63 | pi62 | pi61 | pi60 | po63 | po62 | po61 | po60 |
| 7 | 1 | pi73 | pi72 | pi71 | pi70 | po73 | po72 | po71 | po70 |

Fig. 69

| PNA1 | PGN | PN1 | USN | | | | | | | | |
|---|---|---|---|---|---|---|---|---|---|---|---|
| | | | LSN | 3 | 2 | 1 | 0 | 3 | 2 | 1 | 0 |
| | | | CL2 | 3210 | 3210 | 3210 | 3210 | 3210 | 3210 | 3210 | 3210 |
| | | | | DRIVE PATTERN | | | | VERIFICATION PATTERN | | | |
| 0 | 0 | 0 | 1 | pi03 | pi02 | pi01 | pi00 | po03 | po02 | po01 | po00 |
| 1 | 0 | 1 | 1 | pi13 | pi12 | pi11 | pi10 | po13 | po12 | po11 | po10 |
| 2 | 0 | 2 | 1 | pi23 | pi22 | pi21 | pi20 | po23 | po22 | po21 | po20 |
| 3 | 0 | 3 | 1 | pi33 | pi32 | pi31 | pi30 | po33 | po32 | po31 | po30 |
| 4 | 1 | 4 | 1 | pi43 | pi42 | pi41 | pi40 | po43 | po42 | po41 | po40 |
| 5 | 1 | 5 | 1 | pi53 | pi52 | pi51 | pi50 | po53 | po52 | po51 | po50 |
| 6 | 1 | 6 | 1 | pi63 | pi62 | pi61 | pi60 | po63 | po62 | po61 | po60 |
| 7 | 1 | 7 | 1 | pi73 | pi72 | pi71 | pi70 | po73 | po72 | po71 | po70 |

Fig. 70

| PNA1 [=PN1+OS] | PGN [=(PN1+OS)/(DP+1)] | PN1 | TARGET OF DELAY TEST (Launch→Capture) |
|---|---|---|---|
| 0 | 0 | 0 | — |
| 1 | 0 | 1 | PN1=0→PN1=1 |
| 2 | 0 | 2 | PN1=0→PN1=2, PN1=1→PN1=2 |
| 3 | 0 | 3 | PN1=0→PN1=3, PN1=1→PN1=3, PN1=2→PN1=3 |
| 4 | 1 | 4 | — |
| 5 | 1 | 5 | PN1=4→PN1=5 |
| 6 | 1 | 6 | PN1=4→PN1=6, PN1=5→PN1=6 |
| 7 | 1 | 7 | PN1=4→PN1=7, PN1=5→PN1=7, PN1=6→PN1=7 |

Fig. 71

| PNA1 | PGN | PN1 | USN | | | | | | | | | | | |
|---|---|---|---|---|---|---|---|---|---|---|---|---|---|---|
| | | | LSN | 3 | 2 | 1 | 0 | 3 | 2 | 1 | 0 | 3 | 2 | 1 | 0 |
| | | | CL2 | 3210 | 3210 | 3210 | 3210 | 3210 | 3210 | 3210 | 3210 | 3210 | 3210 | 3210 | 3210 |
| | | | | DRIVE PATTERN | | | | | | | | VERIFICATION PATTERN | | | |
| 0 | 0 | NONE | 1 | pi03 | pi02 | pi01 | pi00 | xxxx | xxxx | xxxx | xxxx | xxxx | xxxx | xxxx | xxxx |
| 1 | 0 | NONE | 1 | pi03 | pi02 | pi01 | pi00 | xxxx | xxxx | xxxx | xxxx | xxxx | xxxx | xxxx | xxxx |
| 2 | 0 | 0 | 1 | pi03 | pi02 | pi01 | pi00 | pi03 | pi02 | pi01 | pi00 | po03 | po02 | po01 | po00 |
| 3 | 0 | 1 | 1 | pi13 | pi12 | pi11 | pi10 | pi13 | pi12 | pi11 | pi10 | po13 | po12 | po11 | po10 |
| 4 | 1 | 2 | 1 | pi23 | pi22 | pi21 | pi20 | pi23 | pi22 | pi21 | pi20 | po23 | po22 | po21 | po20 |
| 5 | 1 | 3 | 1 | pi33 | pi32 | pi31 | pi30 | pi33 | pi32 | pi31 | pi30 | po33 | po32 | po31 | po30 |
| 6 | 1 | 4 | 1 | pi43 | pi42 | pi41 | pi40 | pi43 | pi42 | pi41 | pi40 | po43 | po42 | po41 | po40 |
| 7 | 1 | 5 | 1 | pi53 | pi52 | pi51 | pi50 | pi53 | pi52 | pi51 | pi50 | po53 | po52 | po51 | po50 |
| 8 | 2 | 6 | 1 | pi63 | pi62 | pi61 | pi60 | pi63 | pi62 | pi61 | pi60 | po63 | po62 | po61 | po60 |
| 9 | 2 | 7 | 1 | pi73 | pi72 | pi71 | pi70 | pi73 | pi72 | pi71 | pi70 | po73 | po72 | po71 | po70 |
| 10 | 2 | NONE | 1 | pi73 | pi72 | pi71 | pi70 | xxxx | xxxx | xxxx | xxxx | xxxx | xxxx | xxxx | xxxx |
| 11 | 2 | NONE | 1 | pi73 | pi72 | pi71 | pi70 | xxxx | xxxx | xxxx | xxxx | xxxx | xxxx | xxxx | xxxx |

Fig. 72

| PNA1 [=PN1+OS] | PGN [=(PN1+OS)/(DP+1)] | PN1 | TARGET OF DELAY TEST (LAUNCH→CAPTURE) |
|---|---|---|---|
| 0 | 0 | NONE | — |
| 1 | 0 | NONE | — |
| 2 | 0 | 0 | — |
| 3 | 0 | 1 | PN1=0→ PN1=1 |
| 4 | 1 | 2 | — |
| 5 | 1 | 3 | PN1=2→ PN1=3 |
| 6 | 1 | 4 | PN1=2→ PN1=4, PN1=3→ PN1=4 |
| 7 | 1 | 5 | PN1=2→ PN1=5, PN1=3→ PN1=5, PN1=4→ PN1=5 |
| 8 | 2 | 6 | — |
| 9 | 2 | 7 | PN1=6→ PN1=7 |
| 10 | 2 | NONE | — |
| 11 | 2 | NONE | — |

Fig. 73

TEST CIRCUIT, PATTERN GENERATING APPARATUS, AND PATTERN GENERATING METHOD

BACKGROUND OF THE INVENTION

1. Field of the Invention

The present invention relates to a test circuit, a pattern generating apparatus, and a pattern generating method.

2. Description of Related Art

In these years, as test target circuits are becoming increasingly higher in function, the data amount of internal signal patterns used to verify the operations of the circuits is increasing. The increase in the data amount of internal signal patterns causes the test process for semiconductor integrated circuits (such as LSIs (large scale integrated circuits)) to take a longer time, thus decreasing efficiency in the production of the semiconductor integrated circuits. Note that the internal signal pattern is a set of digital signals arranged in parallel and that the data amount of internal signal patterns is calculated by multiplying the number of rows of internal signal patterns (or the number of internal signal patterns) with the number of digital signals included in the internal signal pattern.

In order to efficiently input internal signal patterns into a test target circuit, i.e., a semiconductor integrated circuit, the semiconductor integrated circuit may be provided with a corresponding number of external terminals to the number of signals of the internal signal pattern, through which terminals internal signal patterns are sequentially input into the semiconductor integrated circuit. However, it is not realistic to provide a corresponding number of external test terminals to a very large number of signals of the internal signal pattern.

Here, the technique related to the reduction in the number of terminals described in the Japanese Unexamined Patent Application Publication No. 4-274547 (hereinafter called reference 1) will be described with reference to FIG. 74. In this reference, by transferring data sequentially over a plurality of times, the number of input/output pins of LSI circuits is reduced. A selector 120 selects data to be transferred based on a select signal. A selector 130 selects either the high-order bit group or the low-order bit group of the data selected by the selector 120. Then, the high-order bit group from the selector 130 is selected as a high-order bit group of a selector/register 170, and the low-order bit group from the selector 130 is selected as a low-order bit group of the selector/register 170.

In Japanese Patent Publication No. 3343734, a trace data compressing method to improve the efficiency in the use of a trace buffer is described.

By utilizing the technique described in reference 1, the number of terminals of a semiconductor integrated circuit can be reduced. However, the data amount of patterns (signal sets of digital signals arranged in parallel) to be input to and output from terminals of the semiconductor integrated circuit, in itself, does not change. That is, with the prior art, in itself the data amount of patterns to be input to and output from terminals of semiconductor integrated circuits cannot be reduced.

SUMMARY

In one embodiment, a test circuit connected between a test target circuit and a plurality of external terminals includes N first holding circuits to hold respectively N unit patterns produced by dividing an internal signal pattern to be input to or output from the test target circuit by N, where N is a natural number of two or greater, and a control circuit to make the internal signal pattern held in the N first holding circuits be changed selectively on a unit pattern basis based on a value of an identification signal assigned to each of the unit patterns beforehand, or to make the internal signal pattern held in the N first holding circuits be output selectively on a unit pattern basis based on the values of the identification signal.

In another embodiment, a pattern generating apparatus for generating terminal patterns to be input to or output from a test circuit connected between external terminals and a test target circuit from internal signal patterns to be input to or output from the test target circuit, includes a storage to store data in which an identification value common between a plurality of the internal signal patterns is assigned to each of N unit patterns produced by dividing each of a plurality of the internal signal patterns by N, where N is a natural number of two or greater, a detecting unit to detect a pattern change between unit patterns having a common identification value and contained in two consecutive internal signal patterns held in holding circuits included in a test circuit connected between the test target circuit and the external terminals, and a terminal pattern generator to generate the terminal patterns according to the detection results of the detecting unit.

In still another embodiment, a pattern generating method for generating terminal patterns to be input to or output from a test circuit connected between a test target circuit and external terminals from internal signal patterns to be input to or output from the test target circuit, includes the steps of storing data in which an identification value common between a plurality of the internal signal patterns is assigned to each of N unit patterns produced by dividing each of the plurality of the internal signal patterns by N, where N is a natural number of two or greater, detecting a pattern change between unit patterns having a common identification value and contained in two consecutive internal signal patterns held in holding circuits included in a test circuit connected between the test target circuit and the external terminals, and generating the terminal patterns according to the detection results of the detecting unit.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 3 is a diagram showing the assignment of identification numbers to internal signals;

FIG. 4 is a diagram showing internal signal patterns;

FIGS. 7A and 7B are diagrams for illustrating the creation of a change point detection table;

FIG. 9A is a diagram showing drive terminal patterns according to a first embodiment;

FIG. 9B is a diagram showing verification terminal patterns according to the first embodiment;

FIG. 12 is a diagram showing the assignment of identification numbers to internal signals;

FIG. 13 is a diagram showing internal signal patterns;

FIGS. 16A and 16B are diagrams for illustrating the creation of a change point detection table;

FIG. 18A is a diagram showing verification terminal patterns according to the second embodiment;

FIG. 18B is a diagram showing drive terminal patterns according to the second embodiment;

FIG. 20 is a diagram showing the assignment of identification numbers to internal signals;

FIG. 23A is a diagram showing verification terminal patterns according to the third embodiment;

FIG. 23B is a diagram showing drive terminal patterns according to the third embodiment;

FIG. 26 is a diagram showing a change point detection table for driving;

FIG. 27 is a diagram showing external terminal patterns according to the fourth embodiment;

FIG. 33 illustrates the assignment of identification numbers to internal signals according to the fifth embodiment;

FIG. 34 illustrates the assignment of identification numbers to internal signals according to the fifth embodiment;

FIG. 37 is a table showing internal signal patterns according to the fifth embodiment;

FIG. 38 is a table showing a relationship between pattern group numbers and the execution of delay tests according to the fifth embodiment;

FIG. 39 is a table showing drive patterns after pattern conversion according to the fifth embodiment;

FIG. 40 is a table showing verification terminal patterns according to the fifth embodiment;

FIG. 41 is a sequence table where the drive patterns and to-be-verified patterns are arranged in a sequence according to the fifth embodiment;

FIG. 43 is a table showing the intermediate patterns A according to the fifth embodiment;

FIG. 45 is a table showing the intermediate patterns B according to the fifth embodiment;

FIG. 47 is a table showing the external terminal patterns according to the fifth embodiment;

FIG. 55 is a table showing internal signal patterns according to the sixth embodiment;

FIG. 56 is a table showing a relationship between pattern group numbers and the execution of delay tests according to the sixth embodiment;

FIG. 57 is a change point detection table for drive patterns according to the sixth embodiment;

FIG. 58 is a table showing drive patterns after pattern conversion according to the sixth embodiment;

FIG. 59 is a change point detection table for to-be-verified patterns according to the sixth embodiment;

FIG. 60 is a table showing verification terminal patterns according to the sixth embodiment;

FIG. 63 is a table showing the intermediate patterns A according to the sixth embodiment;

FIG. 64 is a table showing the intermediate patterns B according to the sixth embodiment;

FIG. 65 is a table showing the external terminal patterns according to the sixth embodiment;

FIG. 69 is a table showing internal signal patterns according to the seventh embodiment;

FIG. 70 shows internal signal patterns for the case where OS=0 according to the seventh embodiment;

FIG. 71 is a table showing a relationship between pattern group numbers and the execution of delay tests for the case where OS=0 according to the seventh embodiment;

FIG. 72 shows internal signal patterns for the case where OS=2 according to the seventh embodiment;

FIG. 73 is a table showing a relationship between pattern group numbers and the execution of delay tests for the case where OS=2 according to the seventh embodiment.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
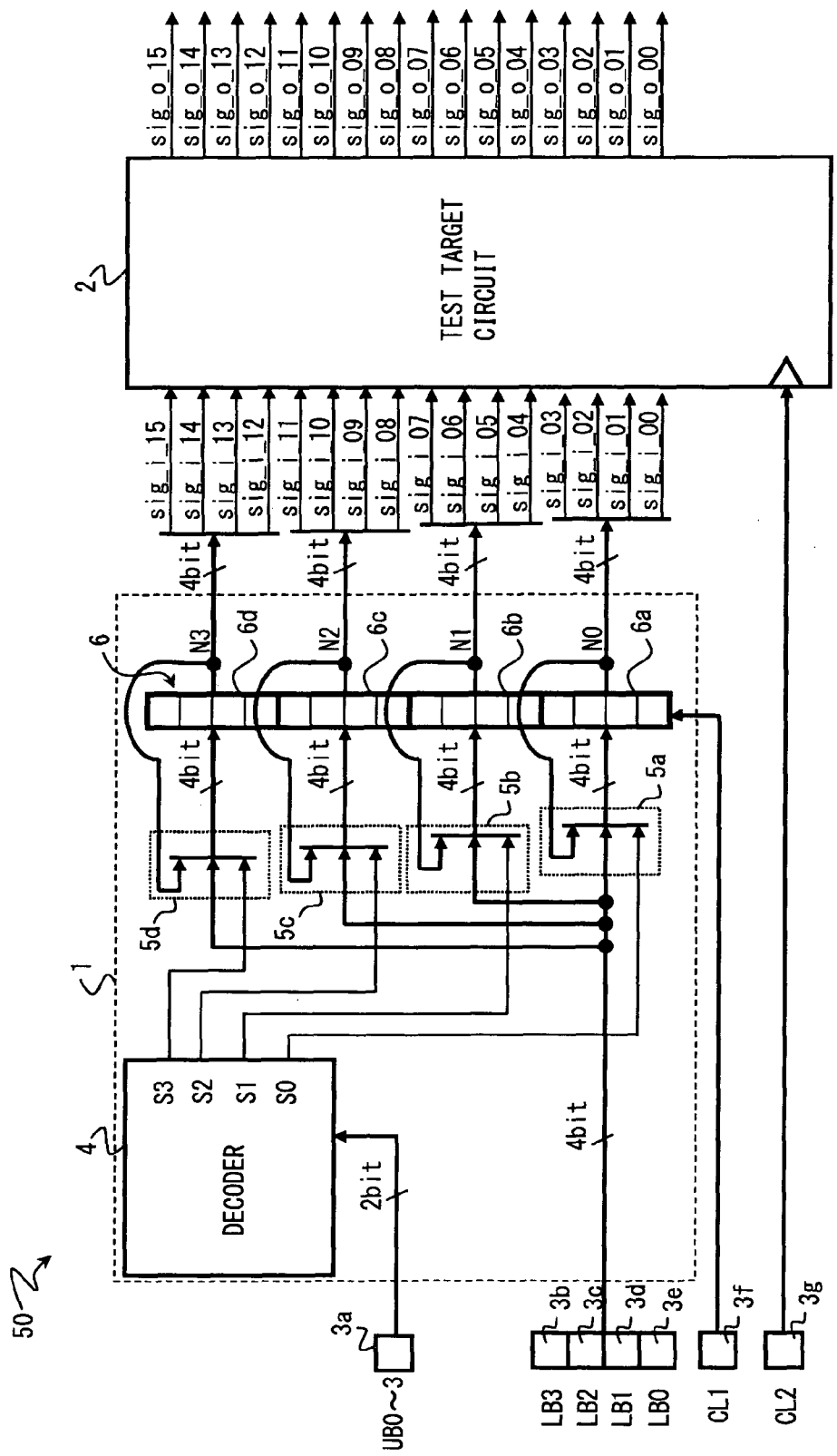
FIG. 1 is a schematic circuit diagram of a semiconductor integrated circuit 50.
Figure 2:
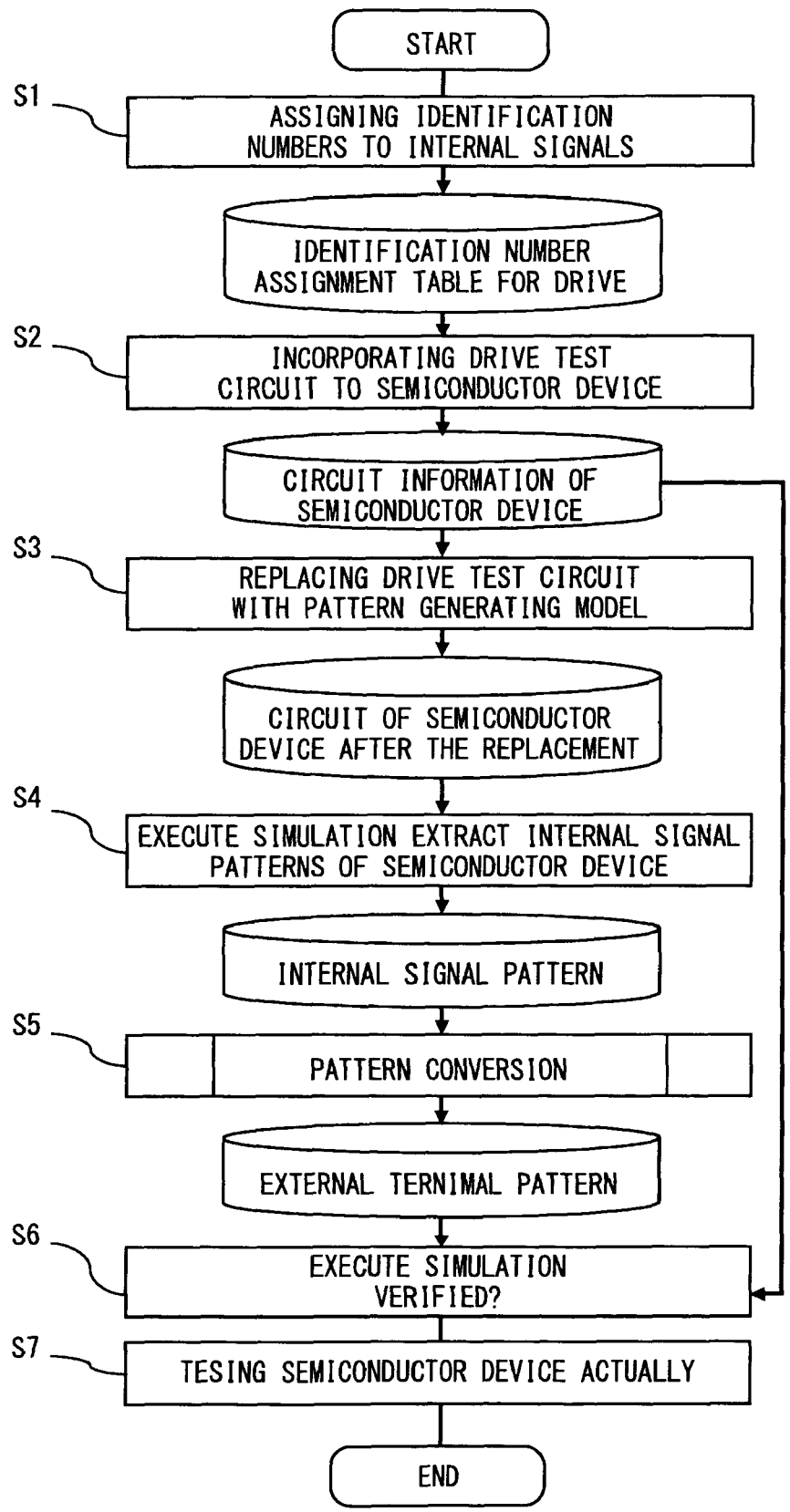
FIG. 2 is a flow chart for illustrating schematically a test method for the semiconductor integrated circuit 50.
Figure 5:
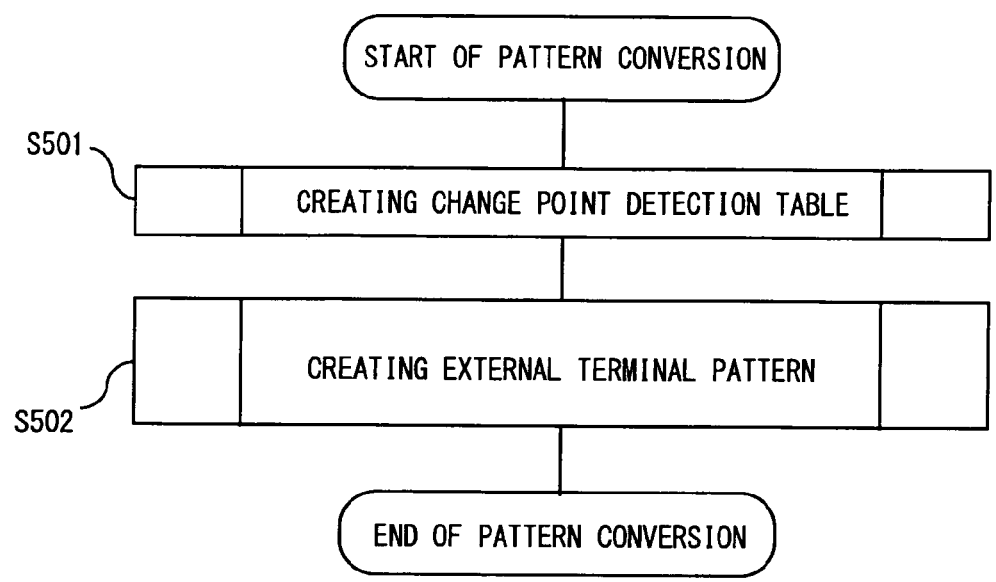
FIG. 5 is a flow chart showing the outline of pattern conversion.
Figure 6:
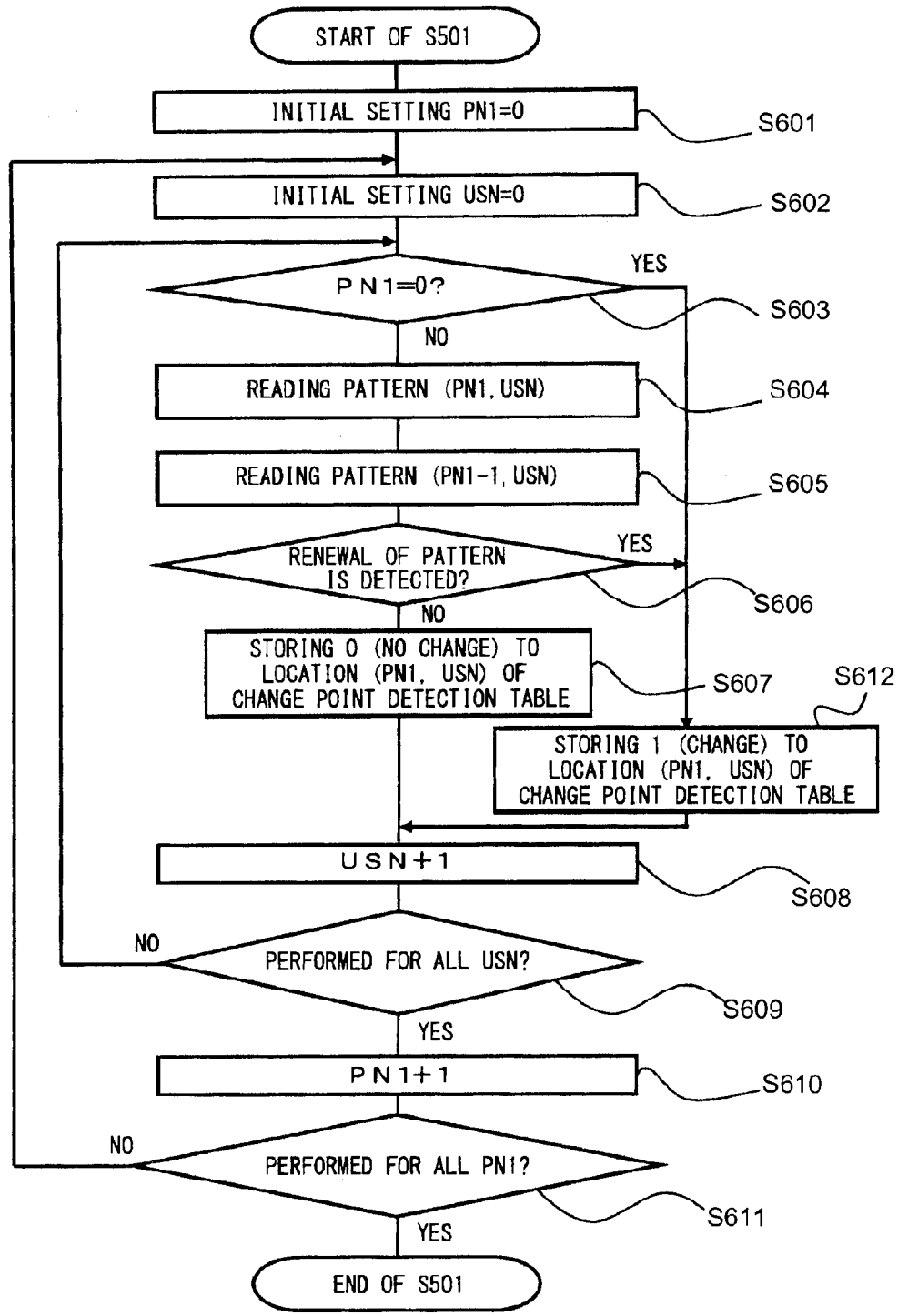
FIG. 6 is a detailed flow chart of S501.
Figure 8:
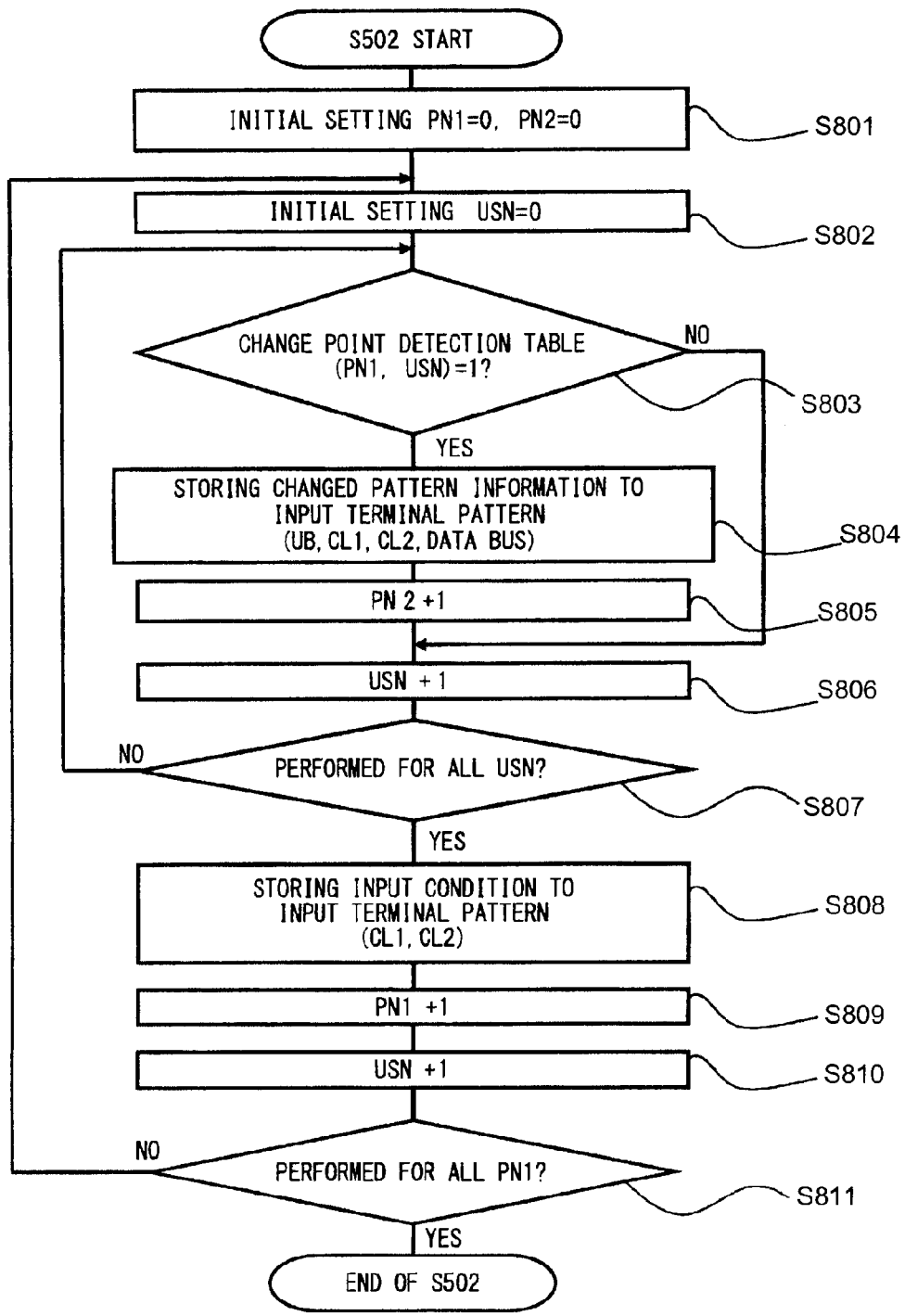
FIG. 8 is a detailed flow chart of S502.

A first embodiment of the present invention will be described below using FIGS. 1 to 9. FIG. 1 shows a schematic circuit diagram of a semiconductor integrated circuit (LSI) 50. FIG. 2 shows a flow chart for illustrating schematically a test method for the semiconductor integrated circuit 50. FIG. 3 shows the assignment of identification numbers to internal signals. FIG. 4 shows internal signal patterns. FIG. 5 is a flow chart showing the outline of pattern conversion. FIG. 6 shows a detailed flow chart of S501. FIGS. 7A and 7B are diagrams for illustrating the creation of a change point detection table. FIG. 8 shows a detailed flow chart of S502. FIG. 9A shows drive terminal patterns, and FIG. 9B shows verification terminal patterns.

As shown in FIG. 1, the semiconductor integrated circuit 50 comprises a drive test circuit (input side test circuit) 1, a test target circuit 2, and external terminals 3a to 3g (data terminals 3b to 3e, control terminals 3a, 3f, 3g) and further comprises 16 verification external terminals (not shown).

The drive test circuit 1 uses a 4-bit signal (a data bus signal for the drive test circuit 1) inputted from a tester (not shown) to the data terminals 3b to 3e so as to output a 16-bit internal signal pattern (a drive pattern) to the test target circuit 2. When the 16-bit drive pattern is inputted, the test target circuit 2 outputs a 16-bit signal (a to-be-verified pattern). As shown in FIG. 1, the 16-bit drive pattern inputted into the test target circuit 2 includes signals sig_i_00 to sig_i_15. The 16-bit to-be-verified pattern outputted from the test target circuit 2 includes signals sig_o_00 to sig_o_15.

The drive pattern, which is inputted into the test target circuit 2, is divided into four parts. In other words, the drive pattern has four unit patterns. That is, the drive pattern has a first unit pattern of sig_i_00 to sig_i_03, a second unit pattern of sig_i_04 to sig_i_07, a third unit pattern of sig_i_08 to sig_i_11, and a fourth unit pattern of sig_i_12 to sig_i_15.

The drive test circuit 1 comprises a decoder 4, selectors 5 (5a to 5d), and a holding circuit 6.

The holding circuit 6 is a 16-bit FF (flip-flop) and has 4-bit-divided holding circuits 6a to 6d. The holding circuit 6 outputs the 16-bit drive pattern to the test target circuit 2 based on CL1 input through the control terminal 3f. The 16-bit drive pattern outputted from the holding circuit 6 is inputted into an internal bus of the test target circuit 2.

The number of bits of the holding circuit 6 corresponds to the number of signals of the drive pattern. The number of divisions of the holding circuit 6 corresponds to the number of divisions of the drive pattern.

The selectors 5a to 5d are provided corresponding to the holding circuits 6a to 6d. First inputs of the selectors 5a to 5d are connected to the data terminals 3b to 3e (as a data bus). A second input of the selector 5a is connected to the output of the holding circuit 6a via node N0. A second input of the selector 5b is connected to the output of the holding circuit 6b via node N1. A second input of the selector 5c is connected to the output of the holding circuit 6c via node N2. A second input of the selector 5d is connected to the output of the holding circuit 6d via node N3. The control terminals of the selectors 5a to 5d are connected to the outputs S0 to S3 of the decoder 4. The selectors 5a to 5d output either the first inputs or the second inputs according to the select signals S0 to S3 from the decoder 4 respectively.

The decoder 4 is connected to the control terminals 3a. An identification signal of UB0 to UB3 (UB0, UB1, UB2, UB3) is inputted into the decoder 4 through the control terminals 3a. The decoder 4 outputs the select signals S0 to S3 to the selectors 5a to 5d based on the identification signal of UB0 to UB3.

The drive test circuit 1 of the present embodiment identifies a unit pattern to be changed of the drive pattern that is inputted into the test target circuit 2 based on the identification signal of UB0 to UB3. Then, the identified unit pattern is changed to a 4-bit unit pattern (LB0 to LB3) inputted to the data terminals 3b to 3e. By this means, it can be avoided to input the same unit pattern to the data terminals 3b to 3e in duplication. Thus, the data amount of patterns inputted to the data terminals 3b to 3e can be reduced. As a result, the test process becomes shorter in time and the data amount of signals stored externally can be reduced. The identification signal of UB0 to UB3 corresponds to an upper-level identification number (USN) described later, and the LB0 to LB3 corresponds to a lower-level identification number (LSN) described later.

The test target circuit 2 starts operating based on clock CL2 input through the control terminal 3g.

Next, a test method according to the present embodiment will be described with reference to FIG. 2.

First, identification numbers are assigned to internal signals (S1). That is, as shown in FIG. 1, a signal name is given to each internal signal. For the drive pattern, an internal signal assignment table shown in FIG. 3 is created. In FIG. 3, an identification number of two levels that are an upper level and a lower level is assigned to each internal signal. Each unit pattern after the division of the drive pattern is identified by the upper level of the identification number (an upper-level identification number (USN)). Each signal in a USN segment is identified by the lower level of the identification number (a lower-level identification number (LSN)). In other words, in step S1, the drive patterns to be inputted into the test target circuit 2 are divided to prepare unit patterns, which are associated with each other between the drive patterns.

Next, a drive test circuit is incorporated into the semiconductor integrated circuit 50 (S2). To be specific, as shown in the circuit diagram of FIG. 1, the drive test circuit 1 is incorporated into the semiconductor integrated circuit 50.

Next, the drive test circuit 1 is replaced with a pattern generation model (S3). To be specific, the input-to-output correspondence of the drive test circuit is invalidated, and the drive test circuit is replaced with a model to arbitrarily output drive patterns (internal signal patterns) to the test target circuit 2.

Next, a simulation is performed to extract internal signal patterns of the semiconductor integrated circuit 50 (S4). To be specific, as shown in FIG. 4, drive patterns (internal signal patterns) to the test target circuit 2 and verification patterns (internal signal patterns) from the test target circuit 2 are extracted.

The drive patterns are input into the test target circuit 2 in the order of their pattern numbers (PN1). That is, in the order of PN1=0 to 5, the drive patterns are input into the test target circuit 2. Also, the verification patterns are output from the test target circuit 2 in the order of their pattern numbers. That is, in the order of PN1=0 to 5, the verification patterns are output from the test target circuit 2.

Next, pattern conversion (S5) is performed. To be specific, a sequence of input signal patterns (drive terminal patterns) to the drive test circuit 1 is generated based on the drive patterns of PN1=0 to 5 inputted into the test target circuit 2. Note that the drive terminal pattern refers to a pattern inputted to the external terminals 3a to 3g of FIG. 1. By this step S5, the data amount of external signals inputted to the semiconductor integrated circuit 50 is greatly reduced. The step S5 will be described in detail later. Also, in the pattern conversion (S5), a sequence of patterns (verification terminal patterns) outputted from the semiconductor integrated circuit 50 is generated. By this way, relationships between the drive terminal patterns and the verification terminal patterns for the semiconductor integrated circuit 50 become clear.

Next, a simulation is performed to confirm the result of verification (S6). To be specific, it is confirmed whether predetermined terminal patterns are outputted from the semiconductor integrated circuit 50 in response to the drive terminal patterns inputted thereto.

Then, at S6, on the premise that the result of verification was correct, manufactured semiconductor integrated circuits 50 are tested actually (S7). To be specific, an operation test is performed on manufactured individual semiconductor integrated circuits 50 using a tester.

In this way, the test of the semiconductor integrated circuit 50 is performed.

The above pattern conversion (S5) will be described specifically with reference to FIGS. 5 to 9B. Note that as described above, the drive patterns have been divided at the step S1 preceding the pattern conversion (S5).

As shown in FIG. 5, first, the change point detection table is created (S501). Then, external terminal patterns are created (S502).

The S501 of FIG. 5 will be described specifically below with reference to FIGS. 6, 7A and 7B. FIG. 6 is a detailed flow chart of S501. FIGS. 7A and 7B are diagrams for illustrating the creation of the change point detection table.

In S501, viewing FIG. 7A from front, it is determined whether unit patterns above/below each other are the same in each USN (upper-level identification number) segment. The determination results are written into the change point detection table of FIG. 7B. Here, the process starts from the drive pattern of PN1=0 and the signals of USN=0.

As shown in FIG. 6, a drive pattern is set as one to be processed S601. Here, as mentioned above, the drive pattern of PN1=0 is specified as a drive pattern to be processed S601.

Next, a unit pattern included in the specified drive pattern is specified S602. Here, as mentioned above, the unit pattern of USN=0 is specified as a unit pattern to be processed S602.

Next, it is determined whether PN1=0 (S3).

If PN1=0, the process proceeds to S612, where 1 is stored into the location designated by coordinates (PN1, USN) in the change point detection table shown in FIG. 7B S612.

If PN1≠0, the process proceeds to S604, where the unit pattern designated by coordinates (PN1, USN) in FIG. 7A is read S604. For example, if PN1=2 and USN=0, the unit pattern to be read is "0100" designated by coordinates (2, 0).

Next, the unit pattern designated by coordinates (PN1−1, USN) in the table of FIG. 7A is read S605. For example, if PN1=2 and USN=0 as above, the unit pattern to be read is "0000" designated by coordinates (1, 0).

Then, it is determined whether the unit pattern read at S604 differs from the unit pattern read at S605 S606. In other words, it is determined whether there is a change in unit pattern. Needless to say, S605 may be executed before S604.

If there is a change in unit pattern, the process proceeds to S612, where 1 is stored into the location designated by coordinates (PN1, USN) in the change point detection table shown in FIG. 7B S612 as above.

If there is no change in unit pattern, the process proceeds to S607, where 0 is stored into the location designated by coordinates (PN1, USN) in the change point detection table shown in FIG. 7B S607.

After S607 and S612, 1 is added to the value of USN S608. That is, the selection of a USN to be processed is shifted to the left as viewing FIG. 7A from front.

Next, it is determined whether the above process has been performed for all values of USN S609. Here, because the drive pattern has been divided into four parts, the maximum value of USN is 3. Hence, it is determined whether USN=3 S609.

If the above process has not been performed for all values of USN (i.e., USN≠3), the process returns to the above S603.

If the above process has been performed for all values of USN (i.e., USN=3), the process proceeds to S610, where 1 is added to the value of PN1 S610.

That is, the selection of a drive pattern to be processed is shifted downward as viewing the table of FIG. 7A from front.

Next, it is determined whether the process has been performed for all values of PN1 S611.

If the process has not been performed for all values of PN1, the process returns to S602. If the process has been performed for all values of PN1, the process of S501 finishes. In this way, the change point detection table of FIG. 7B is created.

As apparent from the flow chart of FIG. 6, if PN1=0, the process proceeds from S603 to S612. Thus, "1111" is always stored in the first row of FIG. 7B. For PN1=1 and the subsequent PN values, the process proceeds from S603 to S604, and hence 1 or 0 is stored into the second and subsequent rows of FIG. 7B depending on the result of determination at S606.

Supplemental description will be made with reference to FIGS. 7A and 7B.

As shown in FIG. 7A, the drive pattern of PN1=1 matches the drive pattern of PN1=0. In other words, the drive pattern of PN1=1 has no unit pattern changed as compared to the drive pattern of PN1=0. Hence, "0000" is set in the second row of the change point detection table of FIG. 7B.

As shown in FIG. 7A, in the drive pattern of PN1=2, the unit pattern of USN=0 is a changed one while the other unit patterns of USN=1 to 3 are unchanged as compared to the drive pattern of PN1=1. In other words, the drive pattern of PN1=2 has the unit pattern of USN=0 changed as compared to the drive pattern of PN1=1. Hence, "0001" is set in the third row of the change point detection table of FIG. 7B.

As shown in FIG. 7A, in the drive pattern of PN1=3, the unit pattern of USN=1 is a changed one while the other unit patterns of USN=0, 2, 3 are unchanged as compared to the drive pattern of PN1=2. In other words, the drive pattern of PN1=3 has the unit pattern of USN=1 changed as compared to the drive pattern of PN1=2. Hence, "0010" is set in the fourth row of the change point detection table of FIG. 7B.

The same description as for the drive pattern of PN1=1 applies to the drive patterns of PN1=4 and PN1=5. In this way, the change point detection table of FIG. 7B is created from the drive patterns of FIG. 7A. Note that the creation of the change point detection table is achieved by a computer executing a program.

Here, S502 of FIG. 5 will be described using FIGS. 8, 9A, and 9B (with reference to FIGS. 7A and 7B as well, as needed). The process of S502 creates external terminal patterns shown in FIGS. 9A and 9B (drive terminal patterns of FIG. 9A and verification terminal patterns of FIG. 9B) as final results. For the drive terminal patterns of FIG. 9A, a new pattern number (PN2) is set. Likewise, also for the verification terminal patterns of FIG. 9B, a new pattern number is set.

As shown in FIG. 8, first, PN1 and PN2 are set to 0 S801. Here the process starts from the pattern of PN1=0 as in S501.

Next, USN is set to 0 S802. Here the process starts from the unit pattern of USN=0 as in S501.

Then, it is determined whether S606 of FIG. 6 determined that a change in pattern exists, based on whether the value designated by coordinates (PN1, USN) in the change point detection table shown in FIG. 7B is at 1 S803.

If a change in pattern exists, information of the changed pattern is stored into the drive terminal pattern of FIG. 9A S804. That is, the current USN value is stored into the UB of the drive terminal pattern of FIG. 9A, and the unit pattern designated by coordinates (PN1, USN) in FIG. 7A is stored into the data bus of FIG. 9A. Further, the CL1 of FIG. 9A is set to 1, and the CL2 is set to 0.

The UB corresponds to the USN and is input to the control terminals 3a of FIG. 1. The data bus corresponds to the LSN in the USN segment and is input as signals LB0 to LB3 to the data terminals 3b to 3e. The CL1 is input to the control terminal 3f, and the CL2 is input to the control terminal 3g.

Next, 1 is added to the value of PN2 S805.

Next, 1 is added to the value of USN S806.

If at S803 it is determined that a change in pattern does not exist, the above S804 is not executed, but S806 is executed after S803. By this means, a duplicate unit pattern is prevented from being input to the data bus of the drive test circuit 1.

Then, it is determined whether the process has been performed for all values of USN S807. Here, it is checked whether USN=3. If USN is not equal to 3, the process returns to the above S803. If USN=3, the process proceeds to S808.

At S808, conditions for inputting the drive pattern that is set in the holding circuit 6 into the test target circuit 2 are stored into the drive terminal pattern. That is, the CL1 is set to 0, and the CL2 is set to the value of the CL 2 in FIG. 4 specified by the current PN1. Here, the USN is set to "–" and the data bus is set to "–", where "–" means that whether it is 0 or 1 makes no difference.

Next, 1 is added to the value of PN1 S809.

Next, 1 is added to the value of USN S810.

Then, it is checked whether the process has been performed for all values of PN1 S811. If the process has been performed for all values of PN1, step S502 finishes. If the process has not been performed for all values of PN1, the process returns to S2. In this way, the drive terminal patterns (FIG. 9A) are created.

As shown in FIG. 7B, the first row (row of PN1=0) of the change point detection table is all at 1. Hence, for the drive pattern of PN1=0, S804 of FIG. 8 is executed for all values of USN. Thus, four unit patterns are sequentially stored in the data bus for PN2=0 to 3 in FIG. 9A.

As shown in FIG. 7B, the second row (row of PN1=1) of the change point detection table is all at 0. That is, the drive pattern of PN1=1 is completely the same as the drive pattern of PN1=0. Thus, for the drive pattern of PN1=1 in FIG. 9A, the CL1 being set to 0 and the CL2 being set to 1, and a unit pattern need not be stored.

As shown in FIG. 7B, the third row (row of PN1=2) of the change point detection table is at 0001. Hence, for the drive pattern of PN1=2, S804 of FIG. 8 is executed for the unit pattern of USN=0. In other words, the unit pattern of USN=0 of the drive pattern of PN1=1 needs to be changed to obtain the drive pattern of PN1=2. Hence, a unit pattern is stored into the data bus of PN2=6 in FIG. 9A.

As shown in FIG. 7B, the fourth row (row of PN1=3) of the change point detection table is at 0010. Hence, for the drive pattern of PN1=3, S804 of FIG. 8 is executed for the unit pattern of USN=1. In other words, the unit pattern of USN=1 of the drive pattern of PN1=2 needs to be changed to obtain the drive pattern of PN1=3. Hence, a unit pattern is stored into the data bus of PN2=8 in FIG. 9A.

The same description as for the above second row applies to the fifth and sixth rows of the change point detection table in FIGS. 7A and 7B.

In the present embodiment, the drive pattern (internal signal pattern) is divided into a plurality of unit patterns according to USN segmentation. For each USN segment, it is determined whether a change in unit pattern exists between consecutive drive patterns, and a changed unit pattern is stored into the drive terminal pattern without storing the unchanged unit patterns into the drive terminal pattern. By this means, unchanged unit patterns need not be input into the drive test circuit 1, and hence the number of unit patterns to be input into the semiconductor integrated circuit 50 can be greatly reduced.

In other words, in the present embodiment the drive pattern is divided into a plurality of unit patterns. It is determined whether a change in corresponding unit patterns exists between consecutive drive patterns, and while changing only the unit patterns that need to be changed, the drive patterns are sequentially input into the test target circuit 2. Therefore, the data amount of external patterns inputted into the semiconductor integrated circuit 50 can be greatly reduced. As a result, the test process becomes shorter in time and the data amount stored externally can be reduced.

Note that corresponding to the creation of the patterns of FIG. 9A, the verification terminal patterns of FIG. 9B are also created. That is, the external terminal patterns including the drive terminal patterns and the verification terminal patterns are created. By this means, relationships between the drive terminal patterns and the verification terminal patterns (expected values) become clear. Then, the process proceeds to S6 of FIG. 2, where the simulation is executed as described above to determine whether verification is proper. That is, it is confirmed whether the to-be-verified terminal patterns actually output from the test target circuit 2 are the same as expected values.

Second Embodiment

Figure 10:
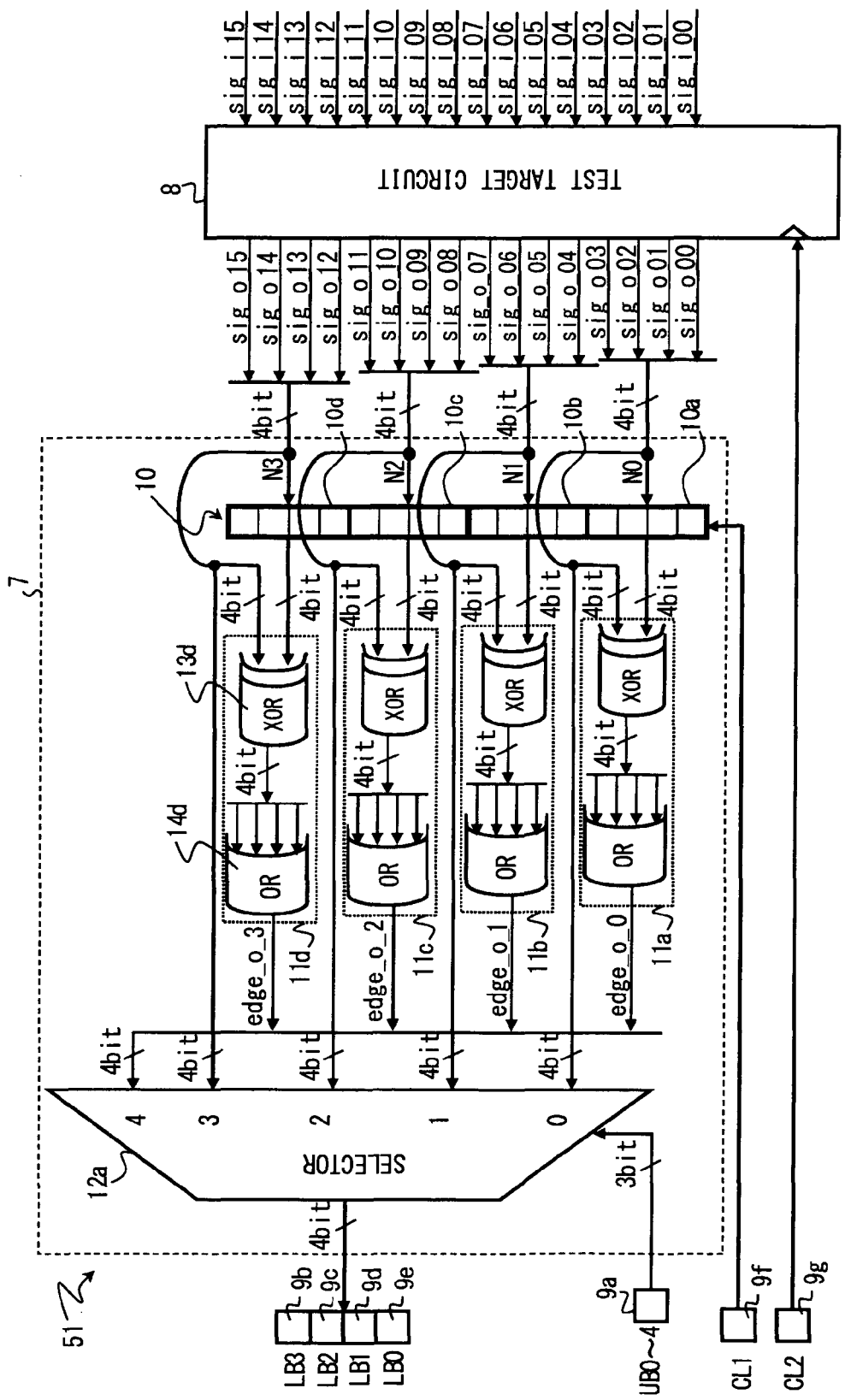
FIG. 10 is a schematic circuit diagram of a semiconductor integrated circuit 51 according to a second embodiment.
Figure 11:
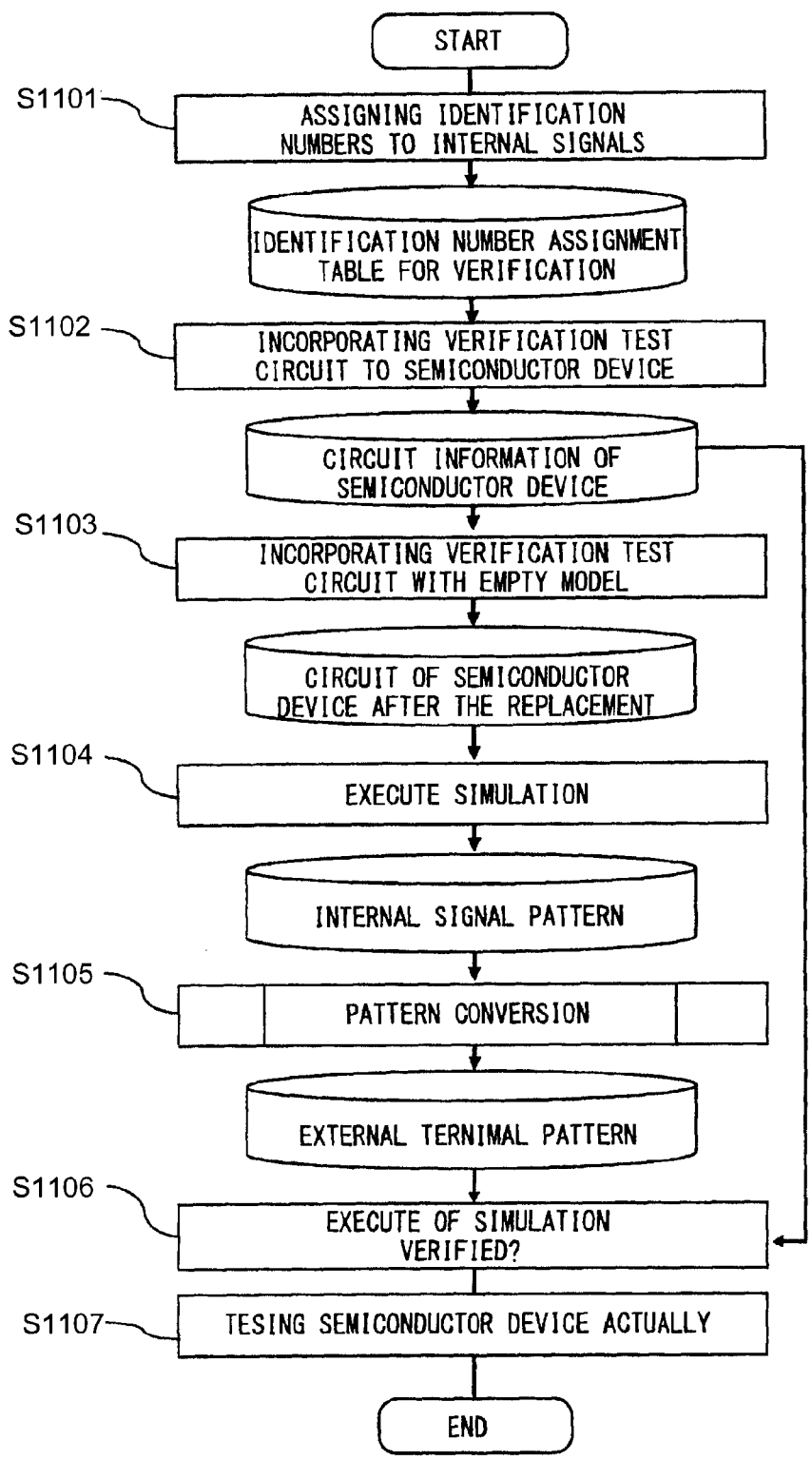
FIG. 11 is a flow chart for illustrating schematically a test method for the semiconductor integrated circuit 51.
Figure 14:
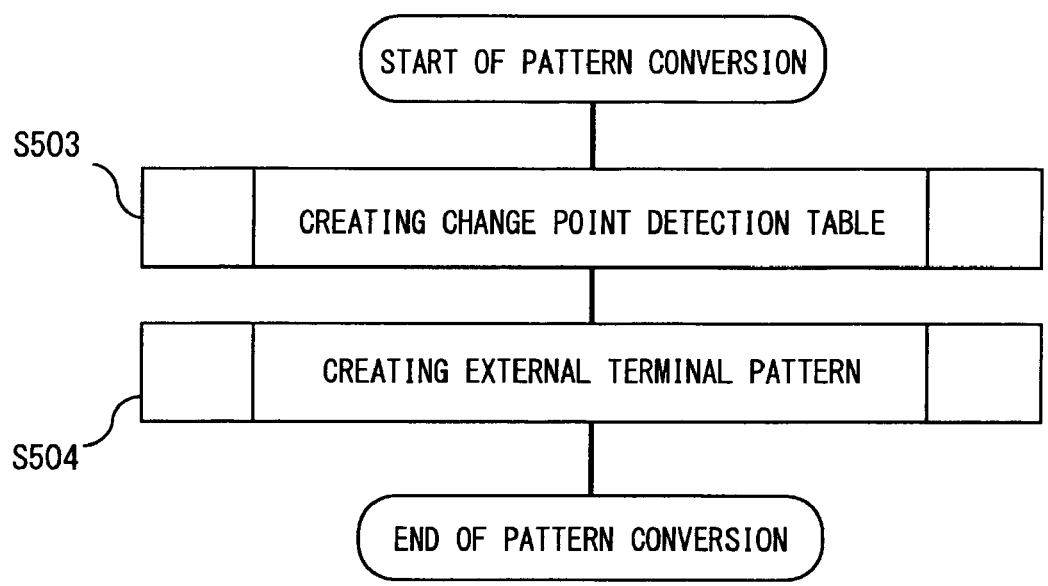
FIG. 14 is a flow chart showing the outline of pattern conversion.
Figure 15:
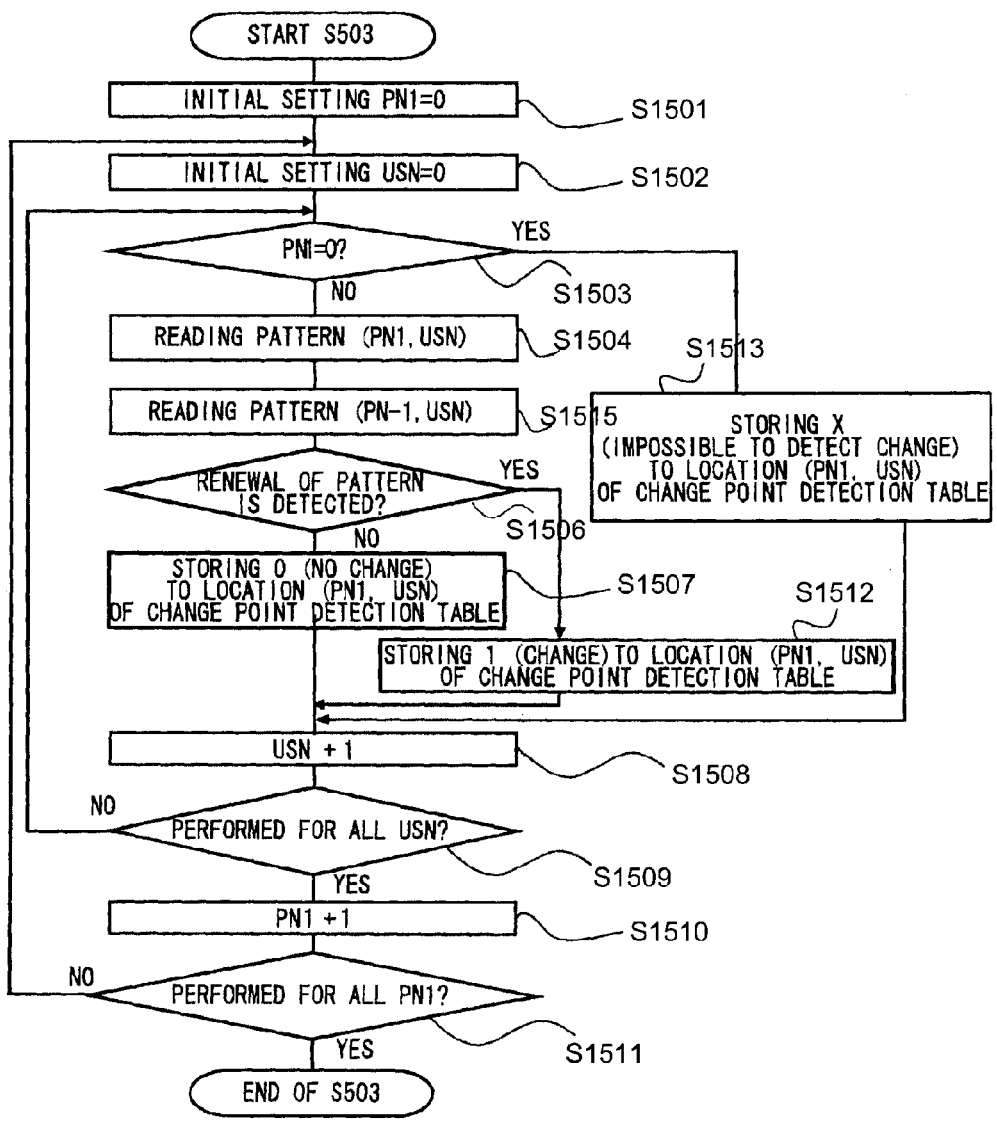
FIG. 15 is a detailed flow chart of S503 of FIG. 14.
Figure 17:
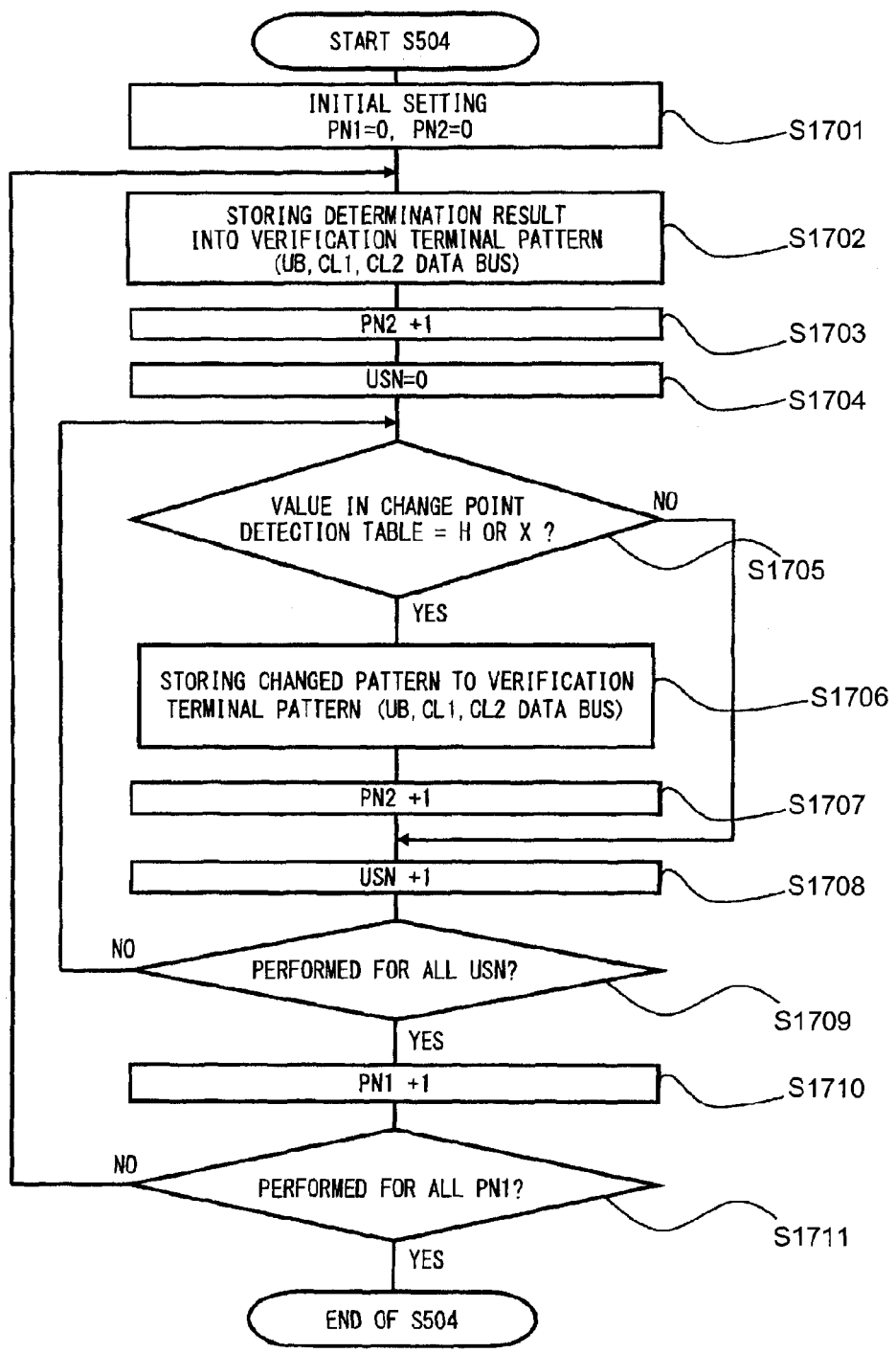
FIG. 17 is a detailed flow chart of S504 of FIG. 14.

A second embodiment will be described below with reference to FIGS. 10 to 18A and 18B. FIG. 10 shows a schematic circuit diagram of a semiconductor integrated circuit (LSI) 51. FIG. 11 shows a flow chart for illustrating schematically a test method for the semiconductor integrated circuit 51. FIG. 12 shows the assignment of identification numbers to internal signals. FIG. 13 shows internal signal patterns. FIG. 14 is a flow chart showing the outline of pattern conversion. FIG. 15 shows a detailed flow chart of S503 of FIG. 14. FIGS. 16A and 16B are diagrams for illustrating the creation of a change point detection table. FIG. 17 shows a detailed flow chart of S504 of FIG. 14. FIG. 18A shows verification terminal patterns, and FIG. 18B shows drive terminal patterns.

As shown in FIG. 10, the semiconductor integrated circuit 51 comprises a verification test circuit (output side test circuit) 7, a test target circuit 8, and external terminals 9a to 9g (data terminals 9b to 9e, control terminals 9a, 9f, 9g) and further comprises 16 drive external terminals (not shown).

The verification test circuit 7 selectively outputs unit patterns which is produced by dividing a to-be-verified pattern outputted from the test target circuit 8, according to an upper-level identification signal (UB) inputted from a tester (not shown) to the control terminals 9a. When the 16-bit drive pattern is inputted, the test target circuit 8 outputs a 16-bit to-be-verified pattern to the verification test circuit 7. As shown in FIG. 10, the 16-bit drive pattern inputted into the test target circuit 8 includes signals sig_i_00 to sig_i_15. The 16-bit to-be-verified pattern outputted from the test target circuit 8 includes signals sig_o_00 to sig_o_15.

The to-be-verified pattern outputted from the test target circuit 8 is divided into four parts. In other words, the to-be-verified pattern has four unit patterns. That is, the to-be-verified pattern has a first unit pattern (sig_o_00 to sig_o_03), a second unit pattern (sig_o_04 to sig_o_07), a third unit pattern (sig_o_08 to sig_o_11), and a fourth unit pattern (sig_o_12 to sig_o_15).

The verification test circuit 7 comprises a holding circuit 10, determining circuits 11 (11a to 11d), and a selector 12a.

The holding circuit 10 is a 16-bit FF (flip-flop) and has 4-bit-divided holding circuits 10a to 10d. The holding circuit 10 holds the 16-bit signal outputted from the test target circuit 8 according to an input CL1 through the control terminal 9f.

There is a node N0 in between the holding circuit 10a and the test target circuit 8. There is a node N1 in between the holding circuit 10b and the test target circuit 8. There is a node N2 in between the holding circuit 10c and the test target circuit 8. There is a node N3 in between the holding circuit 10d and the test target circuit 8. The number of bits of the holding circuit 10 corresponds to the number of bits of the to-be-verified pattern. The number of divisions of the holding circuit 10 corresponds to the number of divisions of the to-be-verified pattern.

The selector 12a has inputs 0 to 4. The inputs 0 to 3 of the selector 12a are connected to the nodes N0 to N3. The input 4 of the selector 12a is connected to the outputs of the determining circuits 11a to 11d. The outputs of the selector 12a are connected to the data terminals 9b to 9e (as a data bus). The selector 12a outputs one of the inputs 0 to 4 according to the identification signal of UB0 to UB4 (UB0, UB1, UB2, UB3, UB4) inputted through the control terminals 9a.

The determining circuits 11a to 11d are provided corresponding to the holding circuits 10a to 10d. The first inputs of the determining circuits 11a to 11d are connected to the nodes N0 to N3. The second inputs of the determining circuits 11a to 11d are connected to the outputs of the holding circuits 10a to 10d. The outputs of the determining circuits 11a to 11d are connected to the input 4 of the selector 12a.

The determining circuits 11a to 11d determine whether the unit patterns previously held in the holding circuits 10a to 10d are the same as the unit patterns newly outputted from the test target circuit 8 to the holding circuits 10a to 10d. The determining circuits 11a to 11d each output a zero when being the same and a one when not the same, and the determination results of the determining circuits 11a to 11d are inputted as a 4-bit signal (a determination pattern) to the input 4 of the selector 12a.

As shown in FIG. 10, the determining circuit 11d comprises an XOR circuit 13d and an OR circuit 14d. The XOR circuit 13d determines whether the unit pattern held in the holding circuit 10d is the same as the unit pattern outputted from the test target circuit 8 to the holding circuit 10d and if there is a change in pattern, outputs a one (a high level) to the OR circuit 14d. Then, when any of four bits of the 4-bit signal inputted from the XOR circuit 13d is at one, the OR circuit 14d outputs a one, which indicates that there is a change in pattern. Note that the XOR circuit 13d actually includes four XOR circuits. The same description as for the determining circuit 11d applies to the other determining circuits 11a to 11c.

As apparent from FIG. 10, the output signal name of the determining circuit 11a is edge_o_0. The output signal name of the determining circuit 11b is edge_o_1. The output signal name of the determining circuit 11c is edge_o_2. The output signal name of the determining circuit 11d is edge_o_3.

As apparent from the above description, the output signal edge_o_0 changes from 0 to 1 when any of the internal signals sig_o_00 to sig_o_03 changes. Likewise, the output signal edge_o_1 changes from 0 to 1 when any of the internal signals sig_o_04 to sig_o_07 changes. The output signal edge_o_2 changes from 0 to 1 when any of the internal signals sig_o_08 to sig_o_11 changes. The output signal edge_o_3 changes from 0 to 1 when any of the internal signals sig_o_12 to sig_o_15 changes.

The test target circuit 8 starts operating based on clock CL2 input through the control terminal 9g.

The verification test circuit 7 of the present embodiment selectively outputs the unit pattern specified by the inputted identification signal of UB0 to UB4 out of the to-be-verified pattern. In this way, duplicate unit patterns can be prevented from being output from the verification test circuit 7. As a result, the test process becomes shorter in time. Further, the number of verification unit patterns stored externally can be greatly reduced. The identification signal of UB0 to UB4 corresponds to the upper-level identification number (USN) described later, and the LB0 to LB3 corresponds to the lower-level identification number (LSN) described later.

Next, a test method according to the present embodiment will be described with reference to FIG. 11.

First, identification numbers are assigned to internal signals S1101. That is, as shown in FIG. 10, a signal name is given to each internal signal. For the verification pattern, an internal signal assignment table shown in FIG. 12 is created. In FIG. 12, an identification number of two levels that are an upper level and a lower level is assigned to each internal signal. The upper level (values 0-3) of the identification number (an upper-level identification number (USN)) identifies each unit pattern after the division of the verification pattern. USN of 4 identifies the 4-bit determination signal (determination pattern) from the determining circuits 11. The lower level of the identification number (a lower-level identification number (LSN)) identifies each individual signal in a USN segment. Also in the present embodiment, at step S1101, the verification patterns for the test target circuit 8 are divided.

Next, a verification test circuit is incorporated into the semiconductor integrated circuit 51 S1102. To be specific, as shown in the circuit diagram of FIG. 10, the verification test circuit 7 is incorporated into the semiconductor integrated circuit 51.

Next, the verification test circuit 7 is replaced with an empty model S1103. To be specific, the input-to-output correspondence of the verification test circuit is invalidated.

Next, a simulation is performed to extract internal signal patterns of the semiconductor integrated circuit 51 S1104. To be specific, as shown in FIG. 13, drive patterns to the test target circuit 8 and verification patterns from the test target circuit 8 are extracted. Here, internal signal patterns (drive patterns and verification patterns) are the same as in the first embodiment.

The drive patterns are input into the test target circuit 8 in the order of their pattern numbers (PN1). That is, the drive patterns of PN1=0 to PN1=5 are input in that order into the test target circuit 8. Also, it is expected that the verification patterns are output from the test target circuit 8 in the order of their pattern numbers (PN1). That is, it is expected that the verification patterns of PN1=0 to PN1=5 are output in that order from the test target circuit 8.

Next, pattern conversion S1105 is performed. To be specific, a sequence of input/output signal patterns (verification terminal patterns) to/from the verification test circuit 7 is generated based on the verification patterns of PN1=0 to 5 for the test target circuit 8. Note that the verification terminal pattern refers to a pattern input/output to/from the external terminals 9a to 9g of FIG. 10. By this step S1105, the data amount of signals output from the semiconductor integrated circuit 51 to the outside is greatly reduced. The step S1105 will be described in detail later. Also, in the pattern conversion S1105, a sequence of patterns (drive terminal patterns) inputted into the semiconductor integrated circuit 51 is generated. By this means, relationships between the drive terminal patterns and the verification terminal patterns for the semiconductor integrated circuit 51 become clear.

Next, a simulation is executed to confirm whether the verification is proper S1106. To be specific, it is confirmed whether predetermined terminal patterns are outputted from the semiconductor integrated circuit 51, in response to the drive terminal patterns inputted.

Then, at S1106, on the premise that the verification was proper, manufactured semiconductor integrated circuits 51 are tested actually S1107. To be specific, an operation test is performed on manufactured individual semiconductor integrated circuits 51 using a tester.

In this way, the test of the semiconductor integrated circuit 51 is performed.

The pattern conversion S1105 of FIG. 11 will be described specifically with reference to FIGS. 14 to 18. Note that the verification patterns have been divided at the step S1101 preceding the pattern conversion S1105.

As shown in FIG. 14, first, the change point detection table is created (S503). Then, external terminal patterns are created (S504).

The S503 of FIG. 14 will be described specifically below with reference to FIGS. 15, 16A and 16B. FIG. 15 is a detailed flow chart of S503. FIGS. 16A and 16B are diagrams for illustrating the creation of the change point detection table.

In S503, viewing FIG. 16A from front, it is determined whether unit patterns above/below each other are the same in each USN segment. The determination results are written into the change point detection table of FIG. 16B. Here, the process starts from the verification pattern of PN1=0 and the signals of USN=0.

As shown in FIG. 15, a verification pattern is set as one to be processed S1501. Here, as mentioned above, the verification pattern of PN1=0 is to be processed S1501.

Next, a unit pattern included in the specified verification pattern is specified S1502. Here, as mentioned above, the unit pattern of USN=0 is specified as a unit pattern to be processed S1502.

Next, it is determined whether PN1=0 S1503.

If PN1=0, the process proceeds to S1513, where X (meaning that whether a change exists cannot be determined) is stored into the location designated by coordinates (PN1, USN) in the change point detection table shown in FIG. 16B S1513.

If PN1≠0, the process proceeds to S1504, where the unit pattern designated by coordinates (PN1, USN) in the table of FIG. 16A is read S1504. For example, if PN1=1 and USN=3, the unit pattern to be read is "HLHL" designated by coordinates (1, 3).

Next, the unit pattern designated by coordinates (PN1−1, USN) in the table of FIG. 16A is read S1505. For example, if PN1=1 and USN=3 as above, the unit pattern to be read is "HLLL" designated by coordinates (0, 3).

Then, it is determined whether the unit pattern read at S1504 differs from the unit pattern read at S1505 S1506. In other words, it is determined whether there is a change in unit pattern. Note that S1505 may be executed before S1504.

If there is a change in unit pattern, the process proceeds to S1512, where H is stored into the location designated by coordinates (PN1, USN) in the change point detection table shown in FIG. 16B as above S1512.

If there is no change in unit pattern, the process proceeds to S1507, where L is stored into the location designated by coordinates (PN1, USN) in the change point detection table shown in FIG. 16B S1507.

After S1507 and S1512, 1 is added to the value of USN S1508. That is, the selection of a USN to be processed is shifted to the left as viewing FIG. 16A from front.

Next, it is determined whether the above process has been performed for all values of USN except USN of 4, which identifies the determination signal S1509. Here, the maximum value of USN is 3 when USN of 4 is excluded. Hence, it is determined whether USN=3 S1509.

If the above process has not been performed for all values of USN except USN of 4 (i.e., USN≠3), the process returns to the above S1503.

If the above process has been performed for all values of USN except USN of 4 (i.e., USN=3), the process proceeds to S1510, where 1 is added to the value of PN1 S1510.

That is, the selection of a verification pattern to be processed is shifted downward as viewing the table of FIG. 16A from front.

Next, it is determined whether the process has been performed for all values of PN1 S1511.

If the process has not been performed for all values of PN1, the process returns to S1502. If the process has been performed for all values of PN1, the process of S503 finishes.

As apparent from the flow chart of FIG. 15, if PN1=0, the process always proceeds from S1503 to S1513. Thus, "XXXX" is always stored in the first column in the change point detection table of FIG. 16B. For PN1=1 and the subsequent PN values, the process proceeds from S1503 to S1504, and hence H or L is stored into the second and subsequent rows of FIG. 16B depending on the result of determination at S1506.

Supplemental description will be made with reference to FIGS. 16A and 16B.

As shown in FIG. 16A, in the verification pattern of PN1=1, the unit pattern of USN=3 is a changed one while the other unit patterns of USN=0 to 2 are unchanged as compared to the verification pattern of PN1=0. In other words, the verification pattern of PN1=1 has the unit pattern of USN=3 changed as compared to the verification pattern of PN1=0. Hence, "HLLL" is set in the second row of the change point detection table of FIG. 16B.

As shown in FIG. 16A, the verification pattern of PN1=2 matches the verification pattern of PN1=1 in any unit pattern. In other words, the verification pattern of PN1=2 has no unit pattern changed as compared to the verification pattern of PN1=1. Hence, "LLLL" is set in the third row of the change point detection table of FIG. 16B.

As shown in FIG. 16A, in the verification pattern of PN1=3, the unit patterns of USN=1 and USN=2 are changed ones while the other unit patterns of USN=0, 3 are unchanged as compared to the verification pattern of PN1=2. In other words, the verification pattern of PN1=3 has the unit patterns of USN=1 and USN=2 changed as compared to the verification pattern of PN1=2. Hence, "LHHL" is set in the fourth row of the change point detection table of FIG. 16B.

The same description as for the verification pattern of PN1=2 applies to the verification patterns of PN1=4 and PN1=5. In this way, the change point detection table of FIG. 16B is created from the verification patterns of FIG. 16A. Note that this creation is achieved by a computer executing a program.

Next, S504 of FIG. 14 will be described with reference to FIGS. 17, 18A and 18B (with reference to FIGS. 16A and 16B as well, as needed). The process of S504 creates external terminal patterns (verification terminal patterns of FIG. 18A and drive terminal patterns of FIGS. 18B) as final results. Note that in FIGS. 18A and 18B, a new pattern number (PN2) is set.

As shown in FIG. 17, first, PN1 and PN2 are set to 0 S1701. Here the process starts from the pattern of PN1=0 as in S503.

Then, the determination pattern is stored into the verification terminal pattern S1702. To be specific, the UB is set to 4, the CL1 is set to 1, and the CL2 is set to the value of the CL2 of the internal signal pattern (FIG. 13). The determination pattern specified by the current value of PN1 is obtained from the change point detection table (FIG. 16B) and stored into the data bus. This determination pattern corresponds to the 4-bit signal outputted from the determining circuits 11 of FIG. 10.

Next, 1 is added to the value of PN2 S1703, and the USN is set to 0 S1704.

Then, it is determined whether or not the value in the location designated by coordinates (PN1, USN) in the change point detection table of FIG. 16B is H or X S1705. In other words, it is determined whether it was found at S1506 of FIG. 15 that a change in pattern exists. If the value designated by coordinates (PN1, USN) in the change point detection table is H or X, then the process proceeds to S1706.

At S1706, based on the determination result of S1705, information of the changed pattern is stored into the verification terminal pattern. That is, the current USN value is stored into the UB of the verification terminal pattern of FIG. 18A, and the unit pattern designated by coordinates (PN1, USN) in FIG. 16A is stored into the data bus of FIG. 18A. Further, the CL1 of FIG. 18A is set to 0, and the CL2 is set to 0.

Next, 1 is added to the value of PN2 S1707.

Next, 1 is added to the value of USN S1708.

Then, it is determined whether the process has been performed for all values of USN S1709. If not, the process returns to the above S1705. If so, the process proceeds to S1710.

At S1710, 1 is added to the value of PN1.

Then, it is checked whether the process has been performed for all values of PN1 S1711. If so, step S504 finishes. If not, the process returns to S1702. In this way, the verification terminal patterns (FIG. 18A) are created.

As shown in FIG. 16B, the first row (row of PN1=0) of the change point detection table is all at X. Thus, for the verification pattern of PN1=0, S1706 of FIG. 17 is executed for all values of USN. Thus, four unit patterns of USN=0 to 3 are stored in the data bus for PN2=1 to 4 in FIG. 18A.

As shown in FIG. 16B, the second row (row of PN1=1) of the change point detection table is at HLLL. Thus, for the verification pattern of PN1=1, S1706 of FIG. 17 is executed for only USN=3. In other words, only the unit pattern of USN=3 of the verification pattern of PN1=0 is changed to obtain the verification pattern of PN1=1. Thus, only the unit pattern of USN=3 is stored in the data bus for PN2=6 in FIG. 18A.

As shown in FIG. 16B, the third row (row of PN1=2) of the change point detection table is all at L. Hence, for the verification pattern of PN1=2, S1706 of FIG. 17 is not executed for any value of USN. Hence, none of the unit patterns of USN=0 to 3 is stored in FIG. 18A.

As shown in FIG. 16B, the fourth row (row of PN1=3) of the change point detection table is at LHHL. Hence, for the verification pattern of PN1=3, S1706 of FIG. 17 is executed for the unit patterns of USN=1 and USN=2. In other words, the unit patterns of USN=1 and USN=2 of the verification pattern of PN1=2 are changed to obtain the verification pattern of PN1=3. Hence, the unit patterns of USN=1 and USN=2 are stored into the data bus for PN2=9, 10 in FIG. 18A.

The same description as for the third row applies to the fifth row (row of PN1=4) and the sixth row (row of PN1=5) of the change point detection table in FIG. 16B.

As apparent from the verification terminal patterns of FIG. 18A, for any verification pattern except the one of PN1=0, a determination pattern is output. That is, for each verification pattern, a determination pattern, for which UB=4, is stored in the verification terminal pattern table. By making information about unit-pattern change be outputted in this way, it becomes unnecessary to output duplicate unit patterns through the output terminals at any cost. Thus, the test circuit can be set such that changed unit patterns are selectively output through the output terminals. Therefore, the data amount of for-use-in-test signals output from the semiconductor integrated circuit 51 is greatly reduced. As a result, the time required for the test process becomes shorter, and the data amount of for-use-in-test signals stored externally can be greatly reduced.

In the present embodiment, in this way, verification patterns for the test target circuit 8 are converted into verification terminal patterns.

Note that when the patterns of FIG. 18A are created, the drive terminal patterns of FIG. 18B are also created. By this means, relationships between the drive terminal patterns and the verification terminal patterns (expected values) become clear. Then, the process proceeds to S1106 of FIG. 11, where the simulation is executed as described above to determine whether verification is proper. That is, it is confirmed whether the determination patterns and unit patterns output from the data terminals 9b to 9e of the verification test circuit 7 are the same as expected values.

As apparent from the above description, in the present embodiment, the verification pattern is divided into a plurality of unit patterns according to USN segmentation. A unit pattern specified by USN in the verification pattern is selectively output, and together with it, a determination pattern from the determining circuits 11 is also output. In other words, unchanged unit patterns are made to be not output from the verification test circuit 7. Therefore, the number of patterns that are stored in a tester can be greatly reduced. Further, because determination patterns of the determining circuits 11 are output from the selector 12a, additional external terminals need not be provided to output determination patterns.

Third Embodiment

A third embodiment will be described below using FIGS. 19 to 23B. The present embodiment differs from the second embodiment in that external terminals for outputting determination patterns are provided. Here only this different point will be described without duplicating the same description as in the second embodiment. In the present embodiment, the same effects as in the second embodiment can be obtained as well as an effect due to the above-mentioned different point.

Figure 19:
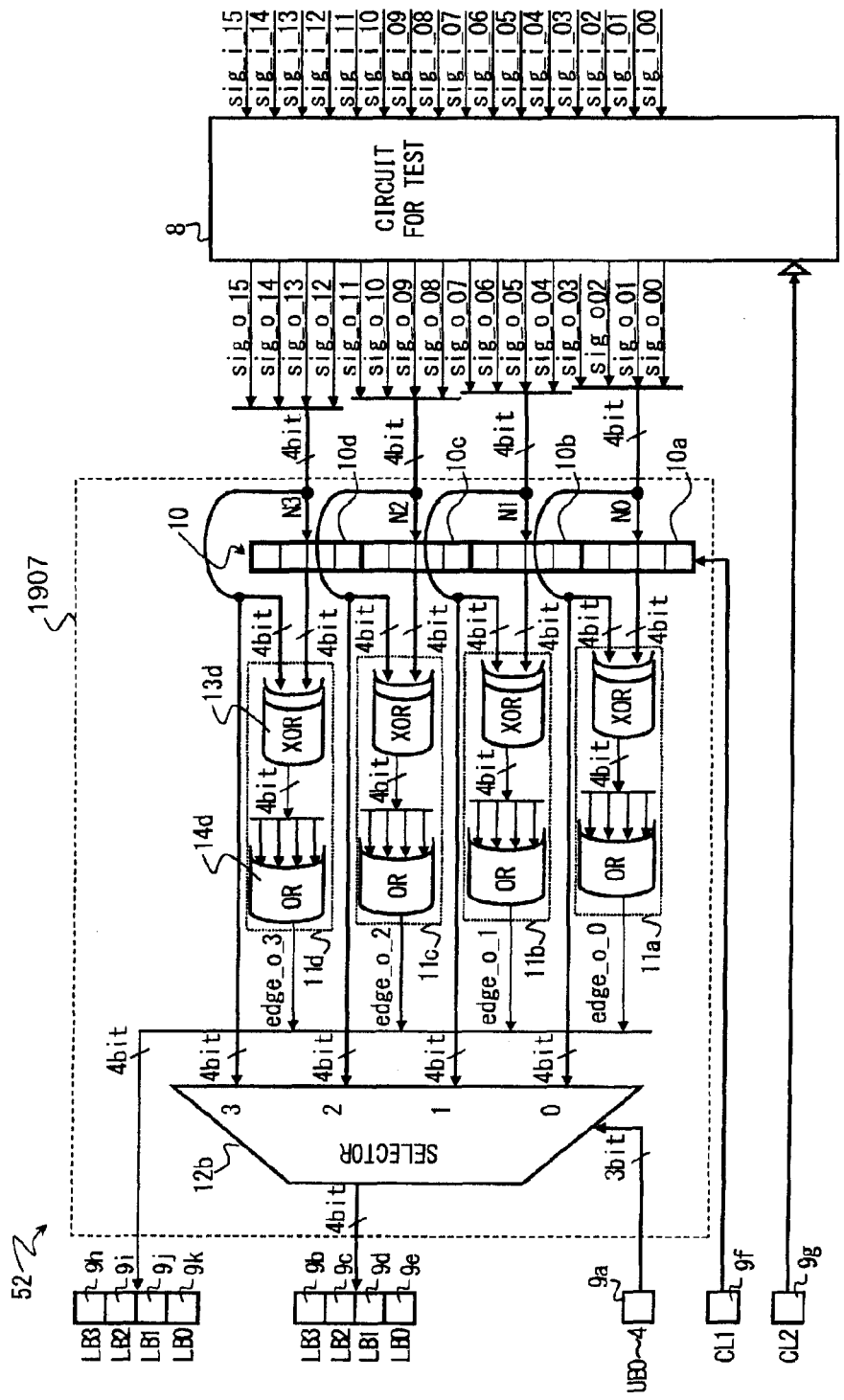
FIG. 19 is a schematic circuit diagram of a semiconductor integrated circuit 52 according to a third embodiment.
Figure 21:
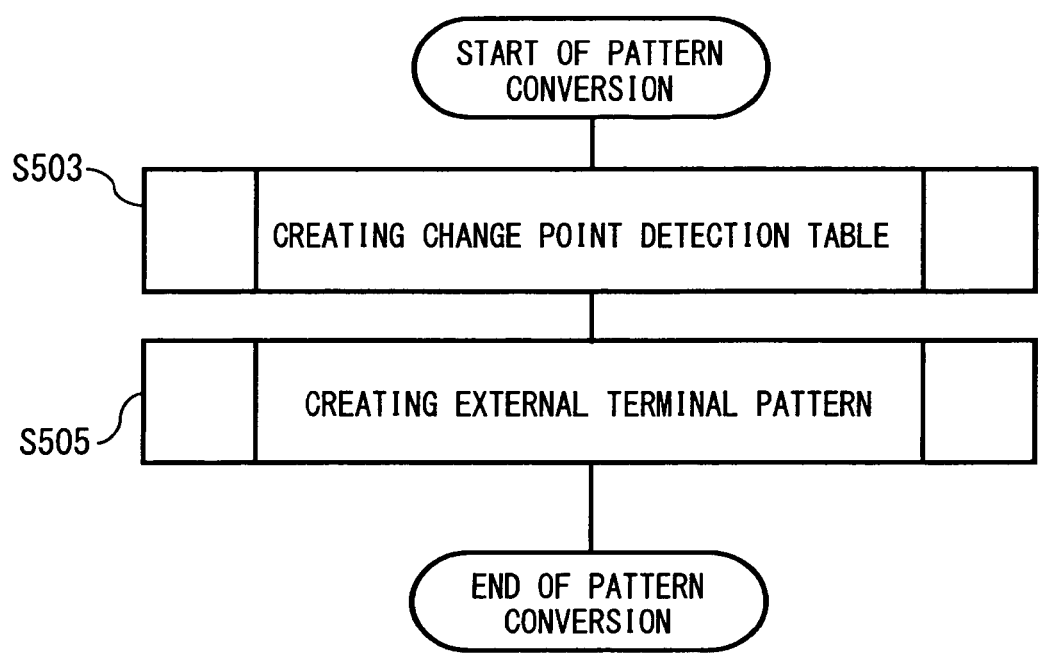
FIG. 21 is a flow chart of pattern conversion.
Figure 22:
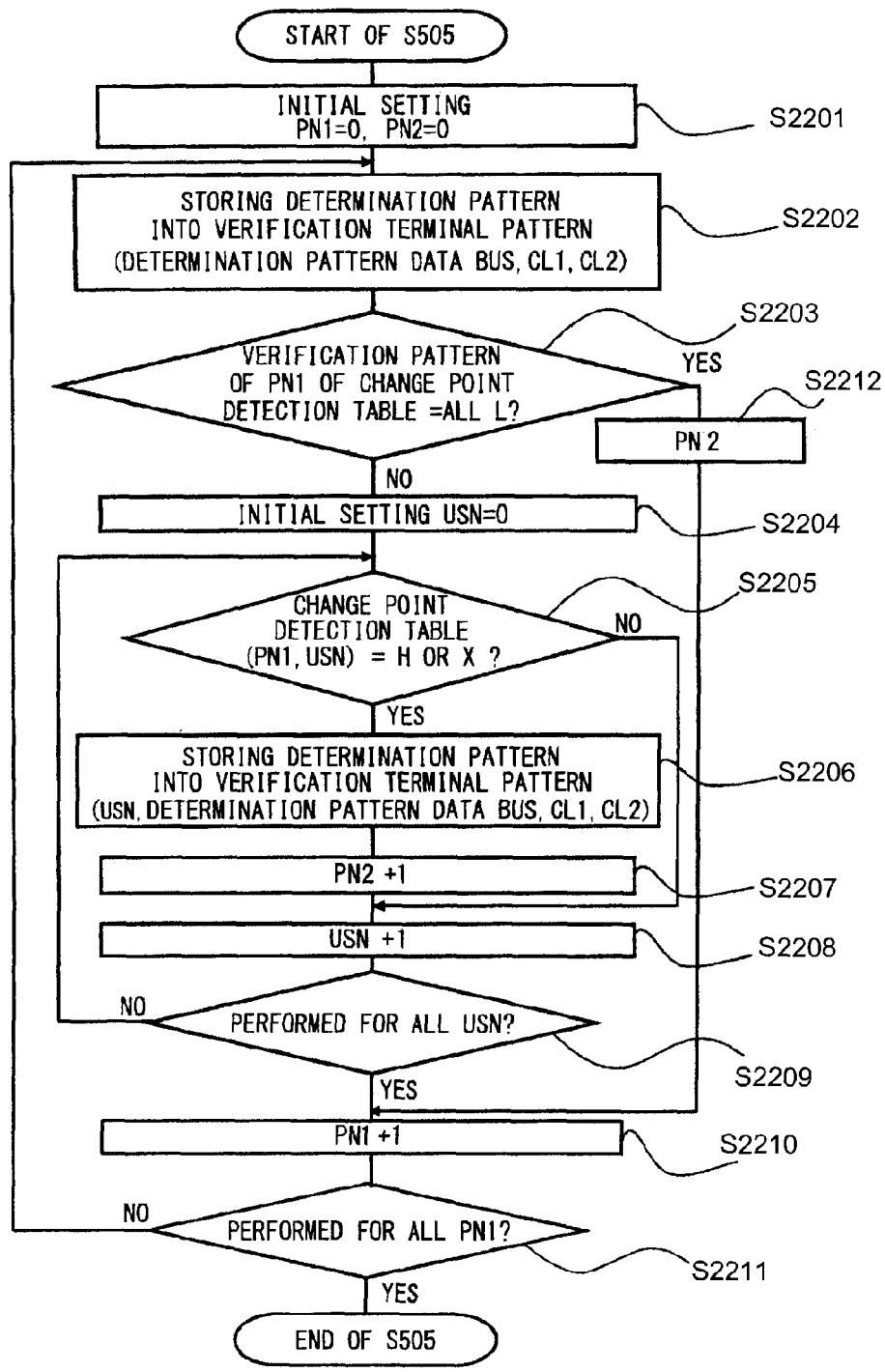
FIG. 22 is a detailed flow chart of S505.

FIG. 19 shows a schematic circuit diagram of a semiconductor integrated circuit (LSI) 52. FIG. 20 shows the assignment of identification numbers to internal signals. FIG. 21 is a flow chart of pattern conversion in the present embodiment. FIG. 22 shows a detailed flow chart of S505. FIG. 23A shows verification terminal patterns, and FIG. 23B shows drive terminal patterns.

As shown in FIG. 19, the semiconductor integrated circuit 52 has data terminals 9*h* to 9*k* for outputting determination patterns and has verification test circuit 1907. The 4-bit determination pattern, output signals edge_o_0 to edge_o_3, of the determining circuits 11*a* to 11*d* are output through the data terminals 9*h* to 9*k*.

As shown in FIG. 20, identification numbers are not assigned to the output signals edge_o_0 to edge_o_3 of the determining circuits 11. This is because the determination patterns of the determining circuits 11 are not subject to the selective output by the selector 12*b*.

In the present embodiment, according to the procedure shown in FIG. 21, pattern conversion is performed. First, the change point detection table is created as in the second embodiment (S503). Then, external terminal patterns are created (S505). The step S505 is different from that of the second embodiment.

The S505 will be described using FIGS. 22, 23A, 23B. As apparent from the description of S503 in the second embodiment, at the start of S505, the change point detection table (the same as in FIG. 16B) has already been created. The description below will be made with reference to FIGS. 11, 13, 16A, and 16B of the second embodiment as well, as needed.

As shown in FIG. 22, first, PN1 is set to 0 and PN2 is set to 0 S2201.

Then, the determination pattern is stored into the verification terminal pattern S2202. To be specific, the 4-bit value (USN=0 to 3) specified by PN1 in the change point detection table (FIG. 16B) is stored into a determination pattern data bus of FIG. 23A. Further, the CL1 of FIG. 23A is set to 1, and the CL2 of FIG. 23A is set to the value of the CL2 specified by the current value of PN1 in FIG. 13.

Next, it is determined whether the signals specified by PN1 in the change point detection table are all at L S2203. That is, comparing the verification pattern of the preceding PN1 value and the verification pattern of the current PN1 value, it is determined whether a change in pattern exists. In other words, for each verification pattern, it is determined whether a change in pattern exists. If not, 1 is added to the value of PN2 S2212, and the process proceeds to S2210.

If a change in pattern exists, the value of USN in FIG. 23A is initially set to 0 S2204.

Then, it is determined whether the value in the location designated by coordinates (PN1, USN) in the change point detection table is H S2205. That is, for each unit pattern, it is determined whether a change in pattern exists.

If a change in pattern exists, the changed pattern is stored into the verification terminal pattern S2206. That is, the current USN value is stored into the UB in FIG. 23A, and the unit pattern designated by coordinates (PN1, USN) in FIG. 16A is stored into the unit pattern data bus. Further, the CL1 is set to 0, and the CL2 is set to 0.

Next, 1 is added to the value of PN2 S2207.

Next, 1 is added to the value of USN S2208.

Then, it is determined whether the process has been performed for all values of USN S2209. If not, the process returns to S2205. If the process has been performed for all values of USN, the process proceeds to S2210.

Next, 1 is added to the value of PN1 S2210.

Then, it is determined whether the process has been performed for all values of PN1 S2211. If not, the process returns to S2202. If the process has been performed for all values of PN1, step S505 finishes.

As shown in FIG. 16B, the first row (row of PN1=0) of the change point detection table is all at X. Thus, for the verification pattern of PN1=0, S6 of FIG. 22 is executed for all values of USN. Thus, four unit patterns of USN=0 to 3 for PN1=0 are stored in the unit pattern data bus for PN2=0 to 3 in FIG. 23A.

As shown in FIG. 16B, the second row (row of PN1=1) of the change point detection table is at HLLL. Thus, for the verification pattern of PN1=1, S6 of FIG. 22 is executed for USN=3. In other words, only the unit pattern of USN=3 of the verification pattern of PN1=0 is changed to obtain the verification pattern of PN1=1. Thus, only the unit pattern of USN=3 included in the verification pattern of PN1=1 is stored in the unit pattern data bus for PN2=4 in FIG. 23A.

As shown in FIG. 16B, the third row (row of PN1=2) of the change point detection table is all at L. Hence, for the verification pattern of PN1=2, S2206 of FIG. 22 is not executed for any value of USN. Hence, none of the unit patterns of USN=0 to 3 included in the verification pattern of PN1=2 is stored in FIG. 23A.

As shown in FIG. 16B, the fourth row (row of PN1=3) of the change point detection table is at LHHL. Hence, for the verification pattern of PN1=3, S2206 of FIG. 22 is executed for the unit patterns of USN=1 and USN=2. In other words, the unit patterns of USN=1 and USN=2 of the verification pattern of PN1=2 are changed to obtain the verification pattern of PN1=3. Hence, the unit patterns of USN=1 and USN=2 included in the verification pattern of PN1=3 are stored into the unit pattern data bus for PN2=6, 7 in FIG. 23A.

The same description as for the third row applies to the fifth row (row of PN1=4) and the sixth row (row of PN1=5) of the change point detection table in FIG. 16B.

As apparent from the verification terminal patterns of FIGS. 23A and 23B, for each verification pattern except the one of PN1=0, a determination pattern is output, hence providing information about unit-pattern change. By making information about verification pattern change be outputted in this way, it becomes unnecessary to output duplicate unit patterns through the output terminals at any cost, and changed unit patterns need only be output through the output terminals. Therefore, the data amount of for-use-in-test signals output from the semiconductor integrated circuit 52 is reduced.

In the present embodiment, in this way, verification patterns output for the test target circuit 8 are converted into verification terminal patterns.

Note that when the patterns of FIG. 23A are created, the drive terminal patterns of FIG. 23B are also created. By this means, relationships between the drive terminal patterns and the verification terminal patterns (expected values) become clear. Then, the process proceeds to S1106 of FIG. 11, where the simulation is executed as described above to determine whether checking is possible. That is, it is confirmed whether the unit patterns output from the data terminals 9*b* to 9*e* of the verification test circuit 7 and the determination patterns output from the data terminals 9*h* to 9*k* are the same as expected values (FIG. 23A).

Fourth Embodiment

A fourth embodiment will be described below using FIGS. 24 to 27. In the present embodiment, pattern conversion is performed for both drive patterns and verification patterns. The same description as in the first and second embodiments will not be duplicated.

Figure 24:
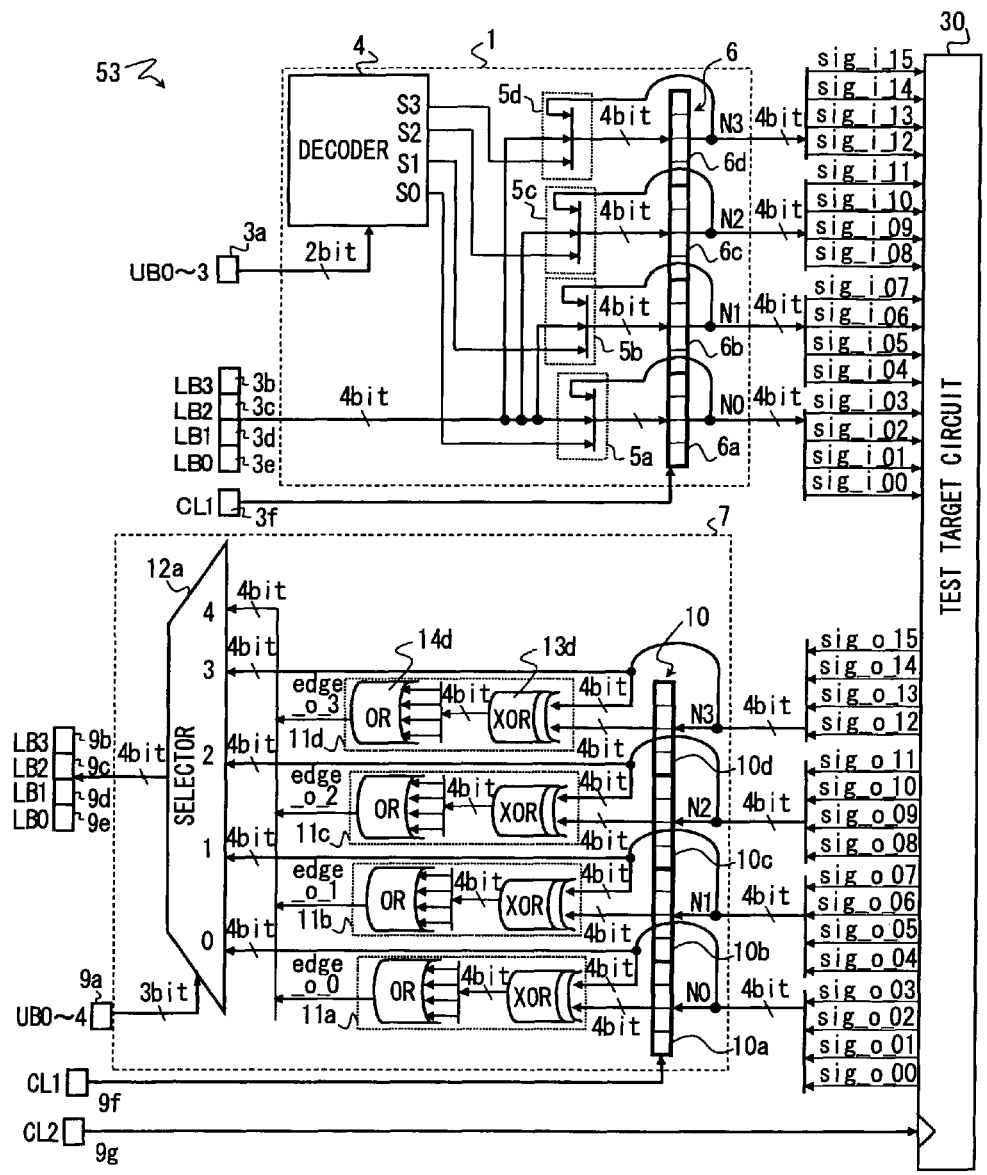
FIG. 24 is a schematic circuit diagram of a semiconductor integrated circuit 53 according to a fourth embodiment.
Figure 25:
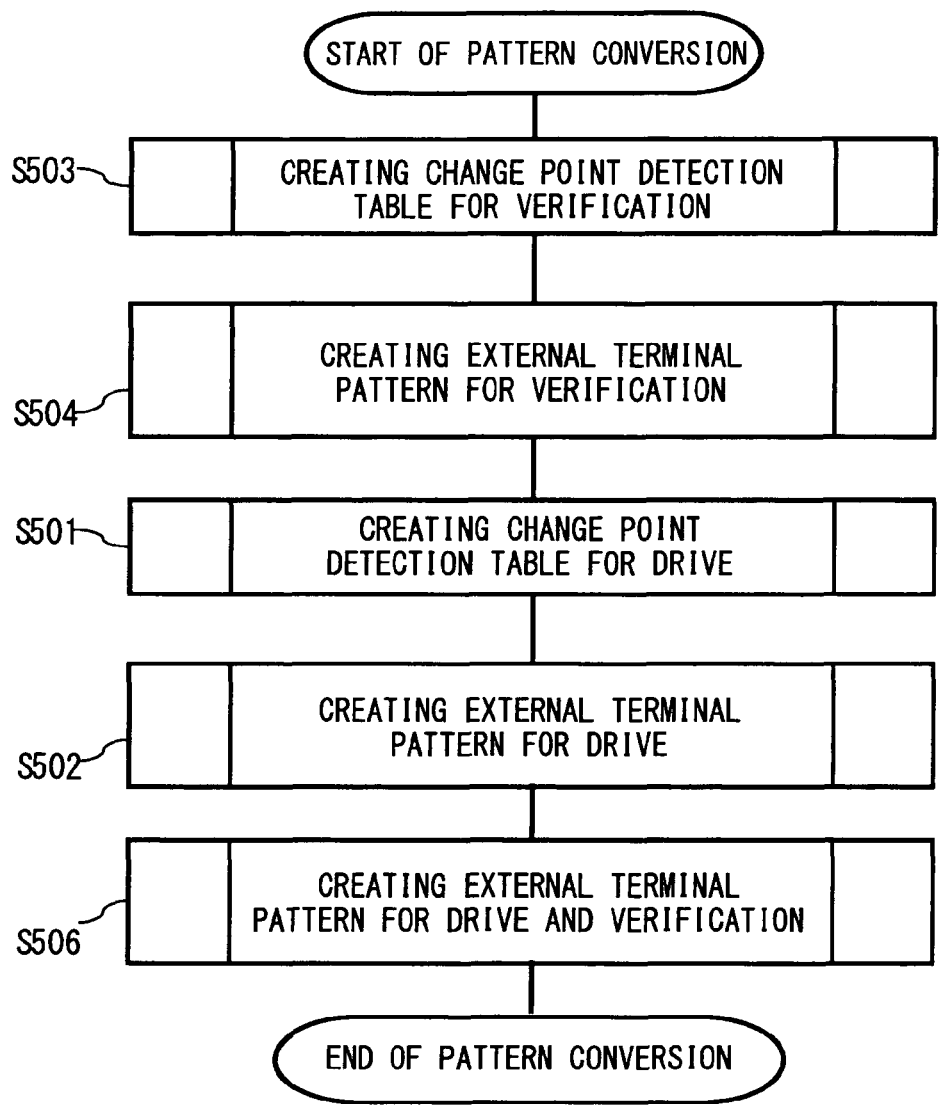
FIG. 25 is a flow chart of pattern conversion.

FIG. 24 shows a schematic circuit diagram of a semiconductor integrated circuit (LSI) 53. FIG. 25 is a flow chart of pattern conversion in the present embodiment. FIG. 26 shows a change point detection table for drive. FIG. 27 shows external terminal patterns.

As shown in FIG. 24, the semiconductor integrated circuit (LSI) 53 of the present embodiment has the drive test circuit 1 and external terminals 3a to 3f of the first embodiment on the drive side of the test target circuit 30 and the verification test circuit 7 and external terminals 9a to 9g of the second embodiment on the verification side of the test target circuit 30.

In the present embodiment, pattern conversion is performed as shown in FIG. 25. That is, first, the change point detection table for verification is created (S503). Then, verification terminal patterns are created (S504). Next, the change point detection table for drive is created (S501). Then, drive terminal patterns are created (S502). Finally, external terminal patterns are created (S506).

The S503 and S504 are the same as in the second embodiment. At S501, the change point detection table for driving as shown in FIG. 26 is created using the drive terminal patterns (FIG. 18B) created at S504. Finally, the created drive terminal patterns and the created verification terminal patterns are put together as shown in FIG. 27. In FIG. 27, a new pattern number (PN3) is provided to put together the drive terminal patterns and the verification terminal patterns. Note that the external terminal patterns may be created (S506) at the same time that the drive terminal patterns are created (S502).

In the present embodiment, the above pattern conversion is performed for both the drive side and the verification side. By this means, the data amount of for-use-in-test signals inputted to and outputted from the external terminals can be greatly reduced. As a result, the test process becomes shorter in time and the data amount of signals stored externally can be reduced.

There is a great difference in the number of for-use-in-test patterns stored externally between performing the pattern conversion and not performing. Under conditions that the number of internal signals is 114 and the number of external terminals is 20 on the drive side and that the number of internal signals is 120 and the number of external terminals is 20 on the verification side, when the above pattern conversion is performed, the number of for-use-in-test signal patterns stored externally is about 71,173. However, when the above pattern conversion is not performed (when duplicate patterns are not excluded), the number of for-use-in-test signal patterns stored externally becomes about 459,088.

Fifth Embodiment

A fifth embodiment of the present embodiment will be described below with reference to FIGS. 28 to 51. In the present embodiment, a delay test is performed, and thereby the more accurate testing of a test target circuit can be realized.

Figure 28:
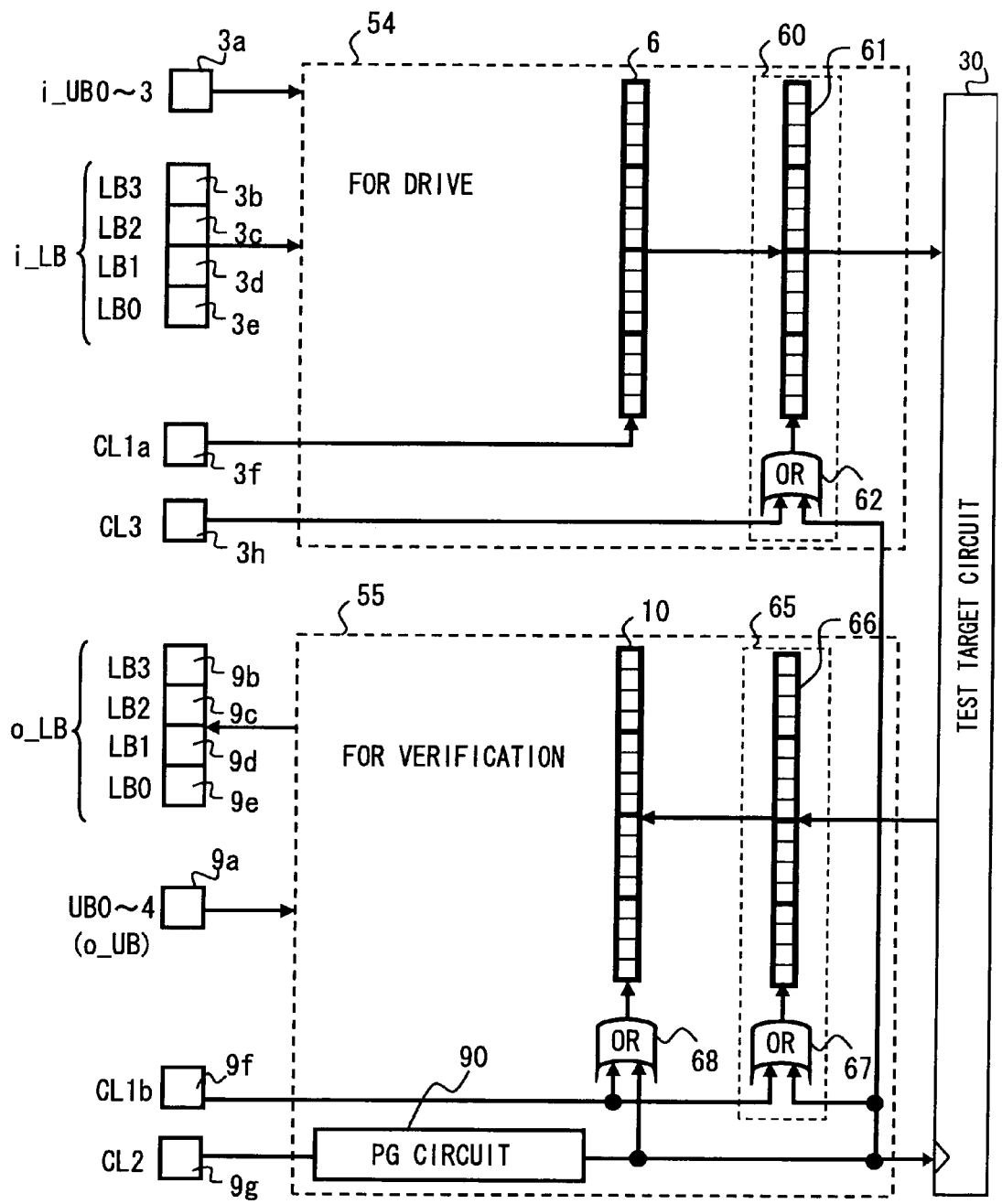
FIG. 28 illustrates schematically connection relationships in a semiconductor integrated circuit according to a fifth embodiment.
Figure 29:
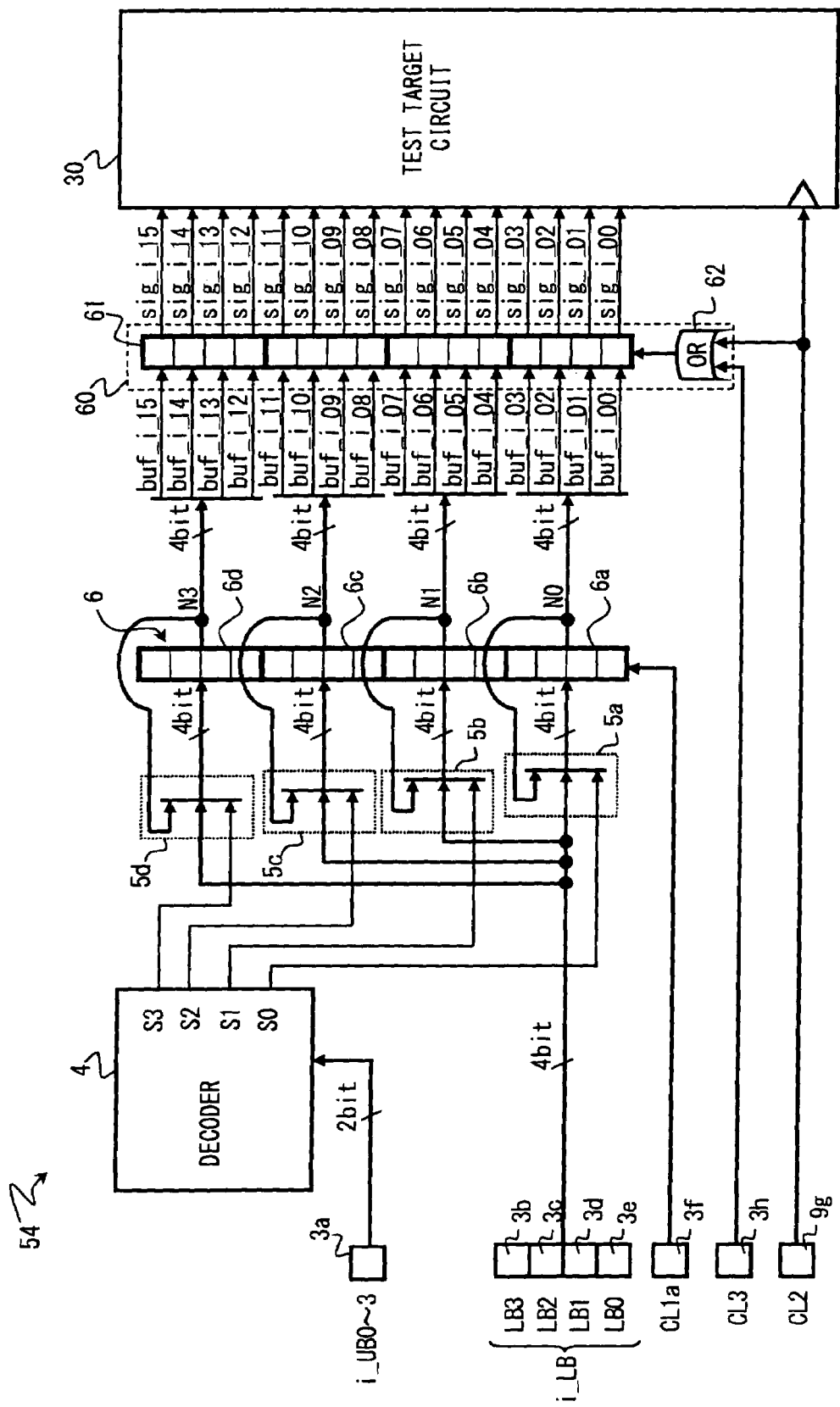
FIG. 29 is a circuit diagram of a drive test circuit according to the fifth embodiment.
Figure 30:
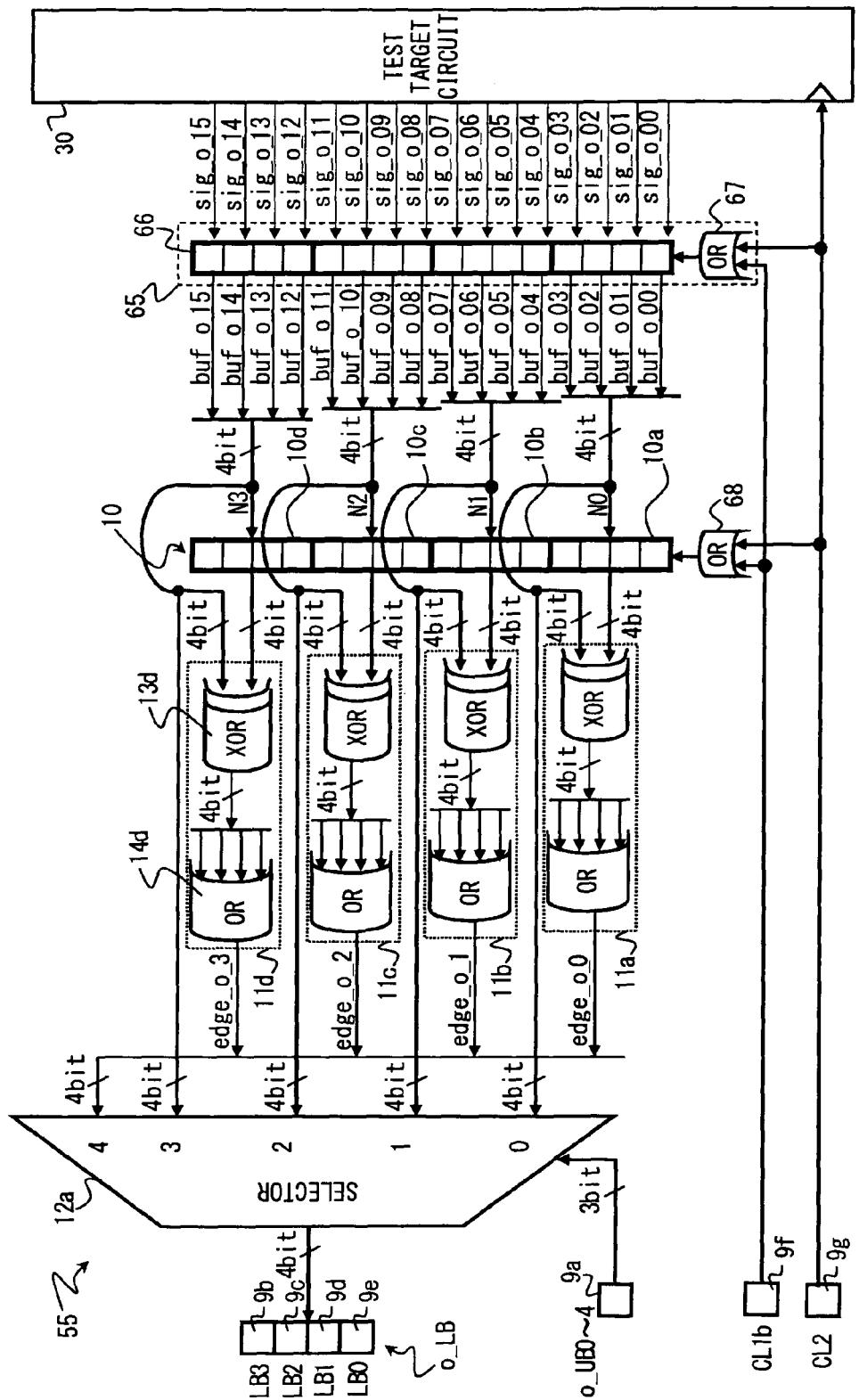
FIG. 30 is a circuit diagram of a verification test circuit according to the fifth embodiment.
Figure 31:
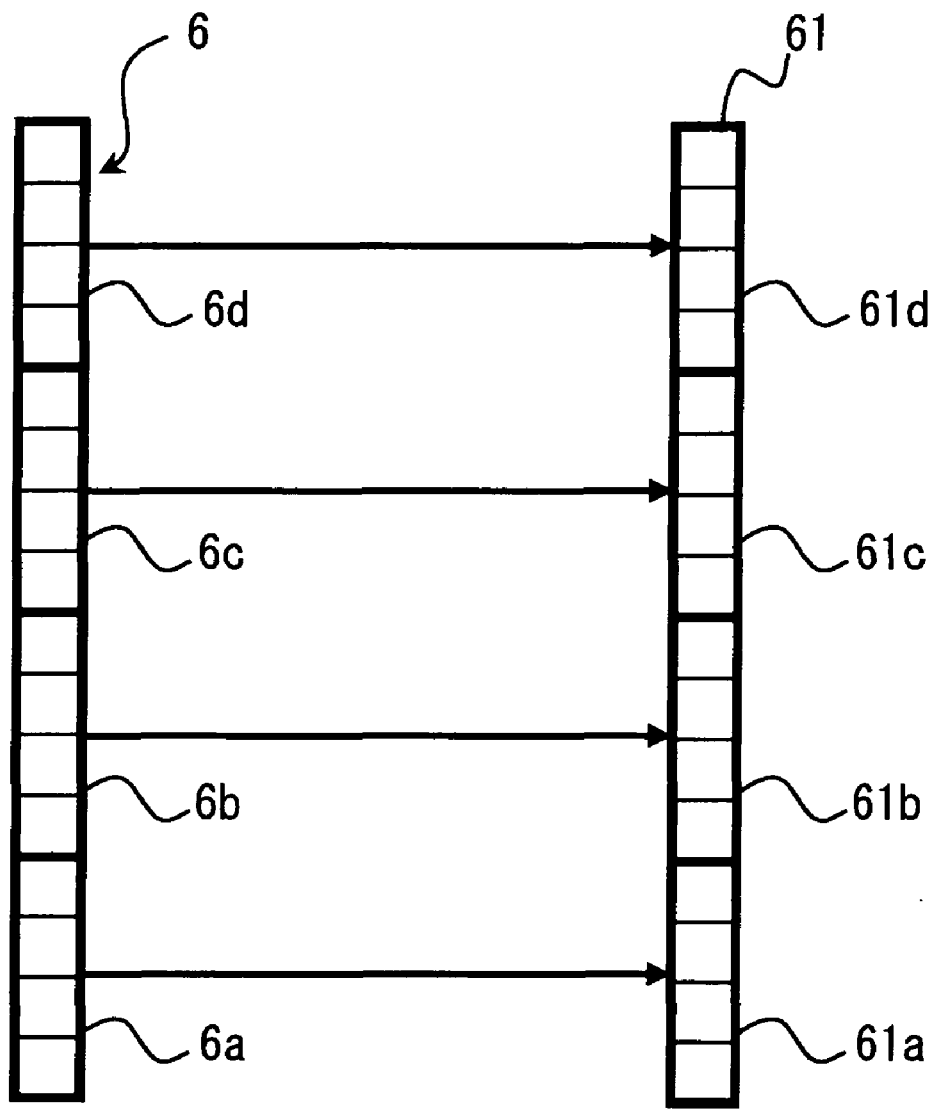
FIG. 31 illustrates the correspondence between holding circuits according to the fifth embodiment.
Figure 32:
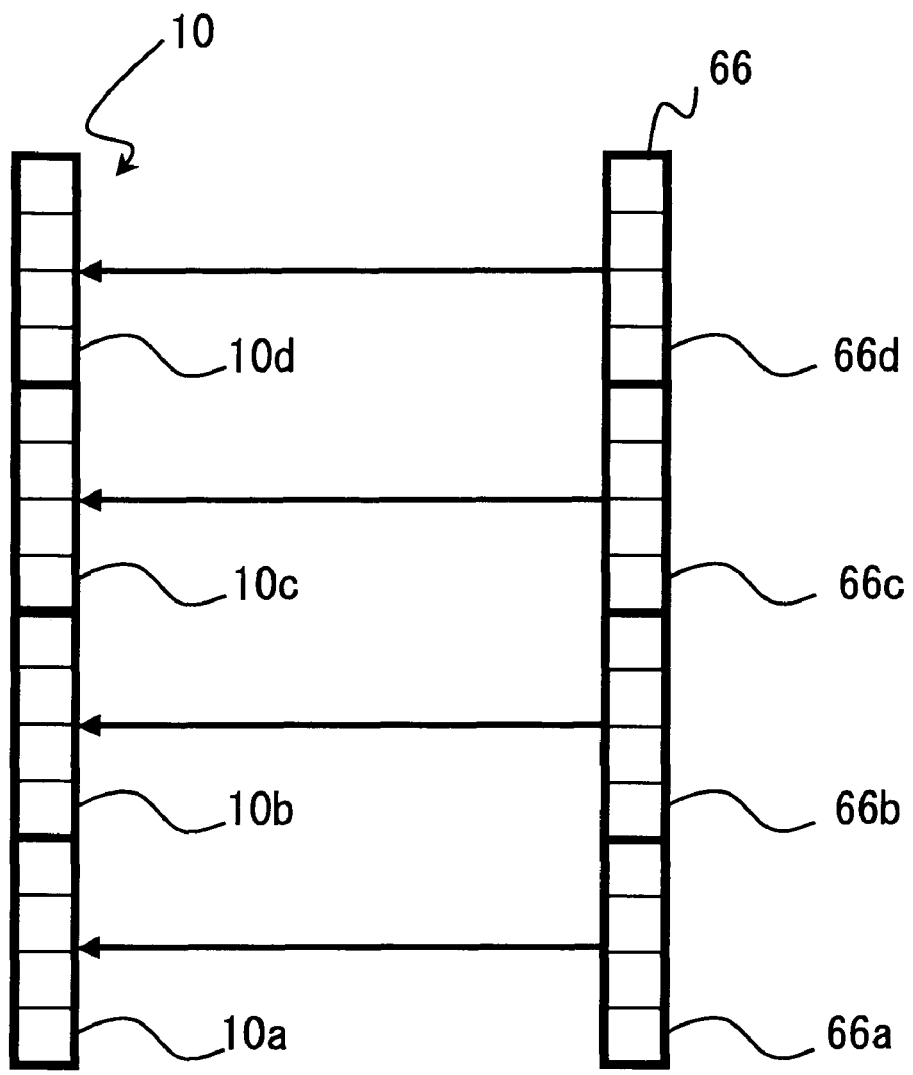
FIG. 32 illustrates the correspondence between holding circuits according to the fifth embodiment.
Figure 35:
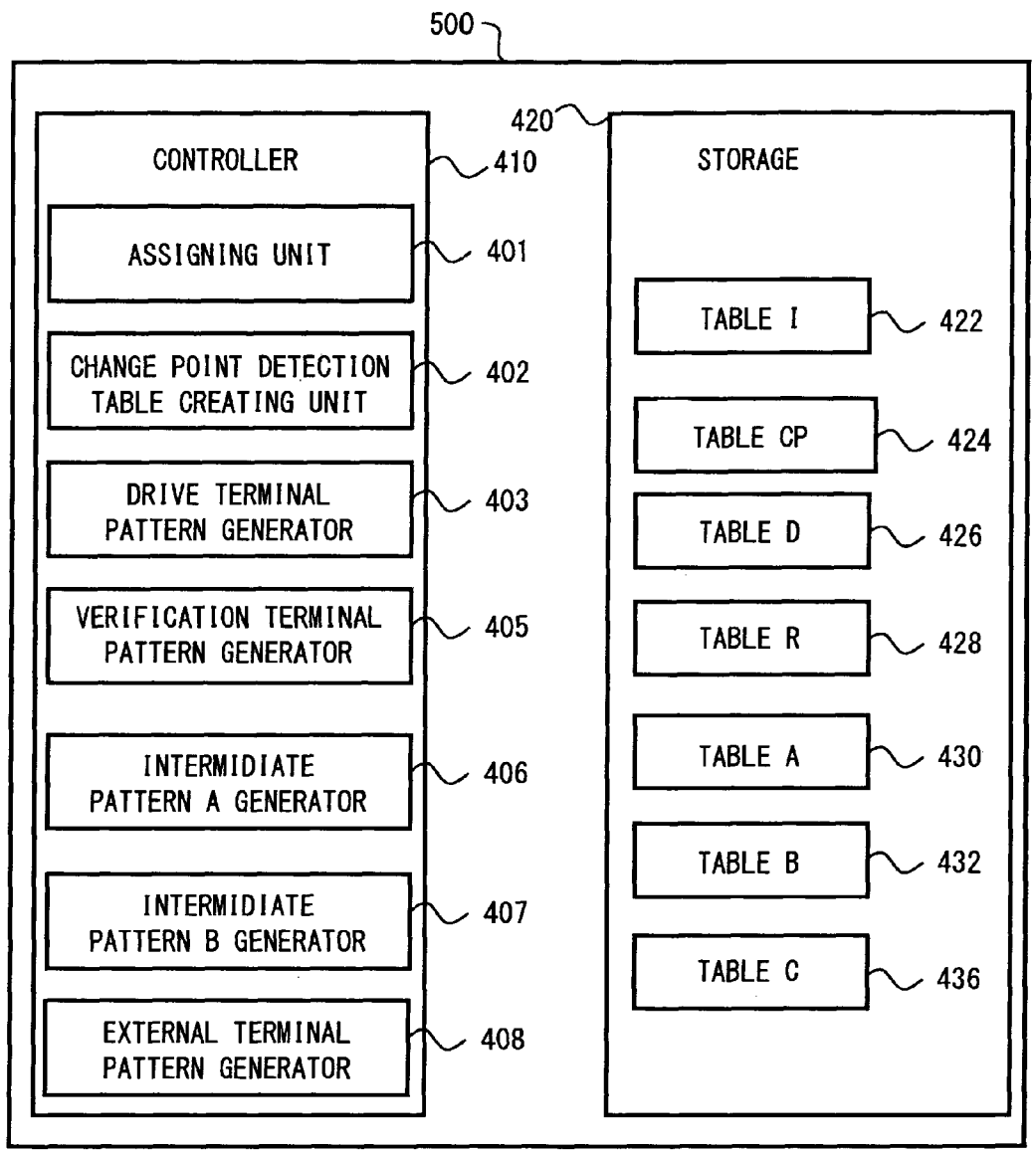
FIG. 35 is a block diagram showing schematically the configuration of a pattern processing apparatus according to the fifth embodiment.
Figure 36:
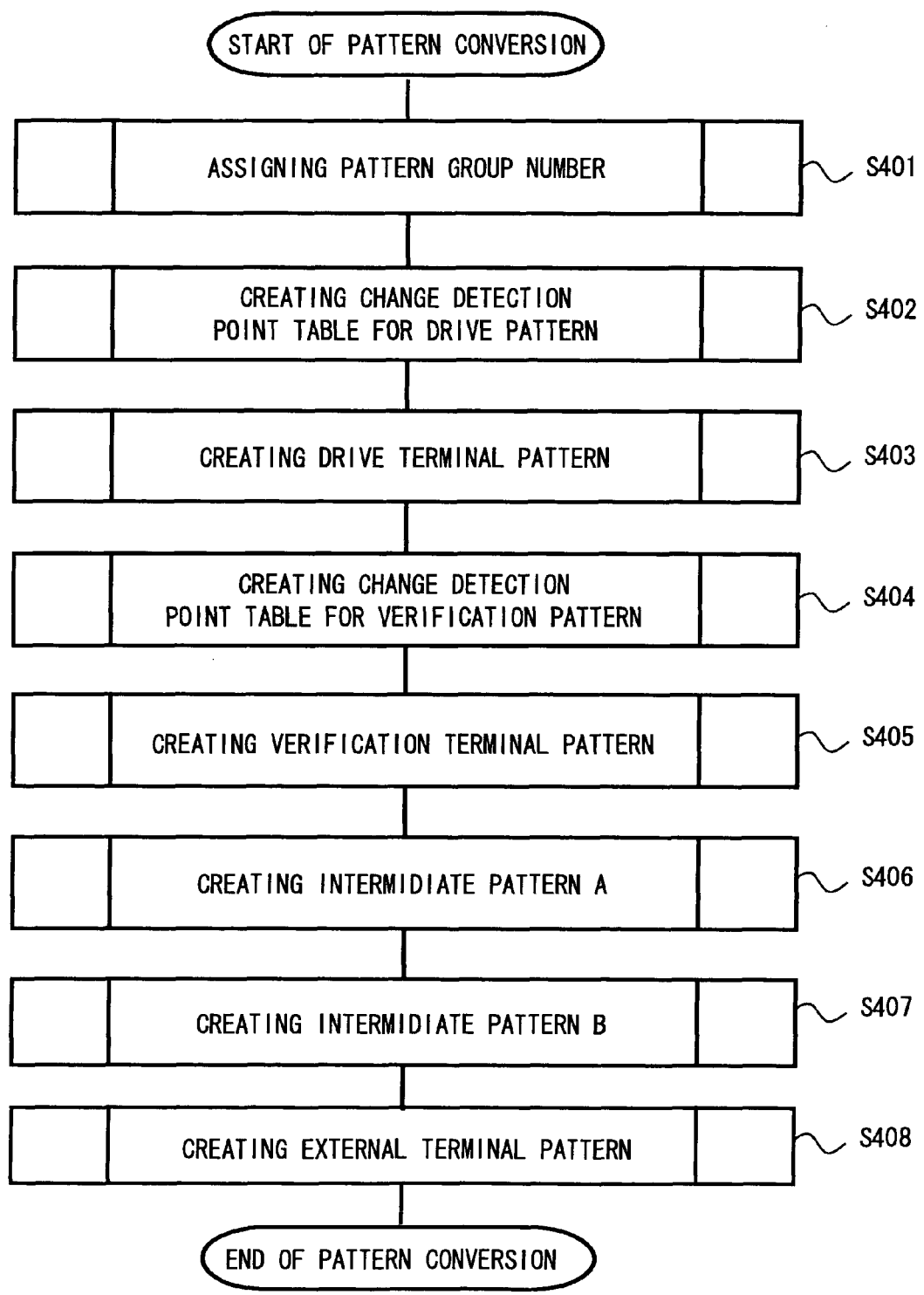
FIG. 36 is a flow chart showing schematically the process of generating external terminal patterns according to the fifth embodiment.
Figure 42:
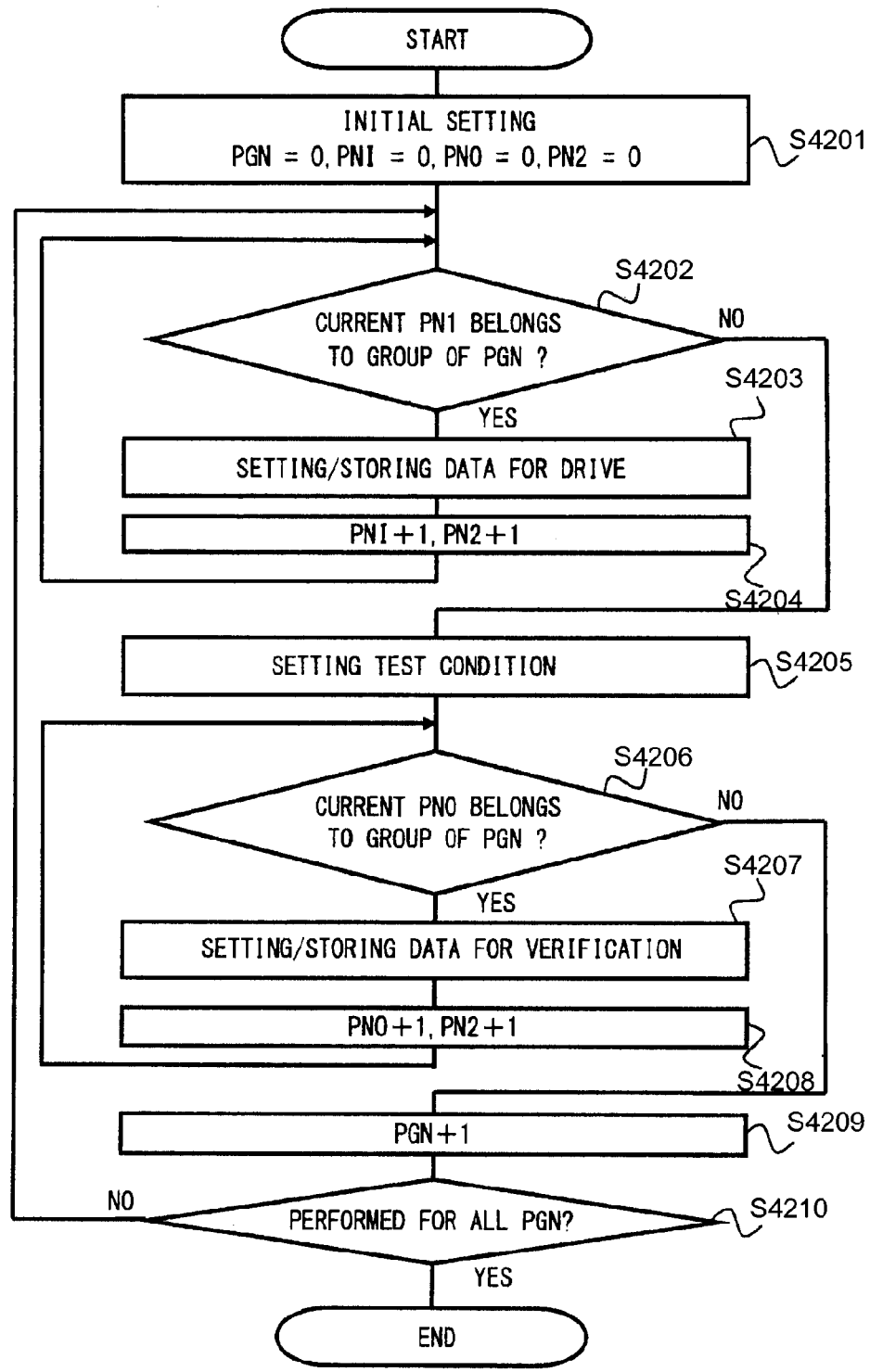
FIG. 42 is a flow chart showing the process of generating intermediate patterns A according to the fifth embodiment.
Figure 44:
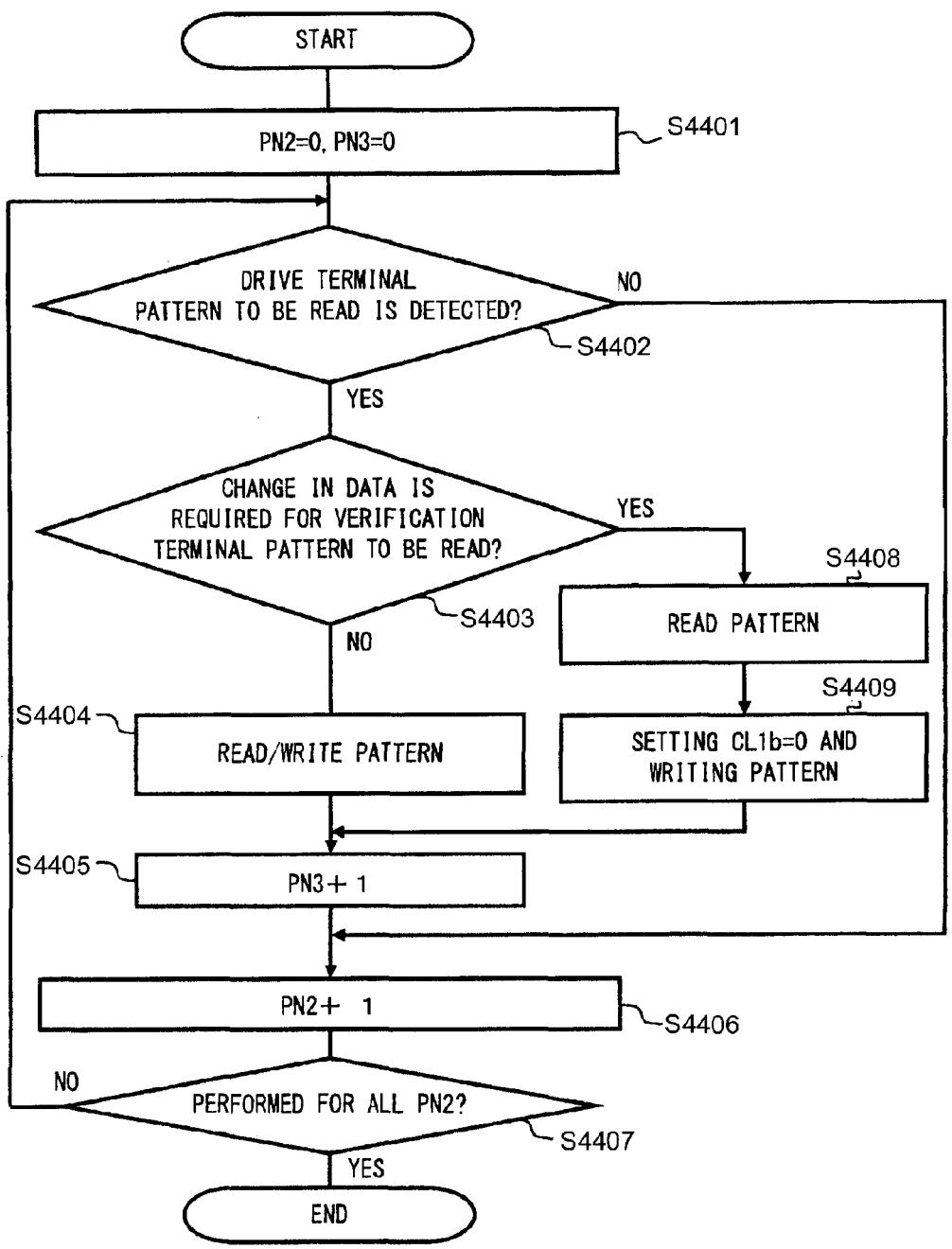
FIG. 44 is a flow chart showing the process of generating intermediate patterns B from the intermediate patterns A according to the fifth embodiment.
Figure 46:
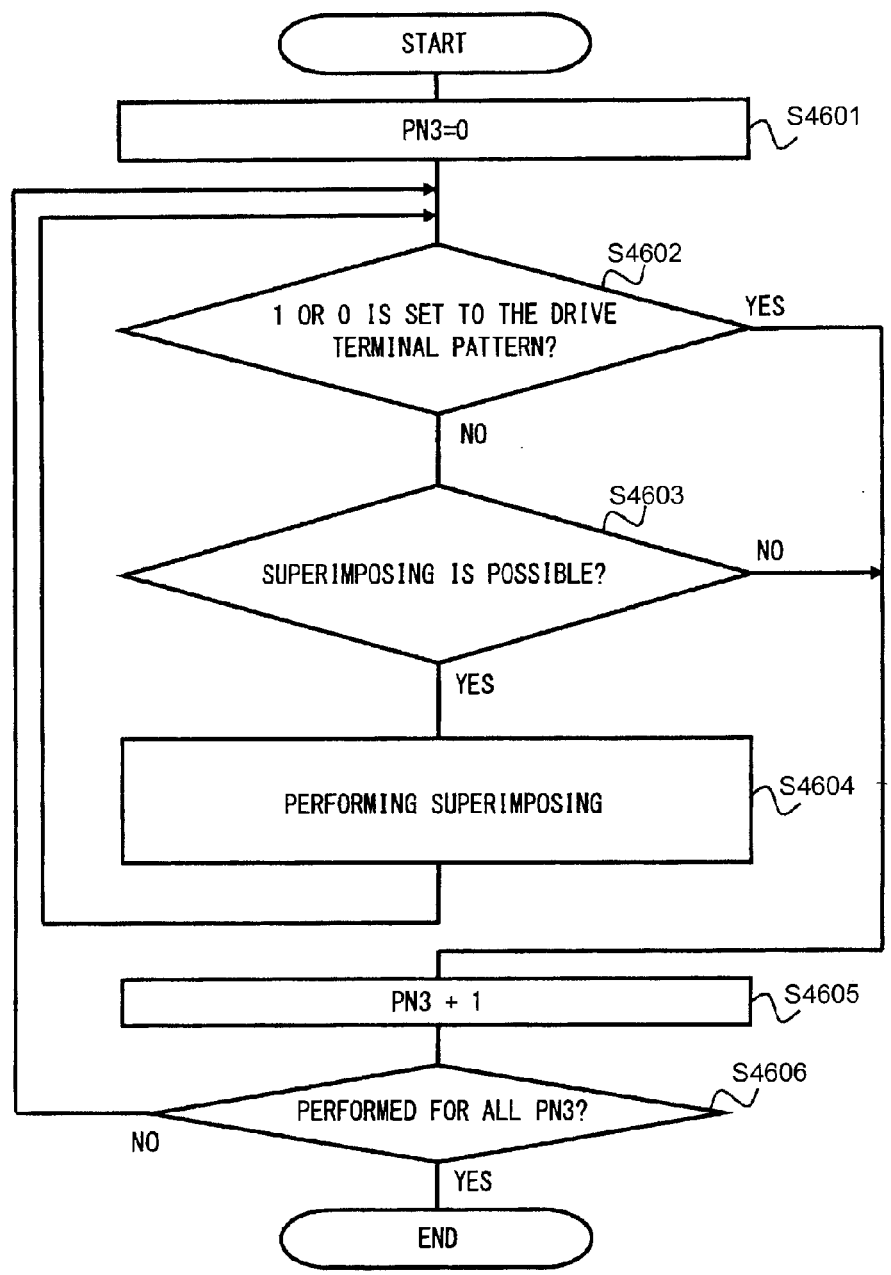
FIG. 46 is a flow chart showing the process of generating external terminal patterns from the intermediate patterns B according to the fifth embodiment.

FIG. 28 illustrates schematically connection relationships in a semiconductor integrated circuit. FIG. 29 is a circuit diagram of a drive test circuit. FIG. 30 is a circuit diagram of a verification test circuit. FIGS. 31 and 32 illustrate the correspondence between holding circuits. FIGS. 33 and 34 illustrate the assignment of identification numbers to internal signals. FIG. 35 is a block diagram showing schematically the configuration of a pattern processing apparatus. FIG. 36 is a flow chart showing schematically the process of generating external terminal patterns. FIG. 37 is a table showing internal signal patterns. FIG. 38 is a table showing a relationship between pattern group numbers and the execution of delay tests. FIG. 39 is a table showing drive patterns after pattern conversion. FIG. 40 is a table showing verification terminal patterns. FIG. 41 is a sequence table where the drive patterns and verification patterns are arranged in a sequence. FIG. 42 is a flow chart showing the process of generating intermediate patterns A. FIG. 43 is a table showing the intermediate patterns A. FIG. 44 is a flow chart showing the process of generating intermediate patterns B from the intermediate patterns A. FIG. 45 is a table showing the intermediate patterns B. FIG. 46 is a flow chart showing the process of generating external terminal patterns from the intermediate patterns B. FIG. 47 is a table showing the external terminal patterns. FIGS. 48 to 51 are timing charts illustrating the operation of a semiconductor integrated circuit.

The configuration of a test circuit according to the present embodiment will be described with reference to FIGS. 28 to 32. FIG. 28 is a schematic circuit diagram of a semiconductor integrated circuit 56. FIG. 29 is a detailed circuit diagram of a drive test circuit 54 in the semiconductor integrated circuit 56. FIG. 30 is a detailed circuit diagram of a verification test circuit 55 in the semiconductor integrated circuit 56. FIGS. 31 and 32 illustrate the correspondence between holding circuits.

As shown in FIG. 28, the semiconductor integrated circuit of the present embodiment differs from that of the fourth embodiment in that it further comprises a buffer (a buffer circuit) 60, a buffer 65, a control terminal 3h, and an OR circuit 68. The buffer 60 has a holding circuit 61 and an OR circuit 62. The buffer 65 has a holding circuit 66 and an OR circuit 67.

As shown in FIGS. 28 to 30, the holding circuit 61 is connected between the holding circuit 6 and the test target circuit 30. The holding circuit 66 is connected between the test target circuit 30 and the holding circuit 10. The control terminal 3h is connected to the first input terminal of the OR circuit 62. The control terminal 9g is connected to the second input terminal of the OR circuit 62. The output terminal of the OR circuit 62 is connected to the clock terminal of the holding circuit 61. The control terminal 9f is connected to the first input terminal of the OR circuit 68 and to the first input terminal of the OR circuit 67. The control terminal 9g is connected to the second input terminal of the OR circuit 68 and to the second input terminal of the OR circuit 67. The output terminal of the OR circuit 68 is connected to the clock terminal of the holding circuit 10. The output terminal of the OR circuit 67 is connected to the clock terminal of the holding circuit 66. The control terminal 9g is also connected to a control terminal of the test target circuit.

The OR circuit 62 outputs a high level when at least one of clock CL3 and clock CL2 is at a high level. The OR circuit 67 outputs the high level when at least one of clock CL1b and clock CL2 is at a high level. The OR circuit 68 also operates in the same way as the OR circuit 67.

The holding circuit 61 holds a drive pattern transferred from the holding circuit 6 at the rise of clock CL3 or clock CL2, while outputting the drive pattern being held to the test target circuit 30. The holding circuit 6 holds a drive pattern input from the selectors 5a to 5d at the rise of clock CL1a, while outputting the drive pattern being held to the holding circuit 61.

The holding circuit 66 holds a to-be-verified pattern transferred from the test target circuit 30 at the rise of clock CL1b or clock CL2, while outputting the to-be-verified pattern being held to the holding circuit 10. As apparent from FIG. 28, the holding circuit 10 also operates in the same way as the holding circuit 66.

Both the holding circuits 61, 66 are a 16-bit FF (flip-flop). As shown in FIG. 31, the holding circuit 61 has holding circuits 61a to 61d divided into by the number of unit patterns as the holding circuit 6. As shown in FIG. 32, the holding circuit 66 has holding circuits 66a to 66d divided into by the number of unit patterns as the holding circuit 10.

The holding circuit 61 having been additionally provided, signal names are additionally assigned in the drive test circuit 54 as shown in FIG. 29, and identification numbers are assigned as shown in FIG. 33. Likewise, the holding circuit 66 having been additionally provided, signal names are additionally assigned in the verification test circuit 55 as shown in FIG. 30, and identification numbers are assigned as shown in FIG. 34.

In the present embodiment, under the condition of the frequency of clock CL2 matching the operating frequency of the test target circuit 30, drive patterns held in the holding circuit 61 and drive patterns held in the holding circuit 6 are sequentially input to the test target circuit. At this time, to-be-verified patterns consecutively output from the test target circuit 30 are held by the holding circuit 66 and the holding circuit 10. It is determined whether the to-be-verified patterns held in the holding circuits 10 and 66 are the same as expected values, and thereby the delay test of the test target circuit 30 at its operating frequency can be realized. To simplify description, it is assumed that the test target circuit 30 outputs verification patterns, i.e., the test target circuit 30 does not output logically false patterns.

In the present embodiment, the holding circuit 66 is provided in between the holding circuit 10 and the test target circuit 30. In this case, even if signals input to the test target circuit 30 pass through the test target circuit 30 without being held therein temporarily, the signals are held in the holding circuit 66 and are not immediately input to the holding circuit 10. Therefore, the driving of drive patterns and the reading of to-be-verified patterns are performed in parallel not depending on the circuit configuration of the test target circuit 30. In other words, in the present embodiment, the driving of drive patterns and the reading of to-be-verified patterns need not be mutually exclusively performed, and thus the delay test can be efficiently carried out. These points will become clearer from later description.

The generation of external terminal patterns according to the present embodiment will be described with reference to FIGS. 35 to 47.

FIG. 35 shows a pattern processing apparatus 500. The pattern processing apparatus 500 is a usual computer and sequentially executes program code stored in storage by its computing unit, thereby realizing various functions. The pattern processing apparatus 500 may be a tester connected to the semiconductor integrated circuit 56 at its external terminals.

The pattern processing apparatus 500 has a controller 410 and storage 420.

The controller 410 comprises an assigning unit 401, a change point detection table creating unit (detecting unit) 402, a drive terminal pattern generator 403, a verification terminal pattern generator 405, an intermediate pattern A generator 406, an intermediate pattern B generator 407, and an external terminal pattern generator 408. The drive terminal pattern generator 403 and verification terminal pattern generator 405 form a terminal pattern generator. The intermediate pattern A generator 406, intermediate pattern B generator 407, and external terminal pattern generator 408 form an input/output pattern generator.

The storage 420 has a plurality of tables. To be specific, the storage 420 has a table I 422, a table CP 424, a table D 426, a table R 428, a table A 430, a table B 432, and a table C 436. Each table is a data store region where multiple fields are arranged in rows and columns. Values to identify the respective rows are set beforehand in each table, and values to identify the respective columns are set beforehand in each table.

The assigning unit 401 assigns pattern group numbers (PGNs) described later. The change point detection table creating unit 402 creates the previously described change point detection table. The drive terminal pattern generator 403 generates the previously described drive terminal patterns (a drive terminal pattern sequence). The verification terminal pattern generator 405 generates the previously described verification terminal patterns (a verification terminal pattern sequence). The intermediate pattern A generator 406 generates later described intermediate patterns A (an input/output terminal pattern sequence). The intermediate pattern B generator 407 generates later described intermediate patterns B (an input/output terminal pattern sequence). The external terminal pattern generator 408 generates later described final external terminal patterns (an input/output terminal pattern sequence).

FIG. 36 is a flow chart schematically showing the process of generating external terminal patterns. As shown in FIG. 36, first, pattern group numbers are assigned (S401). To be specific, the assigning unit 401 assigns PGNs to internal signal patterns (internal signal pattern data (drive terminal pattern data and verification terminal pattern data)) already stored in the table I of the storage. A PN1, USNs, and LSNs have been assigned by the assigning unit 401 to each internal signal pattern in the table I.

FIG. 37 shows the PGN assigned internal signal patterns. The assigning unit 401 assigns a PGN to (DP+1) number of PN1 values, where DP is the number of new added holding circuits. Here, since DP=1, the assigning unit 401 assigns a PGN to each unit of two PN1 values. To realize the delay test, two consecutive drive patterns are sequentially input to the test target circuit 30. Accordingly, two drive patterns input to the test target circuit 30 in the same test are grouped with a PGN (identification value) in advance. Likewise, two verification patterns output from the test target circuit 30 in the same test are grouped with a PGN in advance.

To be specific, the assigning unit 401 assigns PGN of 0 to patterns of PN1=0 and PN1=1, PGN of 1 to patterns of PN1=2 and PN1=3, and PGN of 2 to patterns of PN1=4 and PN1=5. In this case, as shown in FIG. 38, a delay test of PN1=0 to PN1=1, a delay test of PN1=2 to PN1=3, and a delay test of PN1=4 to PN1=5 are performed.

Next, the change point detection table for drive patterns is created (S402). The change point detection table creating unit 402 searches for change points in the drive patterns included in the internal signal patterns of FIG. 37 according to the method described in the first embodiment and writes the search result in the table CP. In this way, the change point detection table for drive patterns is created. The details of this step are as described in the first embodiment (see FIGS. 5 to 9B).

Next, drive terminal patterns are generated (S403). To be specific, the drive terminal pattern generator 403 sequentially reads necessary unit patterns from the drive patterns stored in the table I based on the change point detection table created at 5402 and writes into the table D. In this way, a drive terminal pattern table is created. The details of this step are as described in the first embodiment (see FIGS. 5 to 9B).

FIG. 39 shows the generated drive terminal patterns. In FIG. 39, patterns are numbered with a new input pattern number PNI1. In the order of values of input pattern number PNI1, drive terminal patterns (iUSN, CL1a, CL3, i_LB) are set on external terminals of the drive test circuit. The iUSN corresponds to an identification signal i_UB input to the control terminals 3a. The i_LB corresponds to a signal (unit pattern) input to the data terminals 3b to 3e.

Next, the change point detection table for verification patterns is created (S404). To be specific, the change point detection table creating unit 402 searches for change points in the verification patterns included in the internal signal patterns of FIG. 37 according to the method described in the second embodiment and writes the search result in the table CP. In this way, the change point detection table for verification patterns is created. The details of this step are as described in the second embodiment (see FIGS. 14 to 18B). Accordingly, duplicate description thereof is omitted.

Next, verification terminal patterns are generated (S405). To be specific, the verification terminal pattern generator 405 sequentially reads necessary unit patterns from the verification patterns stored in the table I based on the change point detection table created at S404 and writes into the table R. In this way, a verification terminal pattern table is created. The details of this step are as described in the second embodiment (see FIGS. 14 to 18B).

FIG. 40 shows the generated verification terminal patterns in the present embodiment. In FIG. 40, patterns are numbered with a new output pattern number PNO1. In the order of values of output pattern number PNO1, verification terminal patterns (oUSN, CL1a, CL3, i_LB) are set on external terminals of the verification test circuit. The oUSN corresponds to an identification signal o_UB input to the control terminals 9a. The o_LB corresponds to a signal (unit pattern) input to the data terminals 9b to 9e.

Next, intermediate patterns A are generated (S406). To be specific, the intermediate pattern A generator 406 generates intermediate patterns A based on the table D and the table R. The intermediate patterns A are patterns preceding external terminal patterns to be finally generated.

Prior description will be made with reference to FIG. 41 before the generation of the intermediate patterns A is described. FIG. 41 is a table where drive terminal patterns and verification terminal patterns of the same pattern group number are arranged in that order and the pattern groups are arranged in the order of their pattern group number PGN values. Synchronization signal patterns to drive the test target circuit 30 (patterns to set a launch pulse and a capture pulse) are inserted between the drive terminal patterns and the verification terminal patterns. Note that as shown schematically in FIG. 28, a pulse generating circuit (PG circuit) 90 may be provided in between the external terminal 9g and the test target circuit, which generates synchronization signal pulses when a control signal is input to the pulse generating circuit 90. The pulse generating circuit is a circuit that processes pulses output by a frequency multiplier, a frequency divider, an oscillator, etc., with use of a control circuit or a filter circuit to output a requisite number of consecutive pulses. In this case, the pattern generating apparatus may generate patterns wherein a synchronization signal pattern for setting the launch and capture pulses is inserted between drive terminal patterns and verification terminal patterns. In FIG. 41, patterns are re-numbered with a pattern number PN2.

In the present embodiment, a series of operations where a drive pattern is set in the drive test circuit 54, then a test pulse (synchronization signal pulse) is input to the test target circuit 30, and a to-be-verified pattern is read from the verification test circuit 55, as a basic cycle, is performed repeatedly. Thus, the drive terminal patterns, test pulses, and verification terminal patterns of the same PGN are arranged in that order. But the drive terminal patterns, test pulses, and verification terminal patterns of the same PGN may not necessarily be arranged in that order. The order in which these are arranged depends on the order in which internal signal patterns were extracted at step 4 of FIG. 2. Then, the integrated patterns for respective values of PGN are arranged in the order of their PGN values. In this way, the sequence shown in FIG. 41 is assembled. The integrated patterns for respective values of PGN are arranged in the order of PGN values regardless of the order in which the drive patterns, synchronization signal patterns, and verification patterns of the same PGN are arranged.

The procedure of generating the intermediate patterns A will be described with reference to FIG. 42. The intermediate pattern A generator 406 generates intermediate patterns A based on the drive terminal patterns (FIG. 39) and the verification terminal patterns (FIG. 40). The intermediate pattern A generator 406 sequentially writes data into the table A, thereby generating intermediate patterns A in the table A.

First, initial setting for generating intermediate patterns A is performed S4201. That is, the intermediate pattern A generator 406 sets PGN of 0, PNI of 0, PNO of 0, and PN2 of 0 as initial conditions in a register of the pattern processing apparatus in advance.

Next, it is determined whether PNI of the current value belongs to PGN of the current value S4202. To be specific, the intermediate pattern A generator 406, referring to the drive terminal patterns (FIG. 39) stored in the table D, determines whether the value of PGN for the row of PNI1=0 designated by the current PNI value of 0 is at 0 (the current value of PGN).

If PNI of the current value belongs to PGN of the current value, driving data is set/stored S4203. To be specific, if PNI of the current value belongs to PGN of the current value, the intermediate pattern A generator 406 reads the drive terminal pattern in the row designated by PNI of the current value and writes the read data into the intermediate pattern A (a corresponding field in the table A). Further, the period of the intermediate pattern A is set at long and CL2 is set to 0, which indicates no test clock input. When the period is long, the tester sets a drive terminal pattern in the drive test circuit 54 at low speed.

Next, the value of PNI is incremented by 1 and the value of PN2 is incremented by 1 S4204. To be specific, the intermediate pattern A generator 406 increments the value of PNI in the register by 1 and the value of PN2 in the register by 1. Through the procedure of S4202 to S4204, necessary data is transferred from drive terminal patterns to intermediate patterns A, and periods and values of CL2 are set at appropriate values. At this point, data of PN2=0 to PN2=5 has been input in FIG. 43.

If PNI of the current value surpasses PGN of the current value, test conditions are set S4205. To be specific, the intermediate pattern A generator 406 performs the process of setting the period at short and setting CL2 to 1, which indicates test clock input, (DP+1) number of times while adding 1 to the value of PN2. Here, since DP+1=2, the generator 406 performs the above process (setting the period at short and setting CL2 to 1) twice. At this point, data of PN2=6, 7 has been input in FIG. 43.

Next, it is determined whether PNO of the current value belongs to PGN of the current value S4206. To be specific, the intermediate pattern A generator 406, referring to the verification terminal patterns (FIG. 40) stored in the table R, determines whether the value of PGN for the row of PNO1=0 designated by the current PNO value of 0 is at 0 (the current value of PGN).

If PNO of the current value belongs to PGN of the current value, checking data is set/stored S4207. To be specific, if PNO of the current value belongs to PGN of the current value, the intermediate pattern A generator 406 reads the verification terminal pattern in the row designated by PNO of the current value and writes the read data into the intermediate pattern A (a corresponding field in the table A). Further, the intermediate pattern A generator 406 sets the period of the intermediate pattern A at long and sets CL2 to 0, which indicates no test clock input.

Next, the value of PNO is incremented by 1 and the value of PN2 is incremented by 1 S4208. To be specific, the intermediate pattern A generator 406 increments the value of PNO in the register by 1 and the value of PN2 in the register by 1. Through the procedure of S4206 to S4208, data is transferred from verification terminal patterns to intermediate patterns A. At this point, data of PN2=8 to 14 has been input in FIG. 43.

If PNO of the current value surpasses PGN of the current value, the value of pattern group number PGN is incremented by 1 S4209. Then, it is determined whether for all values of PGN the above process has been executed S4210. To be specific, it is determined whether the current value of PGN is greater than the maximum value of PGN. In this way, the intermediate patterns A shown in FIG. 43 are generated. S4209, S4210 are also executed by the intermediate pattern A generator 406.

Referring back to FIG. 36, description will be made. As shown in FIG. 36, after the generation of the intermediate patterns A, intermediate patterns B are generated (S407). The intermediate patterns B are patterns preceding external terminal patterns to be finally generated and are generated by reading partly data stored in the intermediate patterns A. Step S407 is executed by the intermediate pattern B generator 407.

The procedure of generating the intermediate patterns B will be described with reference to FIG. 44. First, initial setting for generating intermediate patterns B is performed S4401. That is, the intermediate pattern B generator 407 sets PN2 of 0 and PN3 of 0 as initial conditions in a register of the pattern processing apparatus in advance.

Next, it is determined whether the drive terminal pattern is to be read S4402.

To be specific, the intermediate pattern B generator 407, referring to the intermediate patterns A, determines whether the following conditions 1 to 3 are satisfied: (condition 1) the current value of PN2 is not the maximum value of PN2, (condition 2) the value of CL3 designated by the current value of PN2 is at 1, which indicates a pulse being present, and (condition 3) the value of CL2 designated by the current value of PN2 plus 1 is at 1, which indicates a pulse being present. If any of the conditions is not satisfied, the intermediate pattern B generator 407 determines that the drive terminal pattern is to be read.

If there is a drive terminal pattern to be read, it is determined whether the verification terminal pattern to be read needs to be changed in data S4403.

To be specific, the intermediate pattern B generator 407, referring to the intermediate patterns A, determines whether the following conditions 1 to 3 are satisfied: (condition 1) the current value of PN2 is at or above 1, (condition 2) the value of CL1$b$ designated by the current value of PN2 is at 1, which indicates a pulse being present, and (condition 3) the value of CL3 designated by the current value of PN2 minus 1 is at 1, which indicates a pulse being present. If any of the conditions is not satisfied, the intermediate pattern B generator 407 determines that the verification terminal pattern to be read need not be changed in data.

If data need not be changed, the pattern is transferred S4404. To be specific, the intermediate pattern B generator 407 reads data in the table A designated by the current value of PN2 and writes the read data into the field of the table B designated by the current value of PN3.

If data needs to be changed, the data is read S4408, and the data having CL1$b$ therein set to 0 is written S4409. To be specific, the intermediate pattern B generator 407 reads data in the table A designated by the current value of PN2, sets CL1$b$ in the read data to 0, and writes the data into the field of the table B designated by the current value of PN3.

After S4 and S9, 1 is added to the current value of PN3 S4405. Then, 1 is added to the current value of PN2 S4406. If the conditions of S2 are satisfied, the process immediately proceeds to step S4406. S4405 and S4406 are executed by the intermediate pattern B generator 407.

Then, it is determined whether for all values of PN2 the above procedure has been executed S4407. If not, the intermediate pattern B generator 407 returns to the above step S4402.

Through the above procedure, the intermediate patterns A are sequentially examined in ascending order of PN2 while data is transferred from the intermediate patterns A to the intermediate patterns B. During this time period, the patterns designated by PN2 of 5, PN2 of 18, and PN2 of 26 are not transferred from the intermediate patterns A to the intermediate patterns B. This is because both clocks CL2 and CL3 are connected to the control terminal of the holding circuit 61 via the OR circuit 62. Further, the CL1$b$'s designated by PN2 of 8, PN2 of 21, and PN2 of 29 are read, changed from 1 to 0, and transferred to the intermediate patterns B. This is because both clocks CL1$b$ and CL2 are connected to the control terminal of the holding circuit 66 via the OR circuit 67. In this way, the intermediate patterns B shown in FIG. 45 are generated.

Referring back to FIG. 36, description will be made. As shown in FIG. 36, after the generation of the intermediate patterns B, external terminal patterns are generated (S408). The external terminal patterns are generated by the external terminal pattern generator 408 based on the intermediate patterns B. The external terminal patterns are ones to be finally generated and are stored in a tester that inputs sequentially external terminal patterns to the test circuit.

The procedure of generating the external terminal patterns will be described with reference to FIG. 46.

First, initial setting for generating external terminal patterns is performed S4601. That is, the external terminal pattern generator 408 sets PN3 of 0 as an initial condition in a register of the pattern processing apparatus in advance.

Next, it is determined whether there is a one or zero in the drive terminal pattern S4602. To be specific, the external terminal pattern generator 408 determines whether there is a one or zero set in any of iUSN, CL1$a$, CL3, and i_LB.

If there is not a one or zero in the drive terminal pattern, it is determined whether superimposing is not necessary (whether superimposing is possible) S4603. To be specific, the external terminal pattern generator 408 executes the following processes 1 to 3: (process 1) searching for PN3 values (here PN3$a$) designating CL2 of 1 in the range of the current PN3 value (here PN3$c$) or smaller (or among a set of the PN3$c$ and the PN3 values smaller than the PN3$c$) in descending order of PN3 values, (process 2) if the PN3$a$ is found in process 1, searching for PN3 values (here PN3$b$) designating CL1$b$ of 1 in the range of the PN3$a$ or greater (or among a set of the PN3a and the PN3 values greater than the PN3a) in ascending order of PN3 values, and (process 3) if the PN3b is found in process 2, determining whether the PN3b equals the PN3c, i.e. the current PN3 value. If the PN3b equals the PN3c, the external terminal pattern generator 408 determines that superimposing need not be performed.

The above processes 1 to 3 included in S4603 will be described taking the case where PN3=13 as an example with reference to FIG. 45. In process 1, PN3 of 6 is identified as a subject; in process 2, PN3 of 12 is identified as a subject; and in process 3, PN3 of 13 and PN3 of 12 are determined to be different in value. Thus, the external terminal pattern generator 408 finally determines that superimposing needs to be performed.

If superimposing is necessary, superimposing is performed S4604. To be specific, the external terminal pattern generator 408 executes the following processes 1, 2: (process 1) searching for PN3 values designating CL2 of 1 in the range of the current PN3 value or greater in ascending order of PN3 values, and (process 2) if a PN3 value (here PN3d) designating CL2 of 1 is found in process 1, sequentially reading the drive terminal patterns (iUSN, CL1a, CL3, i_LB) that are designated by PN3 values in a data transfer range of the PN3 value greater by 1 than the current PN3 value to the PN3 value smaller by 1 than the PN3d, from the intermediate patterns B and writing each read pattern into a drive terminal pattern field designated by its PN3 value in the external terminal patterns.

The above processes 1, 2 will be described taking the case where PN3=13 as an example with reference to FIG. 45. In process 1, PN3 of 17 is identified as the PN3d, and in process 2, the range of PN3=14 to 16 is set as the data transfer range. Then, the drive terminal pattern (iUSN=0, CL1a=1, CL3=0, i_LB=0100) designated by PN3 of 14 is transferred from the intermediate pattern B to the external terminal pattern designated by PN4 of 13 (PN3=13, 14); likewise the drive terminal pattern (iUSN=–, CL1a=0, CL3=1, i_LB=––––) designated by PN3 of 15 is transferred from the intermediate pattern B to the external terminal pattern designated by PN4 of 14 (PN3=14, 15); and likewise the drive terminal pattern (iUSN=1, CL1a=1, CL3=0, i_LB=1000) designated by PN3 of 16 is transferred from the intermediate pattern B to the external terminal pattern designated by PN4 of 15 (PN3=15, 16).

After S4604, the process returns to S4602.

If there is a one or zero in the drive terminal pattern or if superimposing is not necessary (superimposing is impossible), data transfer and incrementing the value of PN3 are performed S4605.

To be specific, the external terminal pattern generator 408 stores the drive terminal pattern and verification terminal pattern designated by the current PN3 value into a corresponding field of the table C designated by the current PN3 value. Then, 1 is added to the current value of PN3.

Then, it is determined whether for all values of PN3 the above procedure has been executed S4606. By executing the above process for all values of PN3, the external terminal patterns are generated from the intermediate patterns B. S6 is executed by the external terminal pattern generator 408.

In this way, the external terminal patterns of FIG. 47 are generated. The external terminal patterns (FIG. 47) can be generated using any method, but because the data amount of patterns to be handled is enormous, it is better to provide the plurality of tables and perform data transfer (read/write) between these tables as above.

The operation of the test circuit (semiconductor integrated circuit 56) based on the external terminal patterns of FIG. 47 will be further described with reference to FIGS. 48 to 51. Times tX (X=0 to 22) coincide with values of PN4.

Figure 48:
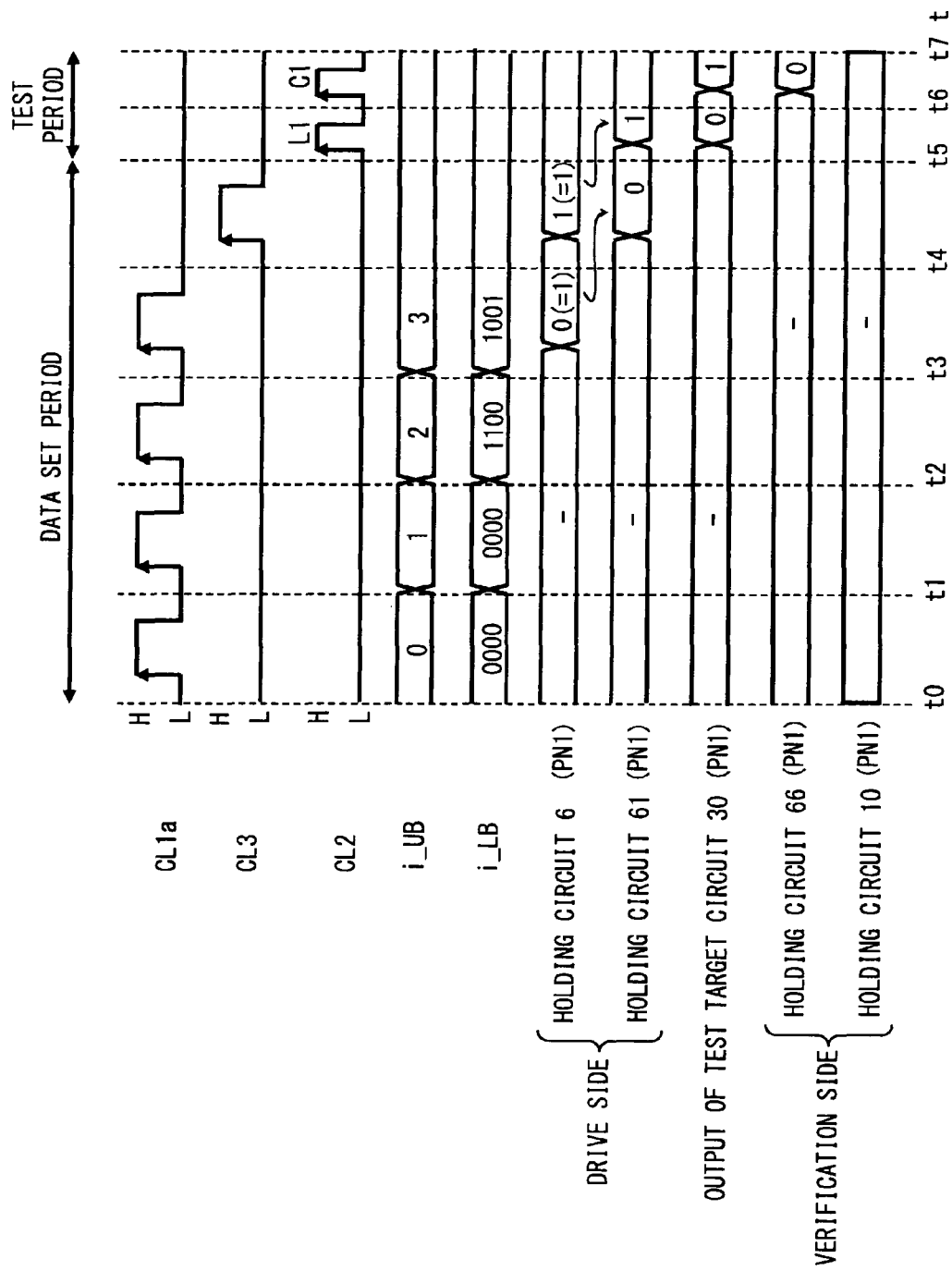
FIG. 48 is a timing chart illustrating the operation of a semiconductor integrated circuit according to the fifth embodiment.
Figure 49:
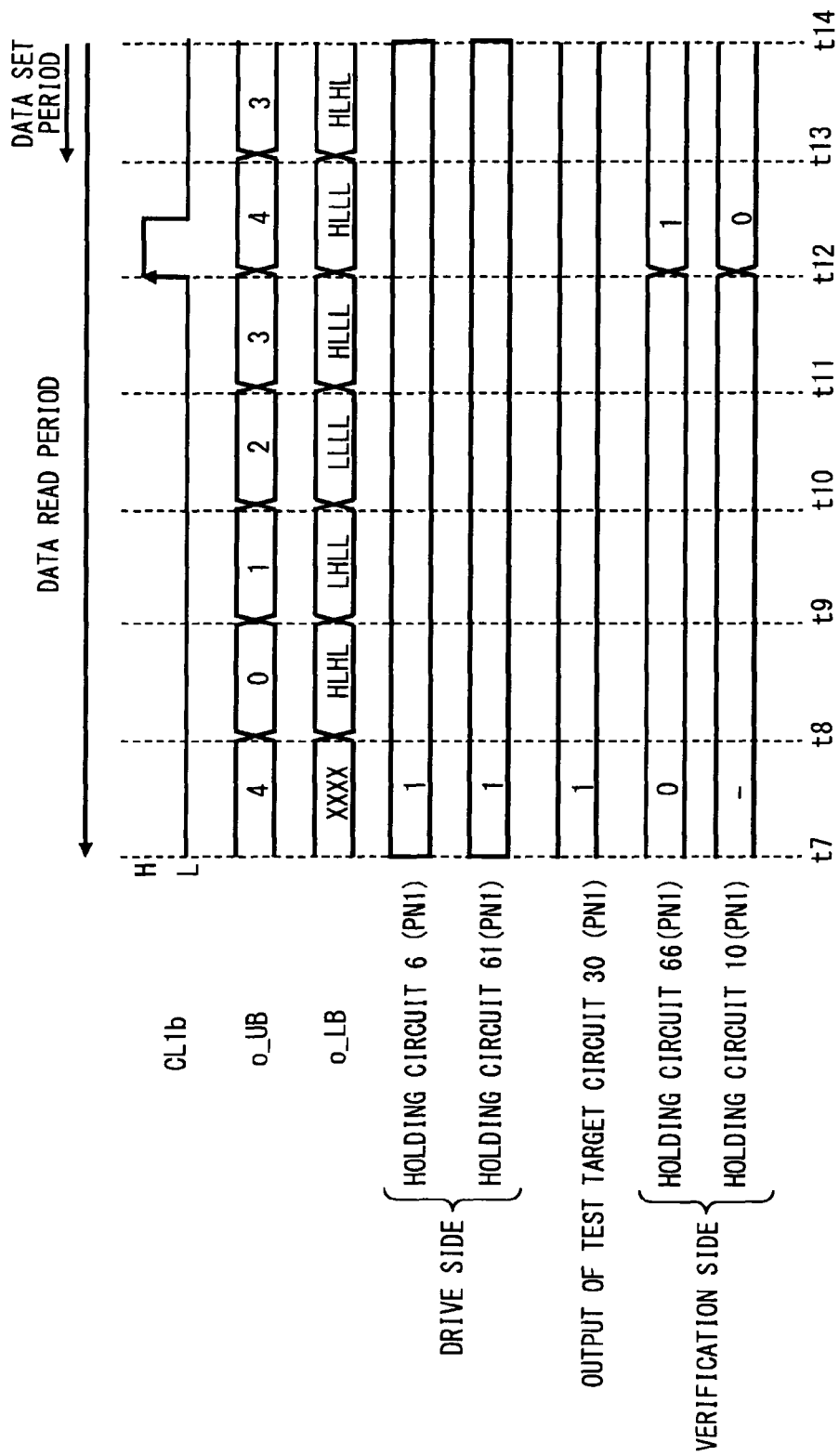
FIG. 49 is a timing chart illustrating the operation of the semiconductor integrated circuit according to the fifth embodiment.

As shown in FIG. 48, during times t0 to t1, a unit pattern of 0000 on bus i_LB is set into the holding circuit 6a designated by i_UB of 0 at the rise of clock CL1a. During times t1 to t2, a unit pattern of 0000 on bus i_LB is set into the holding circuit 6b designated by i_UB of 1 at the rise of clock CL1a. During times t2 to t3, a unit pattern of 1100 on bus i_LB is set into the holding circuit 6c designated by i_UB of 2 at the rise of clock CL1a. During times t3 to t4, a unit pattern of 1001 on bus i_LB is set into the holding circuit 6d designated by i_UB of 3 at the rise of clock CL1a.

Through the process during times t0 to t4, the drive pattern of PN1=0 is set into the holding circuit 6. The drive pattern of PN1=0 and the drive pattern of PN1=1 are the same.

During times t4 to t5, the drive pattern of PN1=0 held in the holding circuit 6 is transferred to the holding circuit 61 at the rise of clock CL3. Thereby, the drive pattern of PN1=1 is set into the holding circuit 6, and the drive pattern of PN1=0 is set into the holding circuit 61.

During times t5 to t6, the drive pattern of PN1=0 set in the holding circuit 61 is input to the test target circuit 30 at the rise of clock CL2 (the rise of launch pulse L1). At the same time, the drive pattern of PN1=1 is set into the holding circuit 61, and the to-be-verified pattern of PN1=0 is output from the test target circuit 30.

During times t6 to t7, the drive pattern of PN1=1 set in the holding circuit 61 is input to the test target circuit 30 at the rise of clock CL2 (the rise of capture pulse C1). Further, the to-be-verified pattern of PN1=1 is output from the test target circuit 30, and the to-be-verified pattern of PN1=0 that has been output from the test target circuit 30 is set into the holding circuit 66.

During times t7 to t8, the output pattern XXXX of the determining circuits 11a to 11d designated by o_LB of 4 is output on bus o_LB, and the pattern on bus o_LB is read by the tester.

During times t8 to t9, the held pattern HLHL of the holding circuit 66a designated by o_LB of 0 is output on bus o_LB, and the pattern on bus o_LB is read by the tester.

During times t9 to t10, the held pattern LHLL of the holding circuit 66b designated by o_LB of 1 is output on bus o_LB, and the pattern on bus o_LB is read by the tester.

During times t10 to t11, the held pattern LLLL of the holding circuit 66c designated by o_LB of 2 is output on bus o_LB, and the pattern on bus o_LB is read by the tester.

During times t11 to t12, the held pattern HLLL of the holding circuit 66d designated by o_LB of 3 is output on bus o_LB, and the pattern on bus o_LB is read by the tester.

During times t12 to t13, the to-be-verified pattern of PN1=0 is transferred from the holding circuit 66 to the holding circuit 10 at the rise of clock CL1b. At the same time, the to-be-verified pattern of PN1=1 is set into the holding circuit 66. Further, the output pattern HLLL of the determining circuits 11a to 11d designated by o_LB of 4 is output on bus o_LB, and the pattern on bus o_LB is read by the tester.

During times t13 to t14, the held pattern HLHL of the holding circuit 66d designated by o_LB of 3 is output on bus o_LB, and the pattern on bus o_LB is read by the tester.

Figure 50:
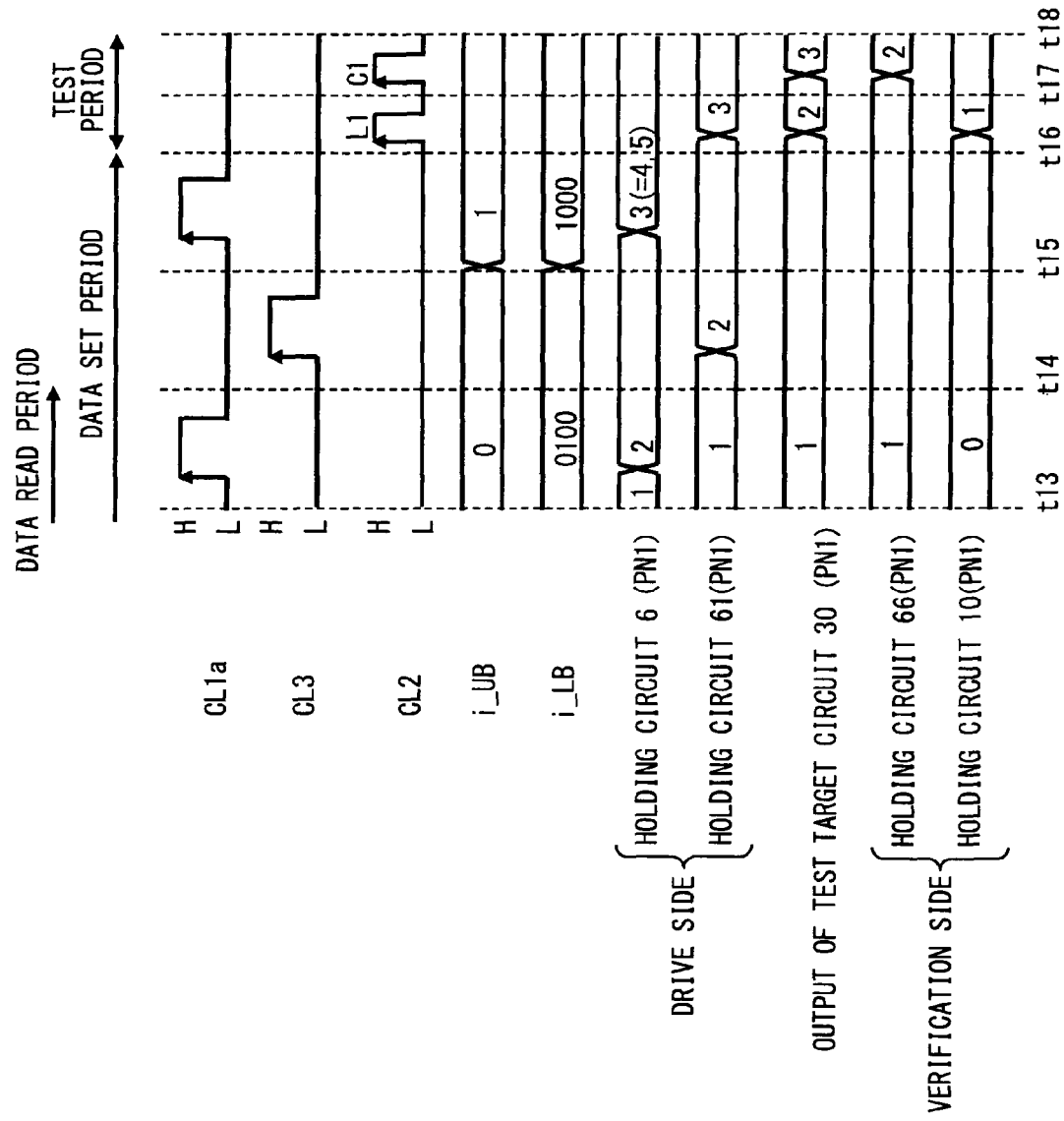
FIG. 50 is a timing chart illustrating the operation of the semiconductor integrated circuit according to the fifth embodiment.

As shown in FIG. 50, during times t13 to t14, the tester sets i_UB to 0 and i_LB to 0100. That is, the tester reads pattern data on bus o_LB and at the same time sets data on bus i_LB. Then, the drive pattern of PN1=2 is set into the holding circuit 6 at the rise of clock CL1a. As such, in the present embodiment, the data set period and the data read period coincide in time, thus shortening the test time.

As shown in FIG. 50, during times t14 to t15, the drive pattern of PN1=2 is transferred from the holding circuit 6 to the holding circuit 61 at the rise of clock CL3.

During times t15 to t16, a unit pattern of 1000 on bus i_LB is set into the holding circuit 6b designated by i_UB of 1 at the rise of clock CL1a. In this way, the drive pattern of PN1=3 is set into the holding circuit 6.

During times t16 to t17, the drive pattern of PN1=2 set in the holding circuit 61 is input to the test target circuit 30 at the rise of clock CL2 (the rise of launch pulse L1). At the same time, the drive pattern of PN1=3 is set into the holding circuit 61, and the to-be-verified pattern of PN1=2 is output from the test target circuit 30.

During times t17 to t18, the drive pattern of PN1=3 set in the holding circuit 61 is input to the test target circuit 30 at the rise of clock CL2 (the rise of capture pulse C1). Further, the to-be-verified pattern of PN1=3 is output from the test target circuit 30, and the to-be-verified pattern of PN1=2 that has been output from the test target circuit 30 is set into the holding circuit 66.

During times t18 to t19, the output pattern LLLL of the determining circuits 11a to 11d designated by o_LB of 4 is output on bus o_LB, and the pattern on bus o_LB is read by the tester.

During times t19 to t20, the output pattern LHHL of the determining circuits 11a to 11d designated by o_LB of 4 is output on bus o_LB, and the pattern on bus o_LB is read by the tester. Further, the to-be-verified pattern of PN1=2 is transferred from the holding circuit 66 to the holding circuit 10 at the rise of clock CL1b. At the same time, the to-be-verified pattern of PN1=3 is set into the holding circuit 66.

During times t20 to t21, the held pattern LLLH of the holding circuit 66b designated by o_LB of 1 is output on bus o_LB, and the pattern on bus o_LB is read by the tester.

Further, the drive pattern of PN1=4 is transferred from the holding circuit 6 to the holding circuit 61 at the rise of clock CL3. The drive pattern of PN1=3 is the same as the drive patterns of PN1=4, 5.

During times t21 to t22, the held pattern LLHH of the holding circuit 66c designated by o_LB of 2 is output on bus o_LB, and the pattern on bus o_LB is read by the tester.

After time t22, the operation proceeds to a test period again as apparent from FIG. 47. The subsequent operation is also carried out according to the external terminal patterns of FIG. 47.

Note: The times t0 to t5 form a data set period in which to set a drive pattern in the drive test circuit 54; the times t5 to t7 form a test period in which to input a launch pulse and a capture pulse to the test target circuit; the times t7 to t14 form a data read period; the times t13 to t16 form a data set period; the times t16 to t18 form a test period; the times t18 to t22 form a data read period; and the times t20 to t22 form a data set period.

As apparent from FIGS. 47, 48, the clock frequency in the test period is higher than that in the data set period. By setting the clock frequency in the data set period to be low, drive patterns can be set more reliably. By setting the clock frequency in the test period to be high, the delay test can be performed under the condition that matches the operating frequency of the test target circuit 30.

In the present embodiment, the delay test can be performed at the operating frequency of the test target circuit 30. Thus, a highly accurate delay test can be performed. The setting of drive patterns in the drive test circuit 54 and the reading of to-be-verified patterns from the verification test circuit 55 are performed in the same time period. In other words, the setting of drive patterns and the reading of to-be-verified patterns are not mutually exclusive. Thus, the delay test can be performed efficiently, and the test time can be shortened.

Sixth Embodiment

A sixth embodiment of the present invention will be described below using FIGS. 52 to 66. In the present embodiment, external terminal patterns for complementing the delay test performed in the fifth embodiment is generated. This enables the delay test to be performed in between all consecutive values of pattern number PN1. The circuits connected to the test target circuit 30 in the semiconductor integrated circuit are the same as those in the fifth embodiment.

Figure 52:
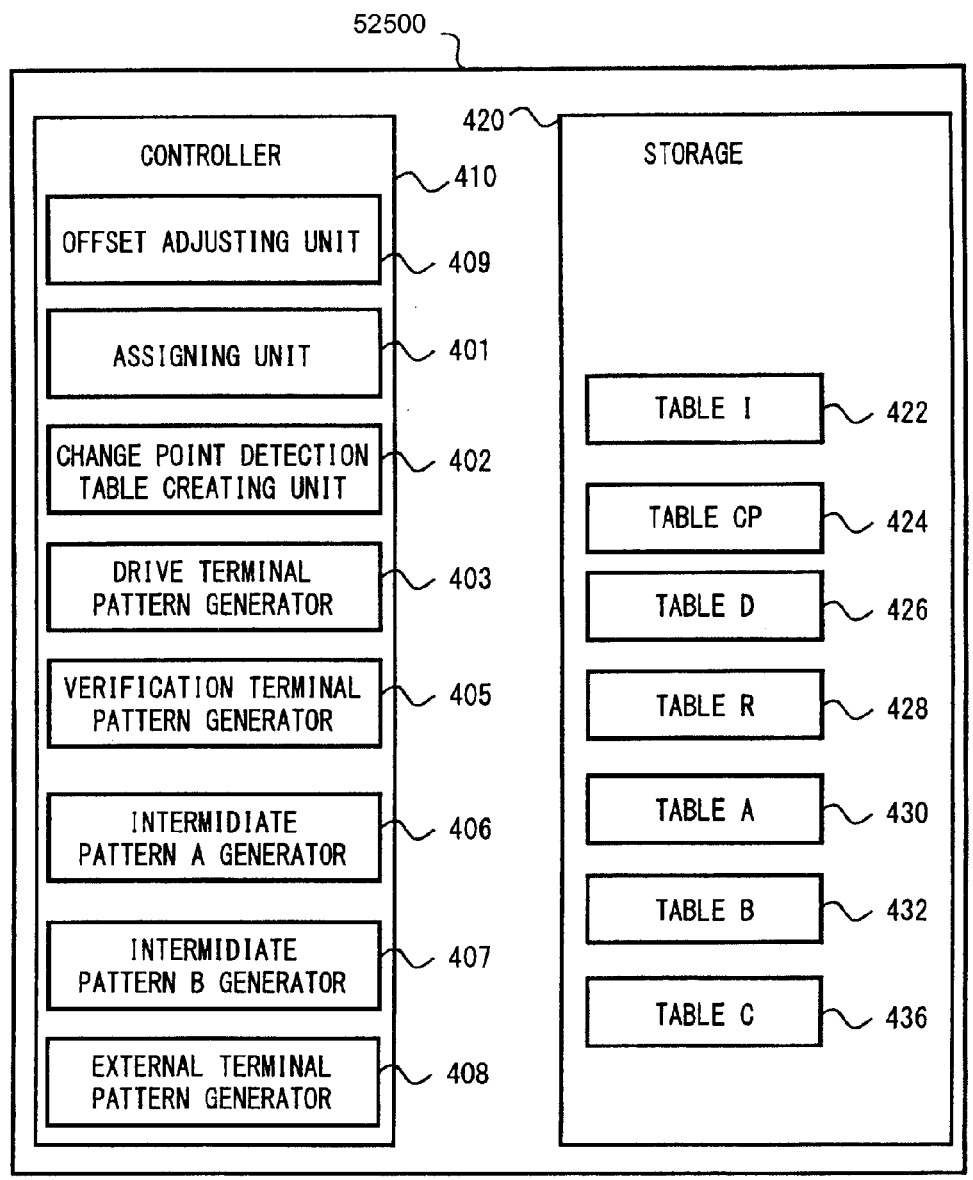
FIG. 52 is a schematic block diagram of a pattern processing apparatus according to a sixth embodiment.
Figure 53:
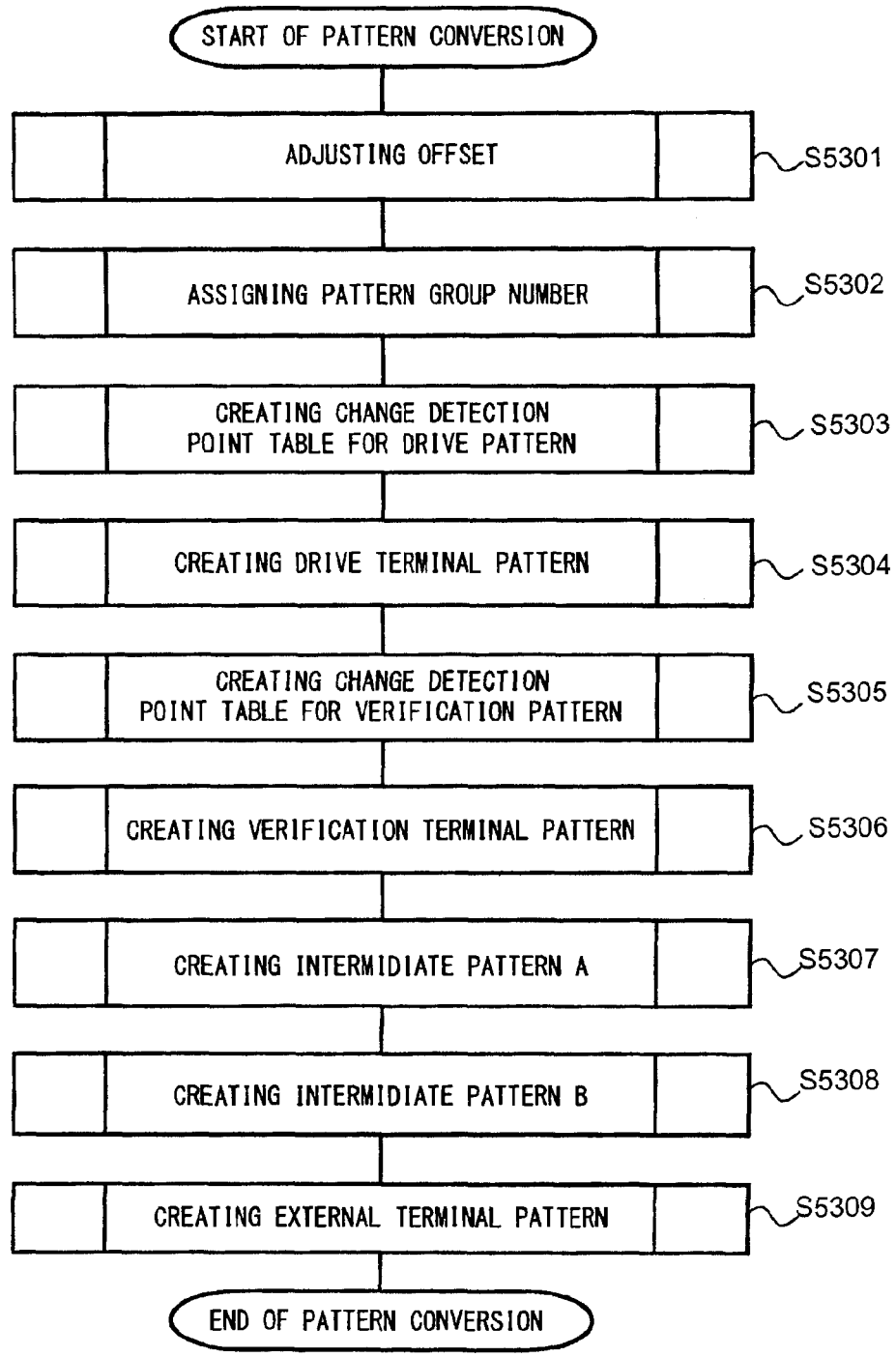
FIG. 53 is a flow chart showing schematically the process of generating external terminal patterns according to the sixth embodiment.
Figure 54:
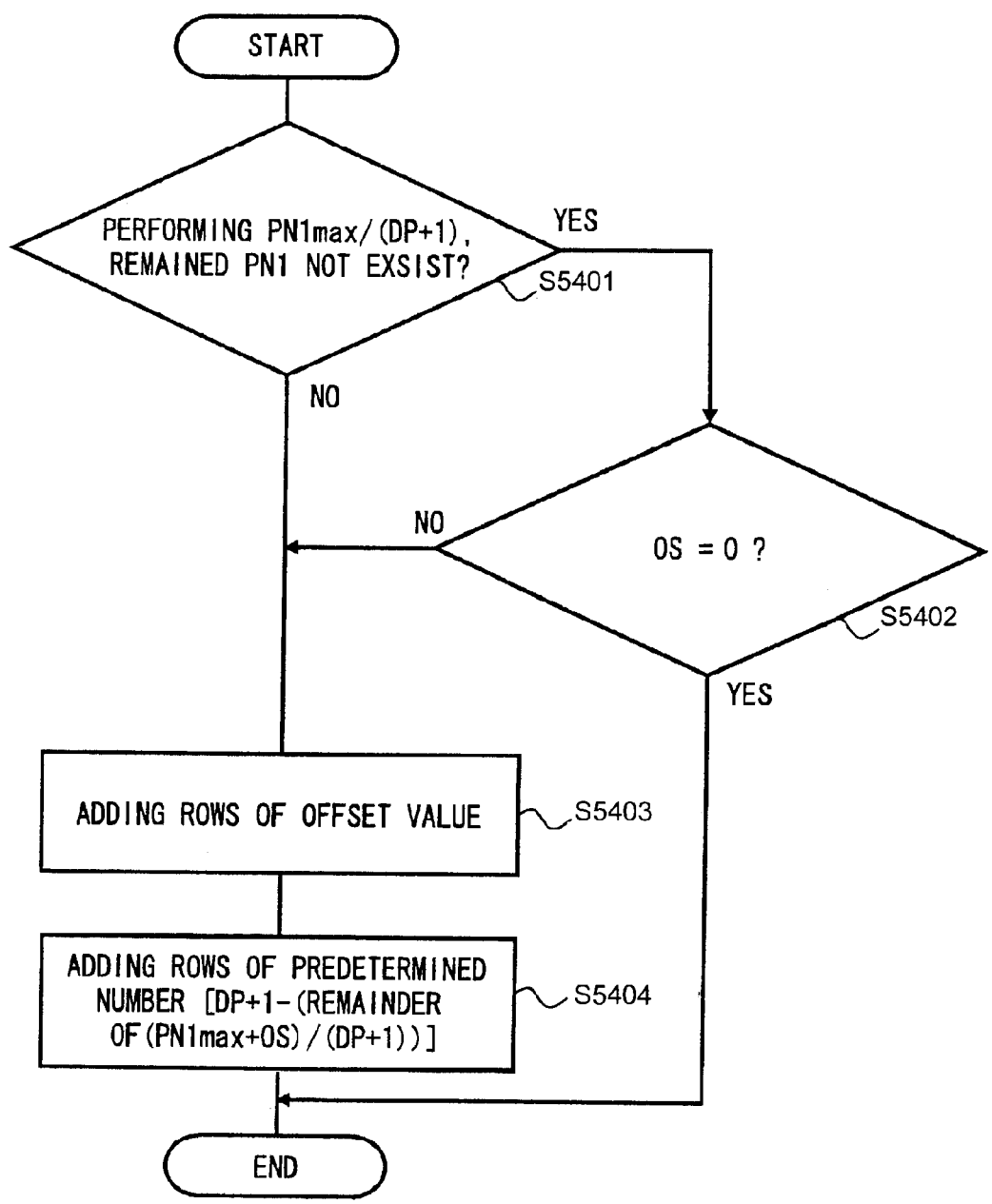
FIG. 54 is a flow chart illustrating offset adjustment according to the sixth embodiment.
Figure 61:
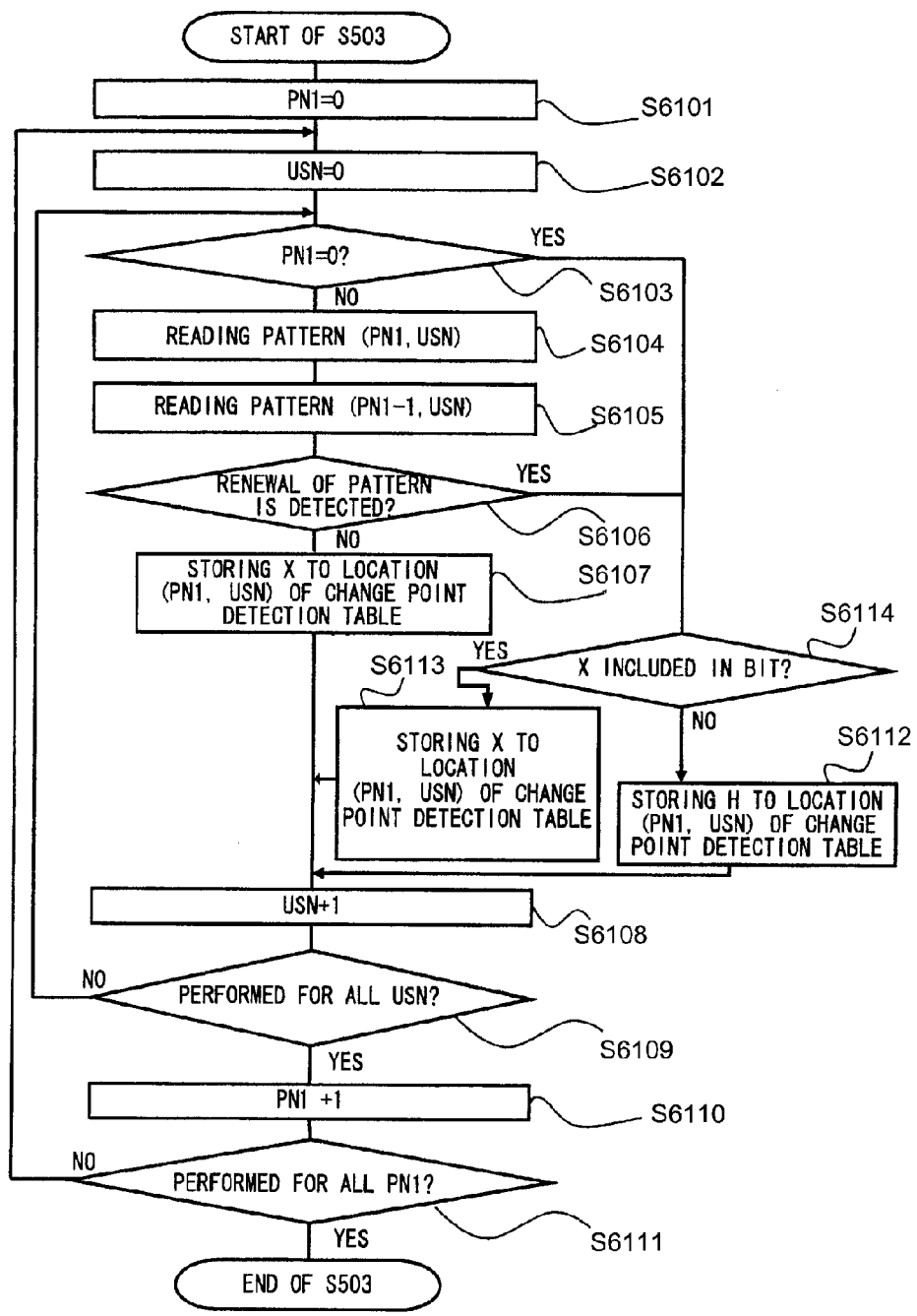
FIG. 61 is a flow chart showing the method of creating the change point detection table for the to-be-verified patterns according to the sixth embodiment.
Figure 62:
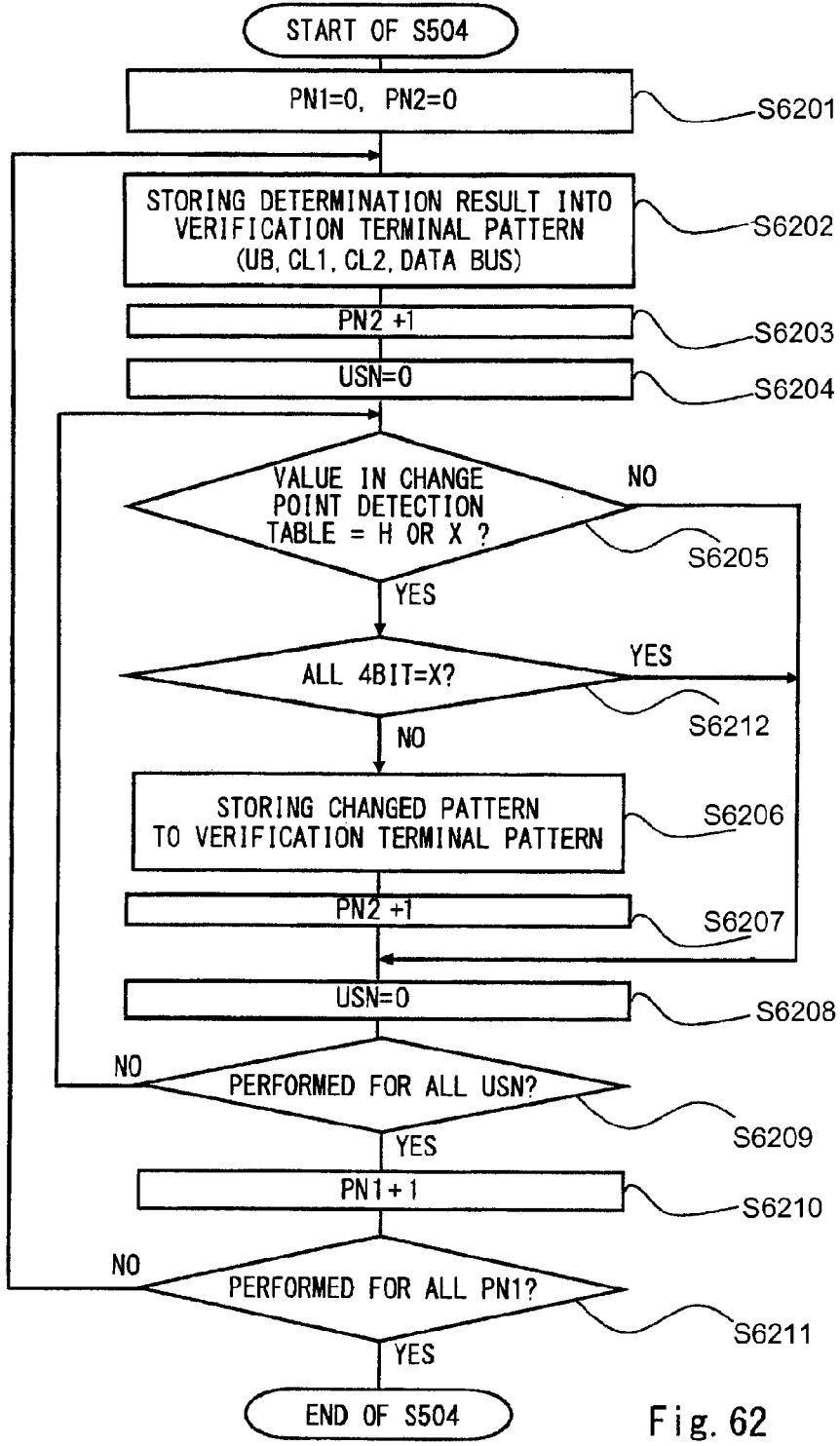
FIG. 62 is a flow chart showing the method of generating verification terminal patterns according to the sixth embodiment.

FIG. 52 is a schematic block diagram of a pattern processing apparatus. FIG. 53 is a flow chart showing schematically the process of generating external terminal patterns. FIG. 54 is a flow chart illustrating offset adjustment. FIG. 55 is a table showing internal signal patterns. FIG. 56 is a table showing a relationship between pattern group numbers and the execution of delay tests. FIG. 57 is a change point detection table for drive patterns. FIG. 58 is a table showing drive patterns after pattern conversion. FIG. 59 is a change point detection table for to-be-verified patterns. FIG. 60 is a table showing verification terminal patterns. FIG. 61 is a flow chart showing the method of creating the change point detection table for the verification patterns. FIG. 62 is a flow chart showing the method of generating verification terminal patterns. FIG. 63 is a table showing the intermediate patterns A. FIG. 64 is a table showing the intermediate patterns B. FIG. 65 is a table showing the external terminal patterns.

As shown in FIG. 52, the pattern generating apparatus 52500 comprises an offset adjusting unit 409. The offset adjusting unit 409 sets an offset for internal signal patterns (see FIG. 37) that are original data for generating terminal patterns, as shown in FIG. 55. To be specific, the offset adjusting unit 409 adds a predetermined number of dummy internal signal patterns to a series of internal signal patterns at the first and last rows. By the number of rows added at the first row, the original series of internal signal patterns (see FIG. 37) is moved down. Hence, as described at the beginning, external terminal patterns for complementing the delay test performed in the fifth embodiment can be generated. This is because by adding a predetermined number of dummy internal signal patterns, internal signal patterns sequentially input to the test target circuit are grouped into new pairs (different from pairs of internal signal patterns in the fifth embodiment).

As shown in FIG. 53, offset adjustment is performed S5301 before the pattern grouping. An offset value (OS) is determined beforehand according to the number DP of new added holding circuits. The offset value satisfies the relationship $0 \leq OS \leq DP$. S1 is executed by the offset adjusting unit 409.

Through the process flow of FIG. 54, the internal signal patterns of FIG. 55 are generated by adding new rows (row data) to the internal signal patterns (internal signal pattern data) of FIG. 37. Specific description thereof will be made below.

As shown in FIG. 54, first the offset adjusting unit 409 divides the total number of PN1 values (the maximum value (PN1max) of PN1) by DP+1 and determines whether a remainder exists S5401. Here, since the number of new added holding circuits is one, the division is 6/2=3 without a remainder (no PN1 value being left).

If no PN1 value is left, the offset adjusting unit 409 determines whether the offset value set beforehand is zero (OS=0) S5402. Here, OS=1, that is, OS≠0.

If OS≠0, the offset adjusting unit 409 adds an equal number of rows to the offset value at the first row S5403. To be specific, as shown in FIG. 55, the offset adjusting unit 409 adds a number, equal to the offset value, of the same patterns as the pattern of PN1=0 immediately before the row of PN1=0. Here, since OS=1, the offset adjusting unit 409 adds one row immediately before the row of PN1=0.

Figure 51:
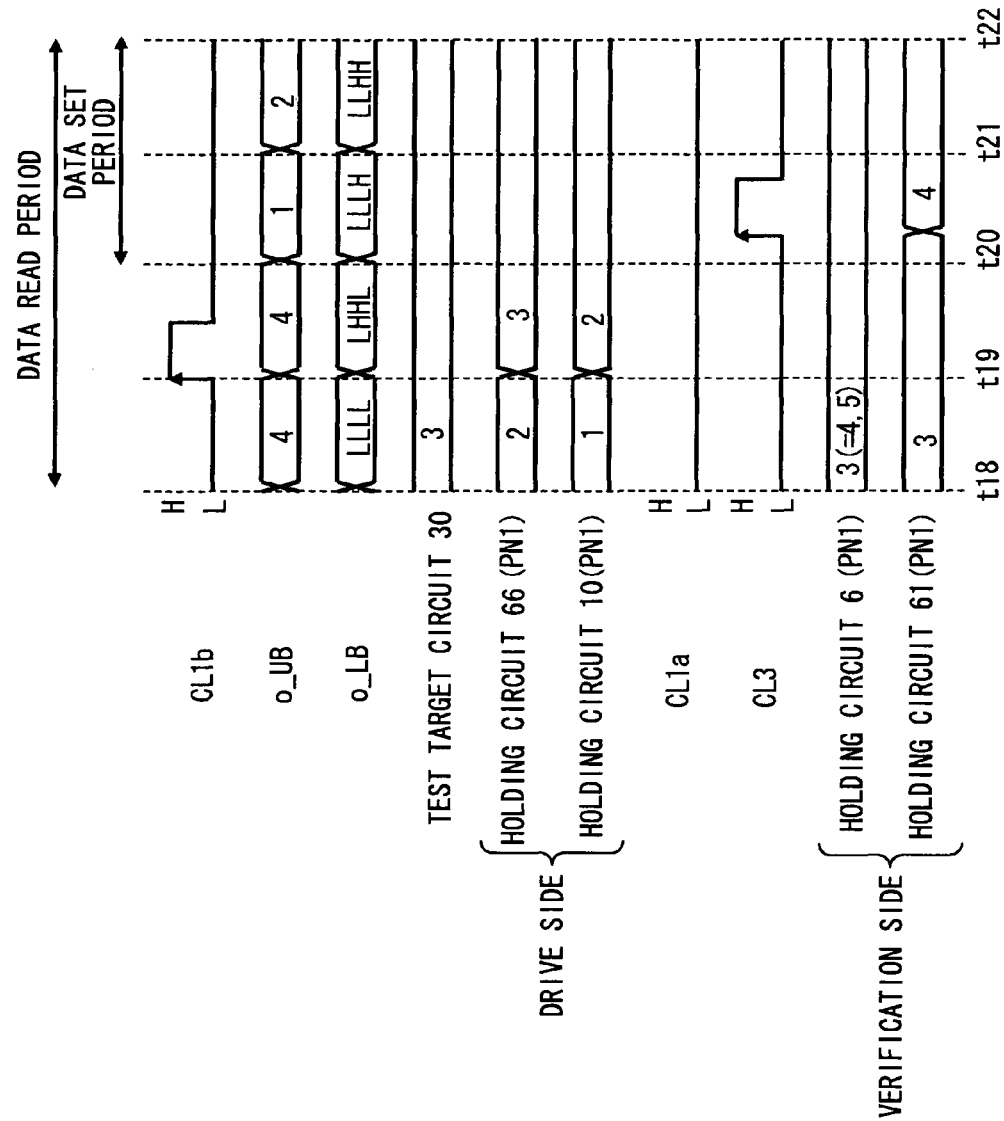
FIG. 51 is a timing chart illustrating the operation of the semiconductor integrated circuit according to the fifth embodiment.

Then, the offset adjusting unit 409 adds a predetermined number of rows at the end, the number being equal to [DP+1−remainder of (PN1max+OS)/(DP+1)] (S4). To be specific, as shown in FIG. 51, the offset adjusting unit 409 adds the predetermined number of the same patterns as the pattern of PN1=5 immediately after the row of PN1=5. Here, DP=2, OS=1, and PN1max=6. Thus, the number of rows to be added is [1+1−remainder of (6+1)/(1+1)]=1+1−1=1. Therefore, the offset adjusting unit 409 adds one row immediately after the row of PN1=5.

If one or more PN1 values are left at S5401, the number of rows is adjusted such that no PN1 value is left, through the above steps S5403, S5404. Further, a new identification number PNA1 is assigned to the rows including the added ones in FIG. 55.

In this way, the internal signal patterns after the offset adjustment as shown in FIG. 55 are generated. In FIG. 55, the pattern group number is assigned in the same way as in the fifth embodiment. In this way, the delay test of PN1=1 to PN1=2 can be performed as shown in FIG. 56. Likewise, the delay test of PN1=3 to PN1=4 can be performed. Hence, the delay test in the fifth embodiment can be complemented.

FIG. 57 is a change point detection table for drive patterns. FIG. 58 shows generated drive terminal patterns. FIG. 59 is a change point detection table for verification patterns. FIG. 60 shows generated verification terminal patterns.

As shown in FIG. 55, rows having only X's corresponding to the new added rows (dummy internal signal patterns) are formed as dummy verification patterns. The change point detection table for verification patterns is created according to the procedure shown in FIG. 61. The verification terminal patterns are generated according to the procedure shown in FIG. 62. Here only points in which the present embodiment differs from the previous embodiment will be described.

As shown in FIG. 61, if PN1=0 at S6103 or if a pattern change exists at S6106, it is determined whether a signal value (bit) in the pattern is at X S6114. For S6106, it is determined for both patterns to be compared whether a bit in the pattern is at X. If a bit is at X, step S6113 is executed. If not, step S6112 is executed. In this way, the change point detection table for to-be-verified patterns of FIG. 59 is created.

As shown in FIG. 62, after S6205, it is determined whether all four bits in the unit pattern designated by the current PN1 value and the current USN value are at X S6212. To be specific, it is determined whether all four bits in the unit pattern designated by the current PN1 value and the current USN value in the verification patterns of FIG. 55 are at X. If all four bits are at X, the changed pattern is not stored into the verification terminal pattern. In this way, the verification terminal patterns of FIG. 60 are generated.

Then, in the same way as described in the fifth embodiment, the intermediate patterns A of FIG. 63, the intermediate patterns B of FIG. 64, and the external terminal patterns of FIG. 65 are generated.

In the present embodiment, by setting the offset, the delay test for internal signal patterns which cannot be paired in the fifth embodiment can be carried out. Hence, a more highly accurate delay test can be realized.

Seventh Embodiment

A seventh embodiment of the present invention will be described below using FIGS. 66 to 73. In the present embodiment, three new holding circuits are added. That is, the DP is three. By this means, even if a frequency divider is provided in the test target circuit 30, the delay test can be performed for all functional circuits included in the test target circuit 30. In the present embodiment, internal signal patterns with OS=0 and internal signal patterns with OS=2 are generated. Then, based on each set of the generated internal signal patterns, final external terminal patterns are generated.

Figure 66:
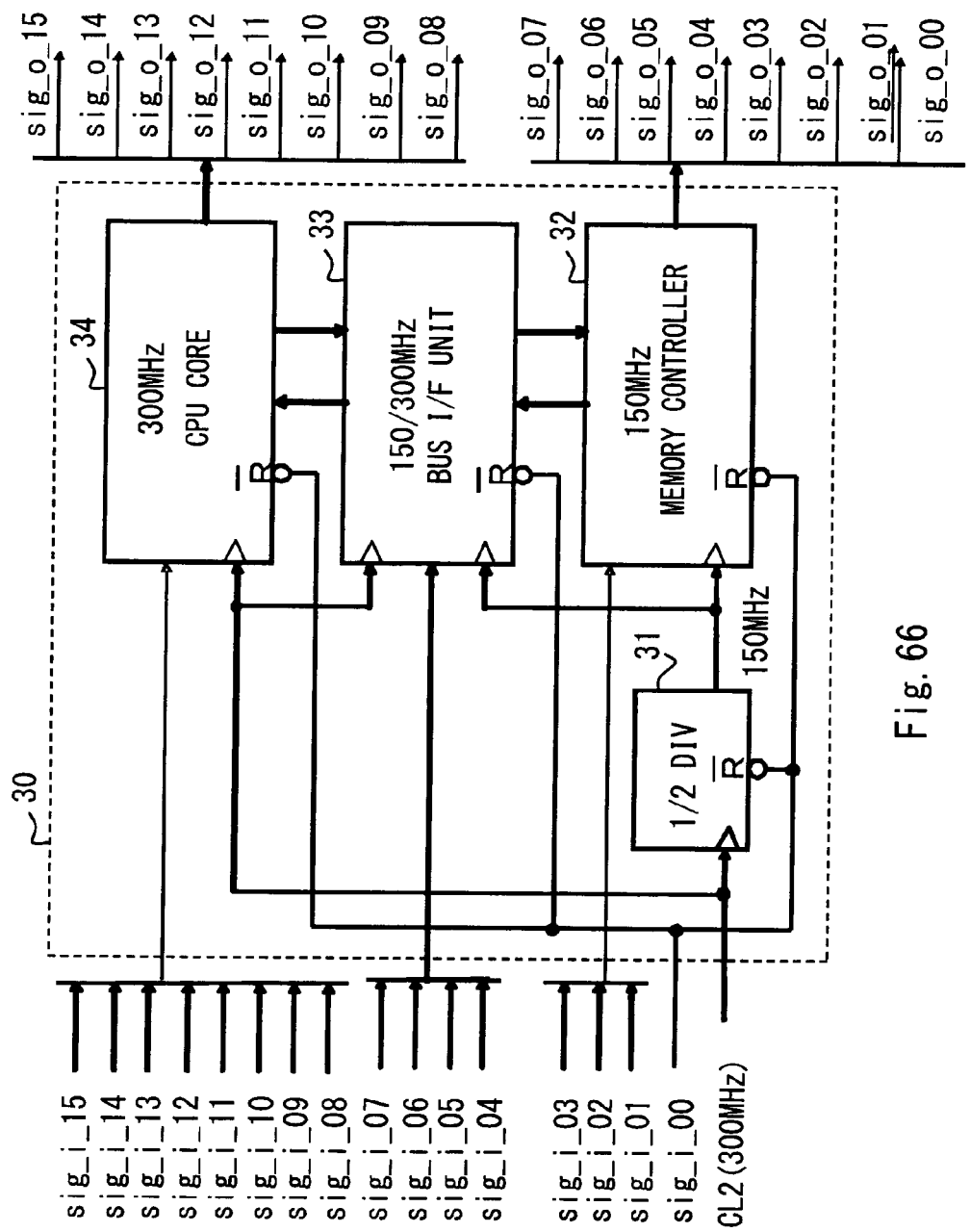
FIG. 66 is a circuit diagram showing the circuit configuration of the test target circuit according to a seventh embodiment.
Figure 67:
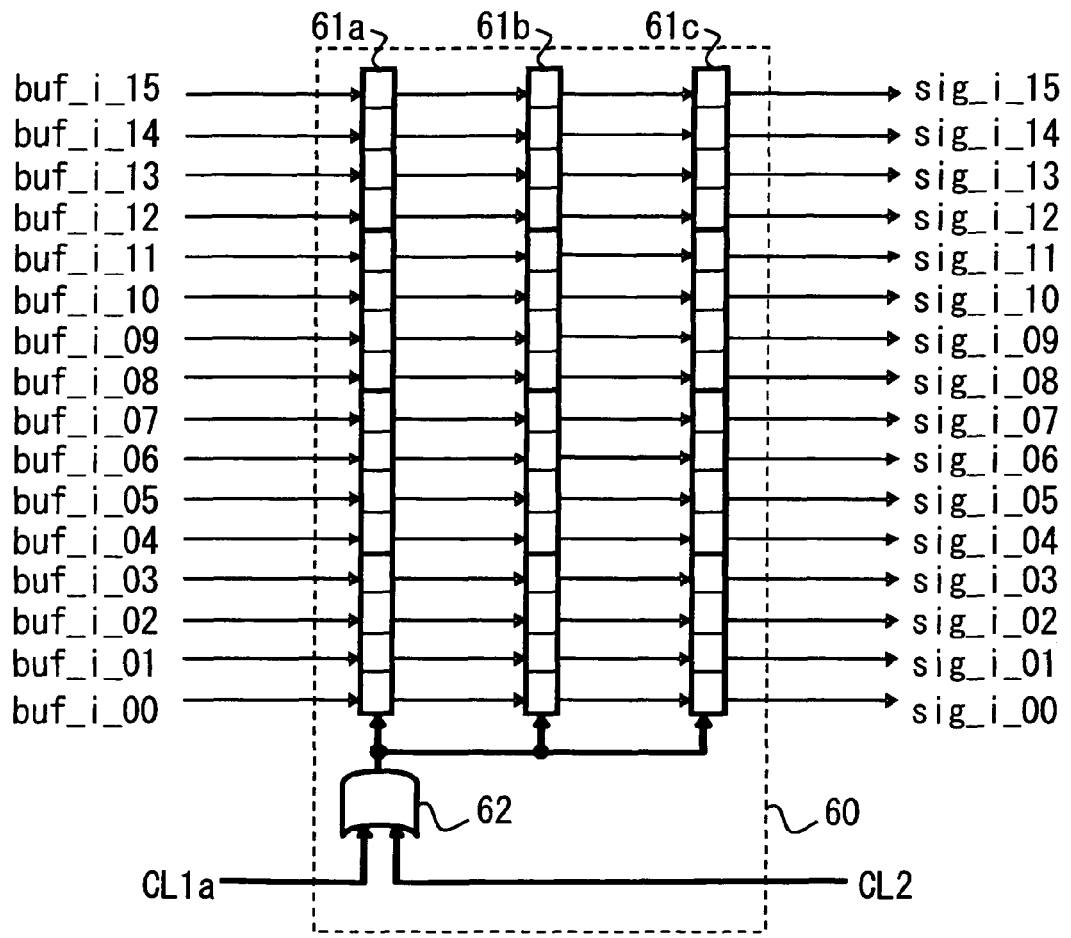
FIG. 67 is a circuit diagram of a buffer according to the seventh embodiment.
Figure 68:
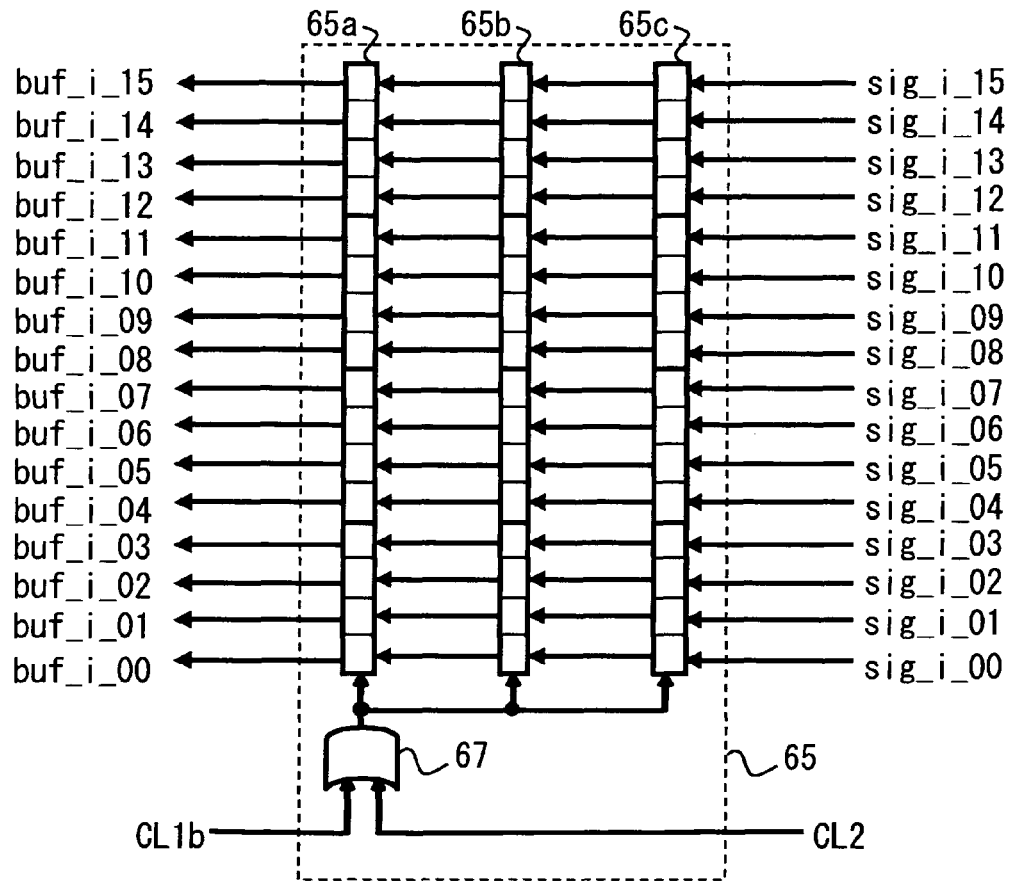
FIG. 68 is a circuit diagram of a buffer according to the seventh embodiment.
Figure 74:
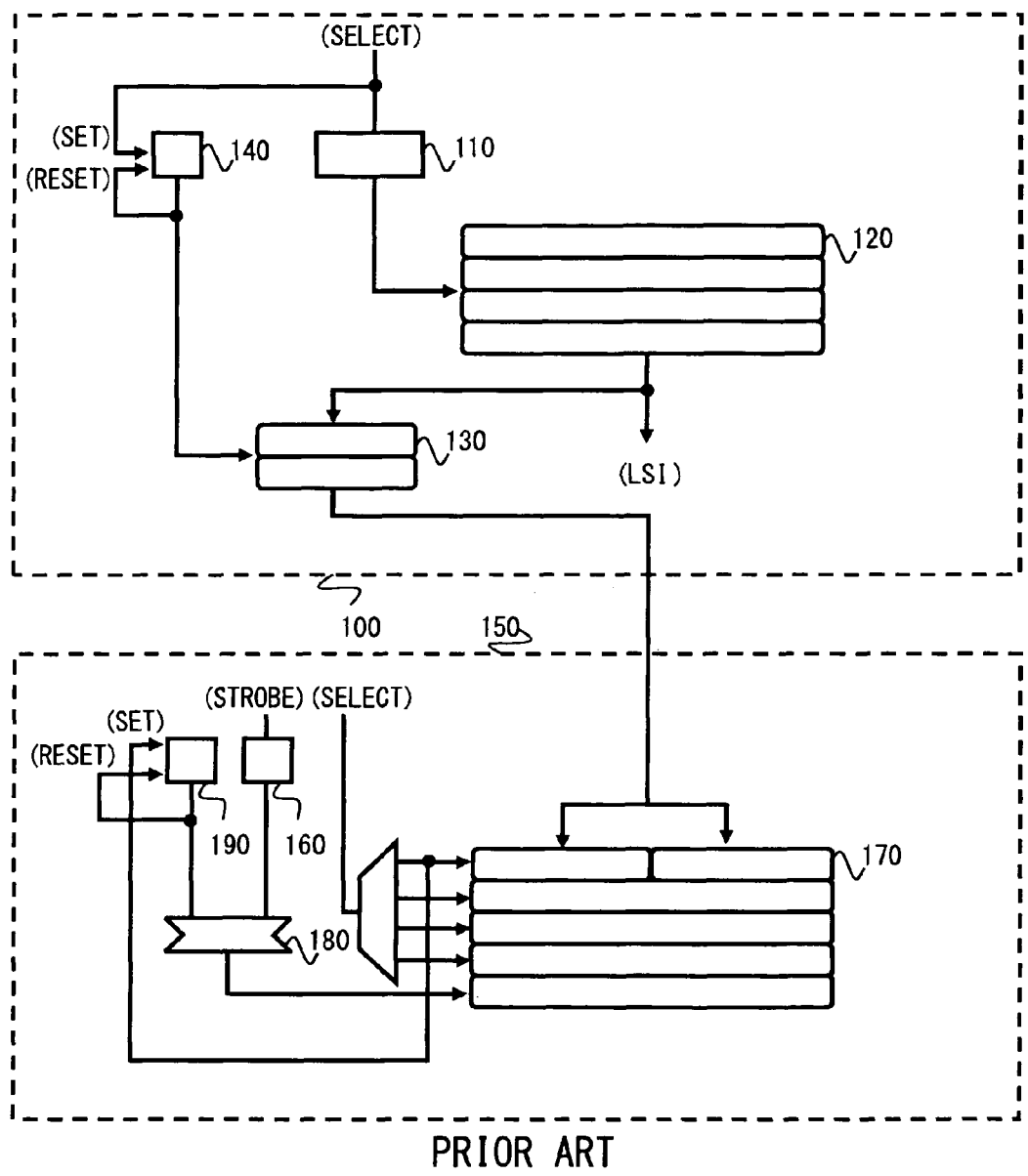
FIG. 74 illustrates a technique described in reference 1.

FIG. 66 is a circuit diagram showing the circuit configuration of the test target circuit. FIGS. 67, 68 are circuit diagrams of buffers. FIG. 69 is a table showing internal signal patterns. FIG. 70 shows internal signal patterns for the case where OS=0. FIG. 71 is a table showing a relationship between pattern group numbers and the execution of delay tests for the case where OS=0. FIG. 72 shows internal signal patterns for the case where OS=2. FIG. 73 is a table showing a relationship between pattern group numbers and the execution of delay tests for the case where OS=2.

As shown in FIG. 66, the test target circuit 30 comprises a ½ frequency divider (½ DIV) 31, a memory controller 32, a bus I/F unit 33, and a CPU core 34.

First, connection relationships will be described. The clock CL2 is connected to the clock terminal of the ½ frequency divider, to the clock terminal of the CPU core 34, and to a clock terminal of the bus I/F unit 33. A clock signal of a frequency divided into by the ½ frequency divider 31 is connected to the clock terminal of the memory controller 32 and to another clock terminal of the bus I/F unit 33. The signal sig_i_00 is connected to the reset terminal of each function block. The signals sig_i_01 to sig_i_03 are connected to the memory controller 32. The signals sig_i_04 to sig_i_07 are connected to the bus I/F unit 33. The signals sig_i_08 to sig_i_15 are connected to the CPU core 34.

The frequency of the clock CL2 is 300 MHz. The frequency of the clock CL2 is divided by the ½ frequency divider 31 into 150 MHz. The memory controller 32 operates at 150 MHz. The bus I/F unit 33 has a portion operating at 150 MHz and a portion operating at 300 MHz. The CPU core 34 operates at 300 MHz. The memory controller 32 and the CPU core 34 are connected to each other via the bus I/F unit 33. The memory controller 32 transmits and receives data to and from the CPU core 34 via the bus I/F unit 33.

Next, a buffer 60 will be described with reference to FIG. 67. The buffer 60 is connected between the holding circuit 6 and the test target circuit 30.

The buffer 60 comprises three holding circuits 61a to 61c. The outputs of the holding circuit 6 are connected to the inputs of the holding circuit 61a. The outputs of the holding circuit 61a are connected to the inputs of the holding circuit 61b. The outputs of the holding circuit 61b are connected to the inputs of the holding circuit 61c. The output of an OR circuit 62 is connected to the holding circuits 61a to 61c. When the OR circuit 62 outputs a pulse, a drive pattern is transferred from the holding circuit 61a to the holding circuit 61b while a drive pattern is transferred from the holding circuit 61b to the holding circuit 61c. The holding circuits 61a to 61c are a 16-bit FF as the previously mentioned holding circuit 61.

Next, a buffer 65 will be described with reference to FIG. 68. The buffer 65 is connected between the test target circuit 30 and the holding circuit 10.

The buffer 65 comprises three holding circuits 65a to 65c. The outputs of the holding circuit 65b are connected to the inputs of the holding circuit 65a. The outputs of the holding circuit 65c are connected to the inputs of the holding circuit 65b. The output of an OR circuit 67 is connected to the holding circuits 65a to 65c. When the OR circuit 67 outputs a pulse, a drive pattern is transferred from the holding circuit 65c to the holding circuit 65b while a drive pattern is transferred from the holding circuit 65b to the holding circuit 65a. The holding circuits 65a to 65c are a 16-bit FF as the previously mentioned holding circuit 65.

In the test target circuit 30 of the present embodiment, there are integrated functional circuits that operate at different operating frequencies. In such a case, the delay test cannot be performed on all portions of the memory controller 32 and of the bus I/F unit 33 only by inputting consecutively two drive patterns to the test target circuit as described in the fifth embodiment, thus reducing the quality of the delay test. That is, the delay test cannot be performed based on patterns output through signals sig_o_00 to sig_o_07.

In the present embodiment, in view of this point, with the DP set to 3, the sets of internal signal patterns shown in FIGS. 70 and 72 are generated. FIG. 70 is for the case where OS=0. FIG. 72 is for the case where OS=2. According to the procedure described in the previous embodiment, final external terminal patterns are generated for each of the cases where OS=0 and OS=2 (as described in the previous embodiment, duplicate description thereof being omitted).

By this means, four drive patterns can be consecutively input to the test target circuit 30. Thus, even where the ½ frequency divider 31 is integrated in the test target circuit 30, the quality of the delay test will not be reduced. That is, the delay test can be performed based on patterns output through signals sig_o_00 to sig_o_07.

The scope of the present invention is not limited to the above embodiments. The driving or verification test circuit may take on any specific configuration. Further, the number of divisions of internal signals is not limited to four. The number of internal signals is not limited to 16. The number N1 of divisions of internal signals of the drive test circuit is not limited to four. The number N2 of divisions of internal signals of the verification test circuit is not limited to four. The number N1 of divisions of internal signals of the drive test circuit and the number N2 of divisions of internal signals of the verification test circuit are not necessarily equal. That is, the N1 and N2 can be set at different values. It is possible to replace the buffer circuit with FIFO (First In First Out) having a depth DP. In this case, F/F (Flip/Flop), SRAM (Static Random Access Memory), and data latch could be used as the holding circuit forming the FIFO. It is possible to set an arbitrarily number to the depth DP of the buffer circuit which is equal with the above mentioned number of new additional holding circuits DP describer above. The offset value OS can be set to any integer satisfying the relationship 0≦OS≦DP.

It is apparent that the present invention is not limited to the above embodiments, but may be modified and changed without departing from the scope and spirit of the invention.

What is claimed is:

1. A test circuit connected between a test target circuit and a plurality of external terminals, and being a drive test circuit for inputting an internal signal pattern into the test target circuit, comprising:
    N first holding circuits to hold respectively N unit patterns produced by dividing the internal signal pattern to be input to or output from the test target circuit by N, where N is a natural number of two or greater;
    a control circuit to make the internal signal pattern held in the N first holding circuits be changed selectively on a unit pattern basis based on a value of an identification signal assigned to each of the unit patterns beforehand, or to make the internal signal pattern held in the N first holding circuits be output selectively on a unit pattern basis based on the values of the identification signal; and
    a second holding circuit connected between the N first holding circuits and the test target circuit to hold the internal signal pattern transferred from the N first holding circuits.

2. The test circuit according to claim 1, wherein the control circuit comprises:
    N selectors corresponding to the N first holding circuits; and
    a decoder connected to each of the N selectors,
    wherein the decoder outputs select signals to the predetermined selector based on the identification signal, and the selectors output either the unit patterns held in the first holding circuits or a new unit pattern inputted through the external terminals to the first holding circuits based on the select signals.

3. The test circuit according to claim 2, wherein the N selectors are connected in common to the external terminals.

4. The test circuit according to claim 1, wherein the second holding circuit is formed from a plurality of third holding circuits, which sequentially hold the internal signal pattern transferred from the N first holding circuits.

5. A test circuit connected between a test target circuit and a plurality of external terminals, and being a verification test circuit for outputting an internal signal pattern from the test target circuit on a unit pattern basis, comprising:
    N first holding circuits to hold respectively N unit patterns produced by dividing the internal signal pattern to be input to or output from the test target circuit by N, where N is a natural number of two or greater; and
    a control circuit to make the internal signal pattern held in the N first holding circuits be changed selectively on a unit pattern basis based on a value of an identification signal assigned to each of the unit patterns beforehand, or to make the internal signal pattern held in the N first holding circuits be output selectively on a unit pattern basis based on the values of the identification signal, the control circuit comprising a selector connected to N nodes that are in between the first holding circuits and the test target circuit, wherein the selector selects and outputs the unit pattern specified by the identification signal and input into the corresponding first holding circuit,
    wherein the control circuit further comprises N determining circuits provided corresponding to the N first holding circuits respectively,
    wherein the determining circuit determines whether there is a change in the unit patterns consecutively output from the test target circuit to the corresponding first holding circuit, with use of the first holding circuit.

6. The test circuit according to claim 5, wherein the outputs of the N determining circuits are connected to the selector, and the selector also outputs a determination pattern inputted from the N determining circuits.

7. The test circuit according to claim 5, wherein the outputs of the N determining circuits are connected to some of the plurality of the external terminals.

8. The test circuit according to claim 5, further comprising a second holding circuit connected between the N first holding circuits and the test target circuit to hold the internal signal pattern transferred from the test target.

9. A test circuit connected between a test target circuit and a plurality of external terminals, and being a verification test circuit for outputting an internal signal pattern from the test target circuit on a unit pattern basis, comprising:
    N first holding circuits to hold respectively N unit patterns produced by dividing the internal signal pattern to be input to or output from the test target circuit by N, where N is a natural number of two or greater;

a control circuit to make the internal signal pattern held in the N first holding circuits be changed selectively on a unit pattern basis based on a value of an identification signal assigned to each of the unit patterns beforehand, or to make the internal signal pattern held in the N first holding circuits be output selectively on a unit pattern basis based on the values of the identification signal; and a second holding circuit connected between the test target circuit and the N first holding circuits to hold the internal signal pattern output from the test target circuit.

* * * * *

UNITED STATES PATENT AND TRADEMARK OFFICE
CERTIFICATE OF CORRECTION

PATENT NO. : 8,103,464 B2
APPLICATION NO. : 12/076692
DATED : January 24, 2012
INVENTOR(S) : Yasuo Sasaki It is certified that error appears in the above-identified patent and that said Letters Patent is hereby corrected as shown below:

Title Page, Item (30) should read
Mar. 22, 2007   (JP)...........................2007-073968
Feb. 27, 2008   (JP)...........................2008-046319

Signed and Sealed this
Twentieth Day of March, 2012

David J. Kappos
*Director of the United States Patent and Trademark Office*